(12) United States Patent
Yamae et al.

(10) Patent No.: US 9,379,359 B2
(45) Date of Patent: Jun. 28, 2016

(54) ORGANIC ELECTROLUMINESCENCE ELEMENT AND LIGHTING DEVICE USING SAME

(71) Applicant: PANASONIC INTELLECTUAL PROPERTY MANAGEMENT CO., LTD., Osaka (JP)

(72) Inventors: Kazuyuki Yamae, Nara (JP); Yasuhisa Inada, Osaka (JP); Akira Hashiya, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/772,599

(22) PCT Filed: Feb. 27, 2014

(86) PCT No.: PCT/JP2014/001081
§ 371 (c)(1),
(2) Date: Sep. 3, 2015

(87) PCT Pub. No.: WO2014/141611
PCT Pub. Date: Sep. 18, 2014

(65) Prior Publication Data
US 2016/0020431 A1 Jan. 21, 2016

(30) Foreign Application Priority Data
Mar. 13, 2013 (JP) .................. 2013-050592

(51) Int. Cl.
*H01L 51/52* (2006.01)
*H01L 51/50* (2006.01)

(52) U.S. Cl.
CPC .......... *H01L 51/5275* (2013.01); *H01L 51/504* (2013.01); *H01L 51/5206* (2013.01); *H01L 51/5221* (2013.01); *H01L 51/5268* (2013.01)

(58) Field of Classification Search
CPC ..... H01L 51/50; H01L 51/52; H01L 51/5268; H01L 51/5275; H01L 51/5206; H01L 51/5221; H01L 51/504; H01L 51/0545; H01L 51/0036; H01L 51/0541; H01L 51/0512; H01L 35/24; H01L 29/06; H01L 2251/5369; H01L 23/5329; H01L 23/522; H01L 2924/011079; H01L 2924/01078; H01L 2924/01029
USPC .................. 257/40, 79, 98, 642, 643, 759
See application file for complete search history.

(56) References Cited

U.S. PATENT DOCUMENTS

| 6,290,563 | B1 * | 9/2001 | Codama | H01L 27/3237 313/504 |
|---|---|---|---|---|
| 6,476,550 | B1 | 11/2002 | Oda et al. | |
| 7,535,165 | B2 * | 5/2009 | Lee | H01L 27/3209 313/503 |
| 2006/0119260 | A1 * | 6/2006 | Kim | H01L 27/3246 313/506 |
| 2008/0079352 | A1 * | 4/2008 | Cok | H01L 27/3209 313/503 |
| 2009/0160320 | A1 * | 6/2009 | Borner | H01L 51/5212 313/504 |
| 2011/0121267 | A1 | 5/2011 | Ide et al. | |
| 2011/0248253 | A1 | 10/2011 | Yamana et al. | |
| 2014/0008632 | A1 | 1/2014 | Kuzuoka et al. | |
| 2014/0191226 | A1 | 7/2014 | Yamae | |
| 2015/0171360 | A1 | 6/2015 | Kittichungchit et al. | |
| 2015/0270512 | A1 | 9/2015 | Yamae et al. | |

FOREIGN PATENT DOCUMENTS

| JP | 2991183 | 10/1999 |
|---|---|---|
| JP | 2004-165154 | 6/2004 |
| JP | 2004-296438 | 10/2004 |
| JP | 2005-322490 | 11/2005 |
| JP | 2006-236748 | 9/2006 |
| JP | 2009-54493 | 3/2009 |
| JP | 2010-147337 | 7/2010 |
| JP | 2010-272515 | 12/2010 |
| JP | 2012-037912 | 2/2012 |

| JP | 2012-227111 | 11/2012 |
| WO | 2010/071195 | 6/2010 |
| WO | 2013/024787 | 2/2013 |

OTHER PUBLICATIONS

Decision to Grant a Patent for JP2015-505260 dated Sep. 29, 2015, along with English-language translation.
U.S. Appl. No. 14/418,560 to Shin Okumura et al., filed Jan. 30, 2015.
Search Report from PCT/JP2014/001081, mail dated May 27, 2014.

* cited by examiner

*Primary Examiner* — Chuong A Luu
(74) *Attorney, Agent, or Firm* — Greenblum & Bernstein, P.L.C.

(57) ABSTRACT

The present disclosure relates to an organic electroluminescence element including: a substrate having a light transmissive property; a light diffusion layer; a light transmissive electrode; a light reflective electrode; and a light emitting layer. With regard to the first light emitting layer being the first closest light emitting layer to the light reflective electrode, the relation defined by following expression (2) is satisfied,

[FORMULA 1]

$$\phi(\lambda_m) \times \frac{\lambda_m}{4\pi} + \frac{l+0.1}{2}\lambda_m \leq n_m(\lambda_m) \times d_m \leq \phi(\lambda_m) \times \frac{\lambda_m}{4\pi} + \frac{l+0.5}{2}\lambda_m \quad (2)$$

wherein, $\lambda_m$ represents the weighted average emission wavelength, $\varnothing(\lambda_m)$ represents the phase shift, $n_m(\lambda_m)$ represents the average refractive index of a medium filling a space between the light reflective electrode and the first light emitting layer, and $d_m$ represents the distance from the light reflective electrode to the first light emitting layer. m is equal to 1. 1 is an integer equal to or more than 0.

13 Claims, 35 Drawing Sheets

● : Complete random

□ : Periodic structure

●
Complete random w=0.6μm

△
Controlled random w=1.2μm

□
Controlled random w=1.2μm

● Complete random w=0.6μm

△ Controlled random w=1.2μm

ORGANIC ELECTROLUMINESCENCE ELEMENT AND LIGHTING DEVICE USING SAME

TECHNICAL FIELD

The present invention relates to organic electroluminescence elements, and lighting devices using same.

BACKGROUND ART

In a generally known structure of an organic electroluminescence element (hereinafter referred to as "organic EL element"), an anode made of a transparent electrode, a hole transport layer, a light emitting layer, an electron injection layer, and a cathode are stacked on a surface of a transparent substrate in this order. In this organic EL element, light is produced in an organic light emitting layer in response to application of voltage between the anode and the cathode, and the produced light passes through the transparent electrode and the transparent substrate and emerges outside.

Generally, the organic EL element has the light-outcoupling efficiency in the range of about 20% to 30%. Such low light-outcoupling efficiency means that 70% to 80% of the total amount of produced light does not effectively contribute to light emission. This is because, due to total reflection at interfaces between materials with different refractive indexes, light absorption by materials, and the like, light cannot be effectively propagated to an outside in which light emission is observed. Consequently, it is considered that improvement of the light-outcoupling efficiency causes a great increase in the efficiency of the organic EL element.

There is studied and developed actively to improve the light-outcoupling efficiency. Especially, there have been many efforts to increase the amount of light which is produced in the organic layer and reaches the substrate layer. Generally, the refractive index of the organic layer is equal to or more than about 1.7, and normally the refractive index of the glass layer serving as the substrate is about 1.5. Therefore, a loss caused by total reflection at the interface between the organic layer and the glass layer (thin film waveguide mode) probably reaches about 50% of the total amount of radiated light. In view of this, it is possible to greatly improve the light-outcoupling efficiency of the organic EL element by decreasing the loss caused by the total reflection between the organic layer and the substrate.

Providing one or more diffraction gratings between the organic layer and the substrate is considered as a method for reducing total reflection loss. For example, patent literature 1 (JP 2991183 B2) proposes extracting a larger amount of light by changing angles of rays of light with one or more diffraction gratings.

Further, use of interference is considered as one of means for improving the light-outcoupling efficiency. For example, patent literature 2 (JP 2004-165154 A) discloses adjusting optical thicknesses by use of the interference in view of differences of phases so as to maximize a component of light.

SUMMARY OF INVENTION

Technical Problem

However, in the organic EL element, it is difficult to say that the optical design disclosed in the aforementioned patent literature also can sufficiently improve the light-outcoupling efficiency. There is demand for structures capable of improving the light-outcoupling efficiency more than the above designs.

According to the method disclosed in patent literature 1. it is expected that the diffraction grating causes improvement of the light-outcoupling efficiency. The method disclosed in patent literature 1 forms the structure suitable for light with a specific wavelength or in a specific direction only. Therefore, the method disclosed in patent literature 1 is not always designed suitable for improvement of luminous flux with multiple wavelengths emitted in all directions. In the case of the light emitting layer showing multiple emission colors or a broad spectrum, adverse effects caused by chromaticity deviation depending on view angles become extremely large. This may cause a view angle dependence problem that color varies depending on view angles and appearance becomes poor, for example.

The method disclosed in patent literature 2 is designed such that an amount of a component of light emerging outside from the substrate in the frontal direction is maximized. However, it is considered that all of rays of light are not extracted, and therefore there is demand for more improving the light-outcoupling efficiency.

Recently, further increasing of luminance and efficiency, and prolonging of life of organic EL elements have been considered as big problems, and thus organic EL elements with a structure including a stack of multiple light emitting layers have attracted attention. For example, in an organic EL element with a multiunit structure, multiple light emitting layers are connected in series with electric conductive layers referred to as interlayers in-between. Thereby, it is possible to achieve high luminance, high efficiency, and long life, while maintaining a merit of a thin light source which is one of characteristics of organic electroluminescence elements. By reducing the current density to obtain the same luminance, it is possible to achieve increasing of efficiency and prolonging of life. However, in the structure including multiple light emitting layers which offers merits of increasing luminance and prolonging life, such structures require multiple light emitting positions, and/or multiple light emission wavelengths. Hence, it becomes more difficult to set preferable thickness conditions by use of the methods of patent literature 1 and patent literature 2.

In view of the above insufficiency, the present invention has aimed to propose an organic EL element and a lighting device which have the enhanced light-outcoupling efficiency and the reduced view angle dependence.

Solution to Problem

The organic electroluminescence element of one embodiment according to the present invention, includes:
a substrate having a light transmissive property;
a light diffusion layer on a surface of the substrate;
a light transmissive electrode on a surface of the light diffusion layer;
a light reflective electrode paired with the light transmissive electrode; and
one or multiple light emitting layers between the light transmissive electrode and the light reflective electrode, the one or multiple light emitting layers including an m-th light emitting layer which is an m-th closest light emitting layer to the light reflective electrode, where m is an integer equal to or more than 1;
$\lambda_m$ representing a weighted average emission wavelength of the m-th light emitting layer;

$\phi_m$ representing a phase shift of light produced by the m-th light emitting layer caused by the light reflective electrode defined by a following expression (1):

[FORMULA 1]

$$\phi(\lambda_m) = \tan^{-1}\left\{\frac{2(n_s k_r - n_r k_s)}{n_s^2 - n_r^2 + k_s^2 - k_r^2}\right\} \quad (1)$$

wherein $n_s$ and $k_s$ represent a refractive index and an extinction coefficient of a layer in contact with the light reflective electrode, respectively, and $n_r$ and $k_r$ represent a refractive index and an extinction coefficient of the light reflective electrode, respectively. and $n_s$, $n_r$, $k_s$, and $k_r$ are functions of $\lambda_m$;

an average refractive index of a medium filling a space between the light reflective electrode and the m-th light emitting layer being represented by $n_m(\lambda_m)$:

a distance from the light reflective electrode to the m-th light emitting layer being represented by $d_m$; and at least a first multiple light emitting layer defined as the m-th light emitting layer when m=1 satisfying relations defined by a following expression (2):

[FORMULA 2]

$$\phi(\lambda_m) \times \frac{\lambda_m}{4\pi} + \frac{l+0.1}{2}\lambda_m \le n_m(\lambda_m) \times d_m \le \phi(\lambda_m) \times \frac{\lambda_m}{4\pi} + \frac{l+0.5}{2}\lambda_m \quad (2)$$

where l is an integer equal to or more than 0.

Preferably, in the aforementioned organic electroluminescence element, the multiple light emitting layers are spaced from each other, and the multiple light emitting layers each satisfy the relation defined by the above expression (2).

Preferably, in the aforementioned organic electroluminescence element, $n_a$ representing an average refractive index of the one or more light emitting layers and $n_b$ representing a refractive index of the substrate satisfy a relation of $n_a > n_b$, an incident angle of light reaching the light diffusion layer from the one or more light emitting layers relative to a light reflective layer is represented by an angle θ; and, an absolute value of a color difference Δu'v' is equal to or less than 0.1, the color difference being defined as a difference between chromaticity expressed in u'v' coordinates of incident light at the angle θ satisfying a condition represented by a following expression (3) and chromaticity expressed in u'v' coordinates of incident light in a frontal direction,

[FORMULA 3]

$$\theta = \sin^{-1}\left(\frac{n_b}{n_a}\right) \quad (1)$$

Preferably, in the aforementioned organic electroluminescence element, the light diffusion layer includes a first transparent material layer and a second transparent material layer arranged in this order from the substrate, the second transparent material layer has a refractive index higher than a refractive index of the substrate, and an uneven structure is provided to an interface between the first transparent material layer and the second transparent material layer.

Preferably, in the aforementioned organic electroluminescence element, the first transparent material layer has a refractive index in a range of 1.3 to 1.5 for a visible wavelength range.

Preferably, in the aforementioned organic electroluminescence element, the second transparent material layer has a refractive index of equal to or more than 1.75 for a visible wavelength range.

Preferably, in the aforementioned organic electroluminescence element, the uneven structure is defined by an aggregate of protruded parts or recessed parts arranged in plane.

Preferably, in the aforementioned organic electroluminescence element, the light diffusion layer has a lens array structure, the lens array structure includes lenses each being a semi-ellipsoid which is protruded from an imaginary circle which has a radius $R_1$ and is parallel to a surface of the substrate, in a direction perpendicular to the imaginary circle, so as to have a height $R_2$, and the height $R_2$ is equal to or more than 0.8 times larger than the radius $R_1$ and is equal to or less than 4 times larger than the radius $R_1$.

Preferably, in the aforementioned organic electroluminescence element, with regard to any part of the aggregate of protruded parts or recessed parts, an axial length of an inscribed ellipse or a diameter of an inscribed circle when viewed in a direction perpendicular to a surface of the substrate is in a range of 0.4 μm to 4 μm.

Preferably, in the aforementioned organic electroluminescence element, when a weighted average emission wavelength of entire light from the one or multiple light emitting layers is represented by $\lambda_{all}$, a minimum value of the axial length of the inscribed ellipse or the diameter of the inscribed circle is equal to or less than twice as large as $\Delta_{all}$.

Preferably, in the aforementioned organic electroluminescence element, the aggregate of protruded parts or recessed parts has a plane divided into an array of sections, and the protruded parts or recessed parts are arranged by being individually allocated to sections randomly selected from the array.

Preferably, in the aforementioned organic electroluminescence element, the protruded parts are arranged so that the number of protruded parts arranged by being individually allocated to consecutive sections of the array in a same direction is not greater than a predetermined number, and the recessed parts are arranged so that the number of recessed parts arranged by being individually allocated to consecutive sections of the array in a same direction is not greater than a predetermined number.

Preferably, the aforementioned organic electroluminescence element further includes a light-outcoupling layer on an opposite surface of the substrate from the light diffusion layer.

The lighting device of one embodiment according to the present invention includes one of the aforementioned organic electroluminescence elements.

Advantageous Effects of Invention

Due to the present invention, an optical interference in view of light in diagonal directions is used and therefore an amount of light emerging outside can be increased efficiently. As a result, it is possible to obtain the organic EL element and the lighting device which have the enhanced light-outcoupling efficiency and the reduced view angle dependence, and thereby are excellent in the light emitting property.

BRIEF DESCRIPTION OF DRAWINGS

FIG. 34A shows an example in which the aspect ratio is less than 1.

FIG. 34B shows an example in which the aspect ratio is more than 1.

DESCRIPTION OF EMBODIMENTS

Figure 1:
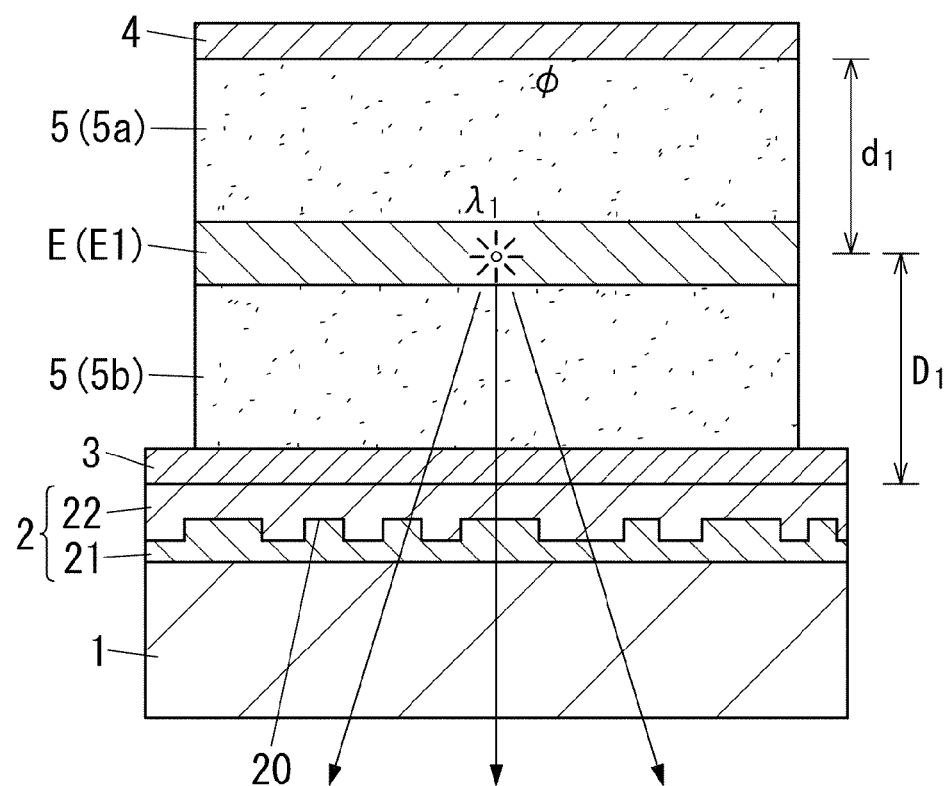
FIG. 1 is a schematic section illustrating an example of one embodiment of the organic electroluminescence element.
Figure 2:
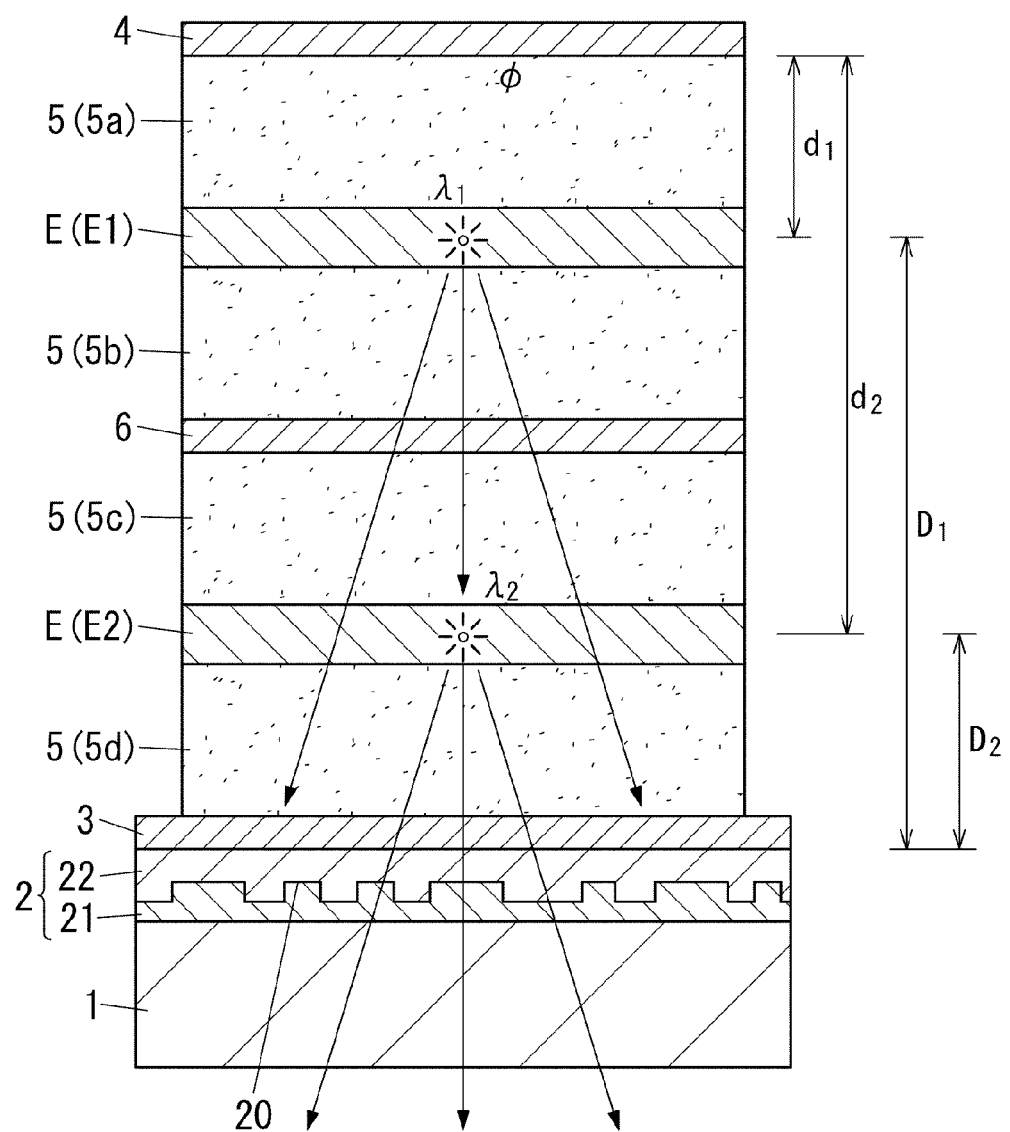
FIG. 2 is a schematic section illustrating another example of one embodiment of the organic electroluminescence element.
Figure 3:
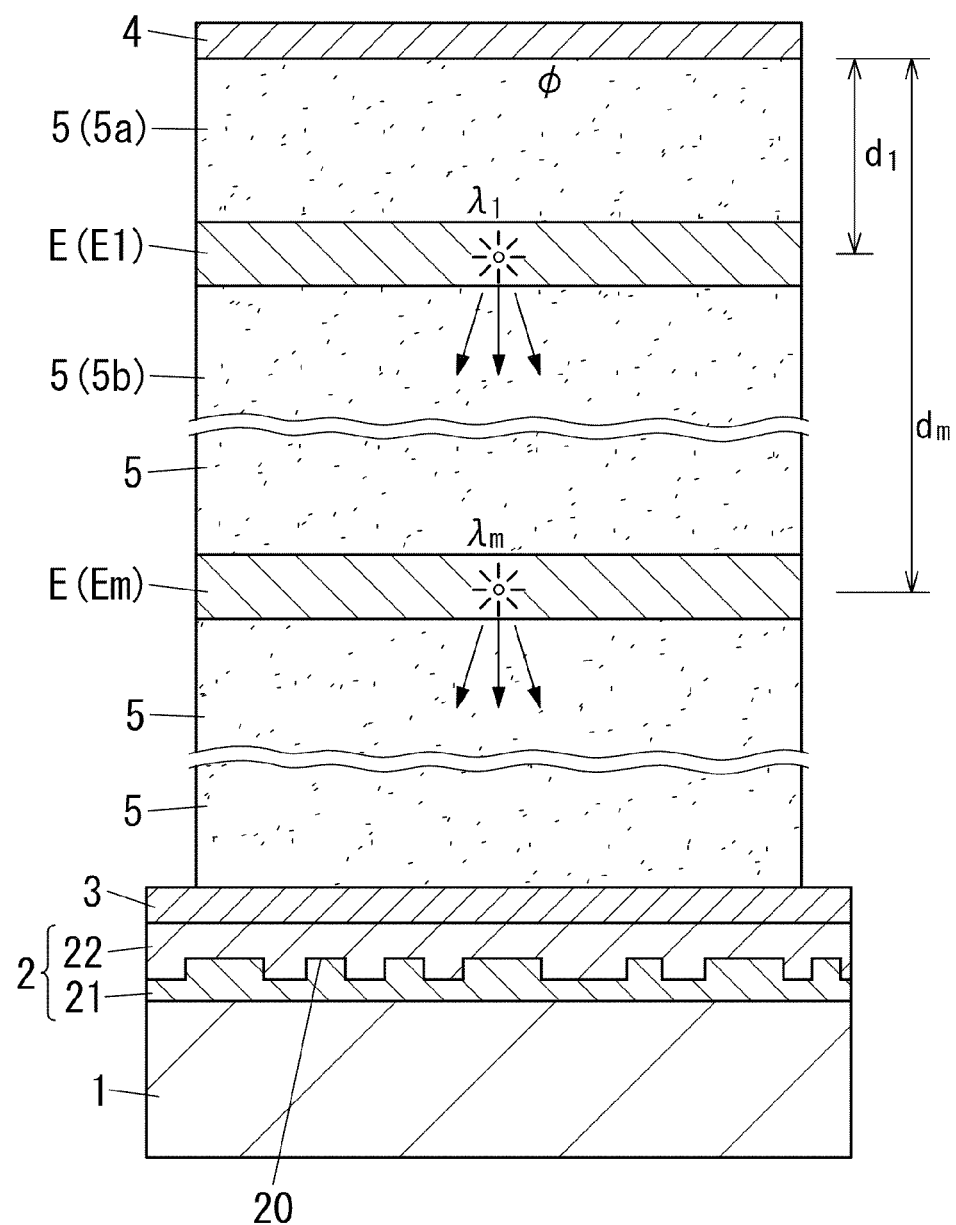
FIG. 3 is a schematic section illustrating another example of one embodiment of the organic electroluminescence element.
Figure 4:
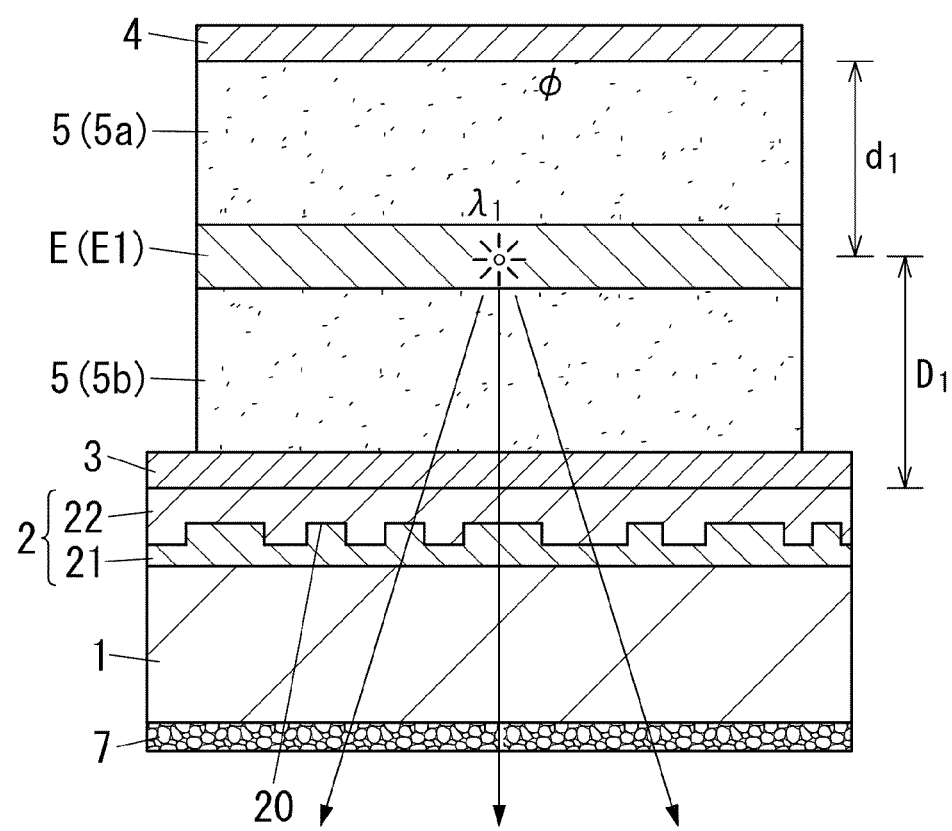
FIG. 4 is a schematic section illustrating another example of one embodiment of the organic electroluminescence element.
Figure 5:
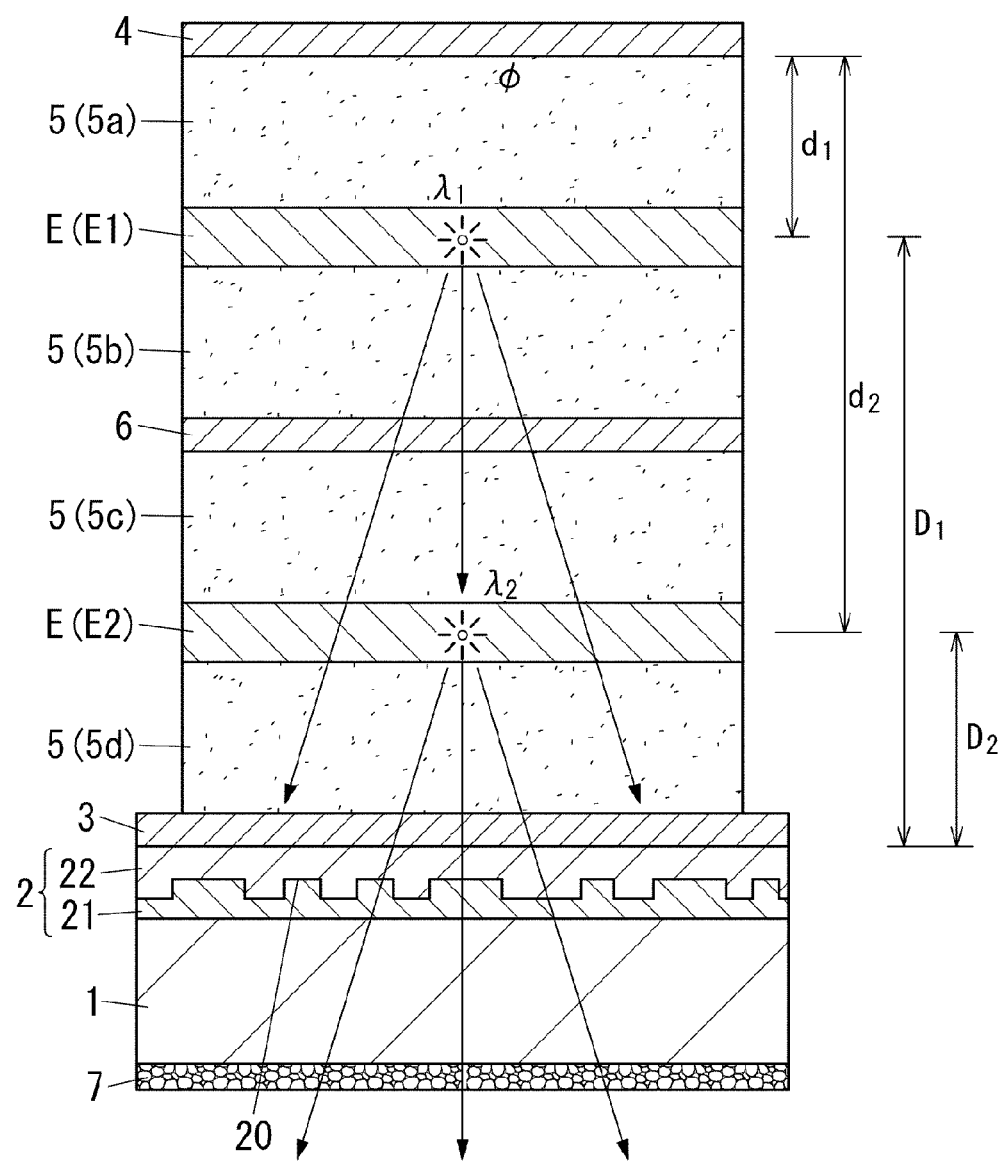
FIG. 5 is a schematic section illustrating another example of one embodiment of the organic electroluminescence element.

FIG. 1 illustrates the first embodiment of the organic electroluminescence element (organic EL element). FIG. 2 illustrates the second embodiment of the organic EL element. FIG. 3 illustrates the third embodiment of the organic EL element. FIG. 4 illustrates the fourth embodiment of the organic EL element. FIG. 5 illustrates the fifth embodiment of the organic EL element. The individual embodiments are described while focusing on common components of the individual embodiments of the organic EL element.

The organic EL element includes a substrate 1 having a light transmissive property, a light diffusion layer 2, a light transmissive electrode 3, a light reflective electrode 4, and one or multiple light emitting layers E. The light diffusion layer 2 is on a surface of the substrate 1. The light transmissive electrode 3 is on a surface of the light diffusion layer 2. The light reflective electrode 4 is an electrode paired with the light transmissive electrode 3. The one or multiple light emitting layers E are between the light transmissive electrode 3 and the light reflective electrode 4. In FIG. 1 to FIG. 6, a single light emitting layer is designated by reference sign E.

The first embodiment and the fourth embodiment each include one light emitting layer E. These are organic EL elements with single-unit structures. The second embodiment and the fifth embodiment each include two light emitting layers E. These are organic EL elements with multi-unit structures. With regard to the third embodiment, a middle part of a layer configuration is omitted, and it is explained that there are one or multiple (two or three or more) light emitting layers E. It is considered that, in the third embodiment, reference signs relating to light emitting layers E are expressed by use of general expressions. When there are multiple light emitting layers E, the multiple light emitting layers E are preferably spaced from each other.

The fourth embodiment may be a modification of the first embodiment. and further includes a light-outcoupling layer 7 on an opposite surface of the substrate 1 from the light diffusion layer 2. The fifth embodiment may be a modification of the second embodiment, and further includes a light-outcoupling layer 7 on an opposite surface of the substrate 1 from the light diffusion layer 2.

The present invention is explained with reference to the third embodiment whose reference signs relating to light emitting layers E are expressed by use of general expressions. Note that, the following explanation may be also applied to each embodiment.

In the present description, the light emitting layers E includes the m-th closest light emitting layer E to the light reflective electrode 4, which is referred to as an m-th light emitting layer Em. In this regard, m is an integer equal to or more than 1. For example, the first closest light emitting layer E to the light reflective electrode 4 is referred to as a first light emitting layer E1. Additionally, the second closest light emitting layer E to the light reflective electrode 4 is referred to as a second light emitting layer E2.

$\lambda_m$ represents a weighted average emission wavelength of the m-th light emitting layer Em. For example, a weighted average emission wavelength of the first light emitting layer E1 is represented by $\lambda_1$. Further, a weighted average emission wavelength of the first light emitting layer E2 is represented by $\lambda_2$.

$\phi m$ represents a phase shift of light produced by the m-th light emitting layer Em caused by the light reflective electrode 4 defined by the following expression (1).

[FORMULA 4]

$$\phi(\lambda_m) = \tan^{-1}\left\{\frac{2(n_s k_r - n_r k_s)}{n_s^2 - n_r^2 + k_s^2 - k_r^2}\right\} \quad (4)$$

In this expression, $n_s$ and $k_s$ represent a refractive index and an extinction coefficient of a layer in contact with the light reflective electrode, respectively, and $n_r$ and $k_r$ represent a refractive index and an extinction coefficient of the light reflective electrode, and $n_s$, $n_r$, $k_s$, and $k_r$ are functions of $\lambda_m$.

For example, a phase shift of light produced by the first light emitting layer E1 is represented by $\phi_1$. Additionally, a phase shift of light produced by the second light emitting layer E2 is represented by $\phi_2$.

An average refractive index of a medium filling a space between the light reflective electrode 4 and the m-th light emitting layer Em is represented by $n_m(\lambda_m)$. For example, an average refractive index of a medium filling a space between the light reflective electrode 4 and the first light emitting layer E1 is represented by $n_1(\lambda_1)$. Further, an average refractive index of a medium filling a space between the light reflective electrode 4 and the second light emitting layer E2 is represented by $n_2(\lambda_2)$. Such an average refractive index depends on an emission wavelength, and therefore a refractive index is calculated for each emission wavelength.

A distance from the light reflective electrode 4 to the m-th light emitting layer Em is represented by $d_m$. For example, a distance from the light reflective electrode 4 to the first light emitting layer E1 is represented by $d_1$. Further, a distance from the light reflective electrode 4 to the second light emitting layer E2 is represented by $d_2$. The distance $d_m$ denotes a physical distance.

The distances $d_m$ satisfy a relation of $d_1 < d_2 < d_3 < \ldots$.

In the organic EL element, at least the first light emitting layer E1 defined as the m-th light emitting layer Em when m=1 fulfills a relation represented by the following expression (2).

[FORMULA 5]

$$\phi(\lambda_m) \times \frac{\lambda_m}{4\pi} + \frac{l+0.1}{2}\lambda_m \le n_m(\lambda_m) \times d_m \le \phi(\lambda_m) \times \frac{\lambda_m}{4\pi} + \frac{l+0.5}{2}\lambda_m \quad (2)$$

In the above expression, l is an integer equal to or more than 0.

In this regard, the first light emitting layer E1 preferably fulfills the relation under a condition where l=0. Note that, "l" is a lower case of L, and is distinguished from 1 which represents the number one. The relation of the following expression (4) is obtained from the above expression (2) as a preferable relation of the first light emitting layer E1.

[FORMULA 6]

$$\phi(\lambda_1) \times \frac{\lambda_1}{4\pi} + 0.05\lambda_1 \le n_1(\lambda_1) \times d_1 \le \phi(\lambda_1) \times \frac{\lambda_1}{4\pi} + 0.25\lambda_1 \quad (4)$$

The above relation is preferable to both the single-unit structure (FIG. 1 and FIG. 4) and the multi-unit structure (FIG. 2 and FIG. 5).

When there are multiple light emitting layers E, it is preferable that two or more of the multiple light emitting layers E fulfill the relation of the above expression (2). In this regard, it is more preferable that all the multiple light emitting layers each fulfill the relation.

The relation represented by the above expression (2) is made based on optical interference in view of diagonal rays of light. Hence, an amount of light emerging outside can be increased efficiently. Additionally, diagonal rays of light are taken into account, and therefore color differences occurring depending on view angles can be suppressed. As a result, it is possible to obtain the organic EL element which has the enhanced light-outcoupling efficiency and the reduced view angle dependence, and thereby is excellent in the light emitting property.

In this regard, the average refractive index of the medium can be calculated based on the following expression (5).

[FORMULA 7]

$$\tilde{n}(\lambda) = \frac{\Sigma n_1(\lambda) \times d_1 + n_2(\lambda) \times d_2 + \ldots}{\Sigma d_m} \quad (5)$$

Note that, in the above expression, d denotes a thickness of one of one or more layers constituting the medium, and n denotes a refractive index of one of one or more layers constituting the medium. m is an integer equal to or more than 1, and indicates one of numbers allocated to the individual layers in order. In this sense, d, n, and m in this expression are different from those of the expressions (1) to (4).

As described in the above expression, the average refractive index of the medium can be interpreted as an average refractive index of a medium with regard to the weighted average emission wavelength λ of a spectrum of a light emitting material, and namely is a thickness-weighted average refractive index.

In this regard, a weighted average emission wavelength is defined as a wavelength calculated by integration of a spectral intensity obtained based on measurement of a spectrum of an intensity of an emission wavelength (emission spectrum), and is exactly represented by the following expression (6).

[FORMULA 8]

$$\lambda_w = \frac{\int_{380}^{780} \lambda * P(\lambda) \, d\lambda}{\int_{380}^{780} P(\lambda) \, d\lambda} \quad (6)$$

In this expression, λ denotes a wavelength (nm), and P(λ) denotes a spectral intensity of a corresponding wavelength.

Hereinafter, the phase shift is described. The light emitting layer of the organic EL element is relatively thin and for example has a thickness of several hundred nm, and the thickness is very close to a wavelength of light (wavelength of light in propagating a medium), and therefore thin film interference may occur inside the organic EL element. As a result, the thickness of the organic layer causes interference with inside light emission, and therefore an intensity of emitted light is greatly increased or decreased. To increase the intensity of emitted light as possible, light (direct light) which directly travels from the light emitting layer to a light emerging side and light (reflected light) which travels from the light emitting layer toward a reflective electrode and then is reflected by this electrode to travel toward the light emerging side are set to as to cause constructive interference. When light is reflected by the light reflective layer, there is a phase shift 11 between rays of light before and after reflection. In view of this, in an ideal model, an optical thickness (optical distance) which is calculated by multiplying a thickness d defined as a distance between a light emitting source and a surface of reflective layer by a refractive index n is set equal to about an odd multiple of ¼π of a wavelength λ of light. By doing so, an amount of a component of light which emerges from the substrate in a front direction is maximized. This design is so-called cavity design. According to this method, light is not amplified inside, but light in a specified direction exemplified by a front direction in which light can easily emerge outside is amplified as a result of changing directions of light. However, actually, the phase shift of light is not equal to n, and shows more complex changes due to refraction and extinction at the organic layer and reflective layer. The phase shift of light in this case is represented by φ. The organic EL element can be designed on the basis of this phase shift φ.

With regard to the distance d between the light emitting layer E and the light reflective electrode 4, in the present description, unless otherwise noted, a center point of the light emitting layer E in the thickness direction thereof and a point at a surface of the light reflective electrode 4 facing the light emitting layer E are used as reference points. In other words, in more exact definition, the distance d should be interpreted as a distance from the surface of the light reflective electrode 4 facing the light emitting layer E to the center of the light emitting layer E in the thickness direction thereof. Light is reflected at the surface of the reflective layer, and therefore it is understandable that the surface of the light reflective electrode 4 is used as the reference point thereof. As for the light emitting layer E, in the strict sense, it is preferable that the reference point is a recombination point of electrons and holes. However, the recombination point may vary depending on material and properties of elements. Further, in many cases the light emitting layer E is relatively thin in view of the proportion of the light emitting layer E to the entire element. Hence, the center of the light emitting layer E may be used as the reference point thereof. Note that, when the recombination point can be determined, the recombination point can be used as the reference point for determining the distance d. For example, the recombination point is not limited to the center in the thickness direction, and can be a surface (a surface facing the light reflective electrode 4 or a surface facing the light transmissive electrode 3).

One or more appropriate layers contributing to operation of the organic EL element may be provided between a certain electrode and the light emitting layer E and the multiple light emitting layers E. For example, such appropriate layers include a charge transport layer 5 and an interlayer 6. FIG. 1 to FIG. 5 show the charge transport layer 5 and the interlayer 6. The charge transport layer 5 may be a layer for injecting and transporting holes or electrons. The interlayer 6 may be a layer for producing charges. In the first to fifth embodiments, the interlayer 6 is present between the charge transport layers 5. Note that, a bipolar layer may be present between one light emitting layer E and another light emitting layer E. In this case, there is no need to provide the interlayer 6, and the distance between the light emitting layers E can be increased or decreased. Therefore, positions of the light emitting layers E can be easily adjusted.

As shown in FIG. 2 or the like, the charge transport layers 5 are referred to as the first charge transport layer 5a, the second charge transport layer 5b, the third charge transport layer 5c, and the fourth charge transport layer 5d, in ascending order in distance to the light reflective electrode 4. The first charge transport layer 5a may serve as a layer with an electron transport property. The second charge transport layer 5b may serve as a layer with a hole transport property. The third charge transport layer 5c may serve as a layer with an electron transport property. The fourth charge transport layer 5d may serve as a layer with a hole transport property. Note that, such a charge transport layer 5 may have a structure causing charge conversion at its inside.

Besides, the present description mainly gives explanations to elements in which one light emitting unit includes one light emitting layer E. However, one light emitting unit may include a stack of two or more light emitting layers E. When one light emitting unit includes a stack of two or more light emitting layers E, the light emitting layers E may be stacked directly. When one light emitting unit includes a stack of two or more light emitting layers E, one or more the light emitting layers E which are excellent in contribution to light emitting properties (i.e., the light-outcoupling efficiency and the color difference) may be designed to fulfill the relation defined by the above expression (2). Note that, it is more preferable that all the light emitting layers E fulfill the above expression (2).

In the fourth and fifth embodiments, the light-outcoupling layer 7 is provided to the opposite surface of the substrate 1 from the light diffusion layer 2. When the light-outcoupling layer 7 is provided, total reflection at an interface between the substrate 1 and an outside (atmosphere) can be suppressed, and an amount of light emerging outside can be increased.

Note that, a distance from the light emitting layer E to a surface of the light transmissive electrode 3 facing the substrate 1 is represented by D. The reference point of the position of the light emitting layer E for determining the distance D may be same as that for determining the distance d, and may be the center of the light emitting layer E in the thickness direction thereof.

[Design of Element]

With reference to a design model of the organic EL element, it is explained that the aforementioned relations are preferable.

Figure 6:
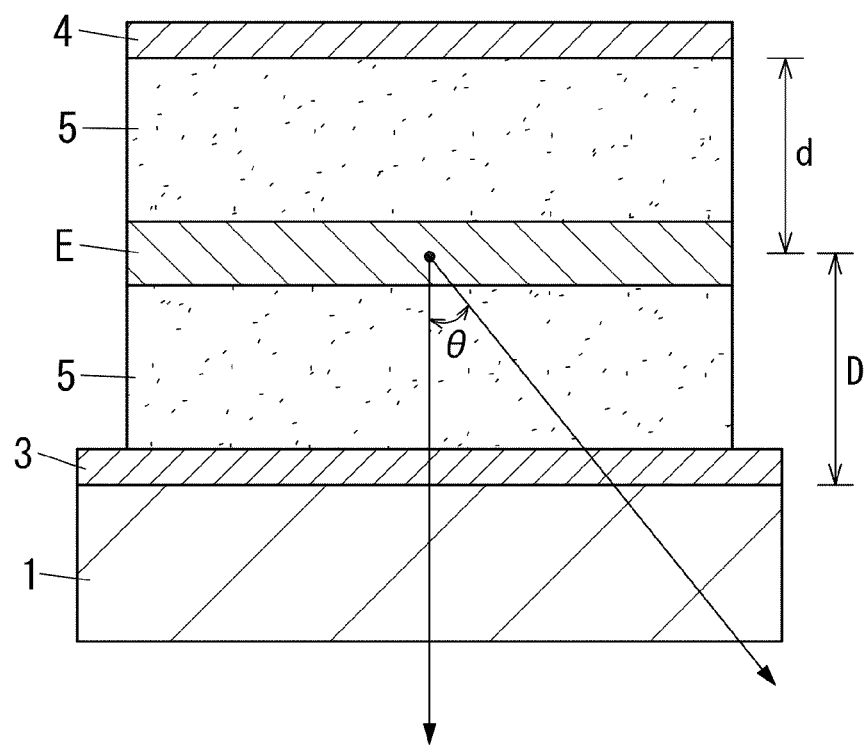
FIG. 6 is a schematic section illustrating a model of the organic electroluminescence element.

FIG. 6 shows the design model of the organic EL element. This design model is used to optimize the organic EL element. This organic EL element includes the substrate 1, the light transmissive electrode 3, the light emitting layer E, and the light reflective electrode 4. This organic EL element includes one light emitting layer E and therefore has a single unit structure. Further, the organic EL element includes the charge transport layer 5. However, the organic EL element is devoid of the light diffusion layer 2. The light diffusion layer 2 is omitted to simplify the organic EL element. Hence, it is possible to consider the optimal condition for light-outcoupling.

In optimization of the organic EL element, the efficiency (light-outcoupling efficiency) and the color difference depending on the view angle (deviation in u'v' coordinates) are considered as properties of the light emitting element. As shown in FIG. 6, the deviation of the color difference is defined as deviation in color between light emerging in the front direction and light emerging at an angle θ. In the organic EL element, light directly emerging from the light emitting layer E and light reflected by an electrode with light reflective properties interfere with each other to cause increase and decrease in light in a certain emerging direction, and therefore a pattern of distribution of light may change. The pattern of distribution of light arriving at the light diffusion layer or the substrate causes direct effects on the efficiency and the color difference. Hence, the distance d between the light emitting layer E and the reflective layer (light reflective electrode 4) for each light emission color is an important factor for determining the efficiency and the color difference. In view of this, in the present design, mainly, the distance between the light emission position and the reflective layer are controlled precisely to obtain the pattern of distribution of light which realizes the preferable efficiency and color difference.

Figure 7:
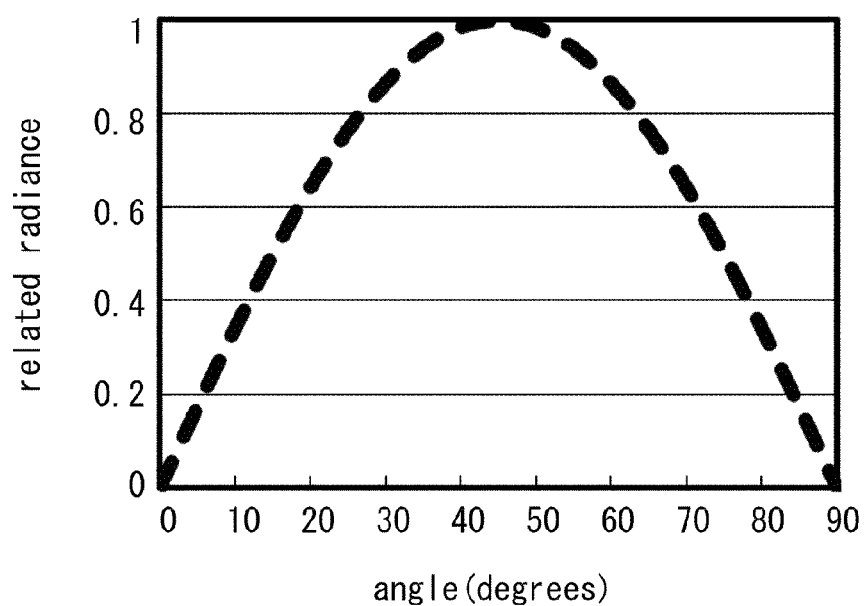
FIG. 7 is a graph illustrating a relation between the light extraction direction and the light intensity.

FIG. 7 is a graph illustrating a light extraction direction component measured in a solid angle (radiant flux). This graph shows the light extraction direction component (angle θ) of an amount of light produced by the light emitting layer E. In this regard, it is assumed that rays of light are emitted in all directions at equal probabilities from a light emitting source. Based on Gauss' law, a view angle component which causes an increase in the solid angle increases as an amount of relative light emission energy (radiant flux). An angle at which the light extraction direction component of the radiant flux is maximized is proportional to $\sin 2\theta$ as a result of calculation, and therefore the angle is about 45°. The graph of FIG. 7 shows the light extraction direction component $P(\theta) = \sin 2\theta$. In view of this, optical design is made based on a diagonal direction component, especially 45° direction component, and thereby it is possible to realize efficient extraction of light. In brief, by making optimization in view of the diagonal direction in addition to optimization in view of the frontal direction, the light-outcoupling efficiency can be more improved.

Figure 8:
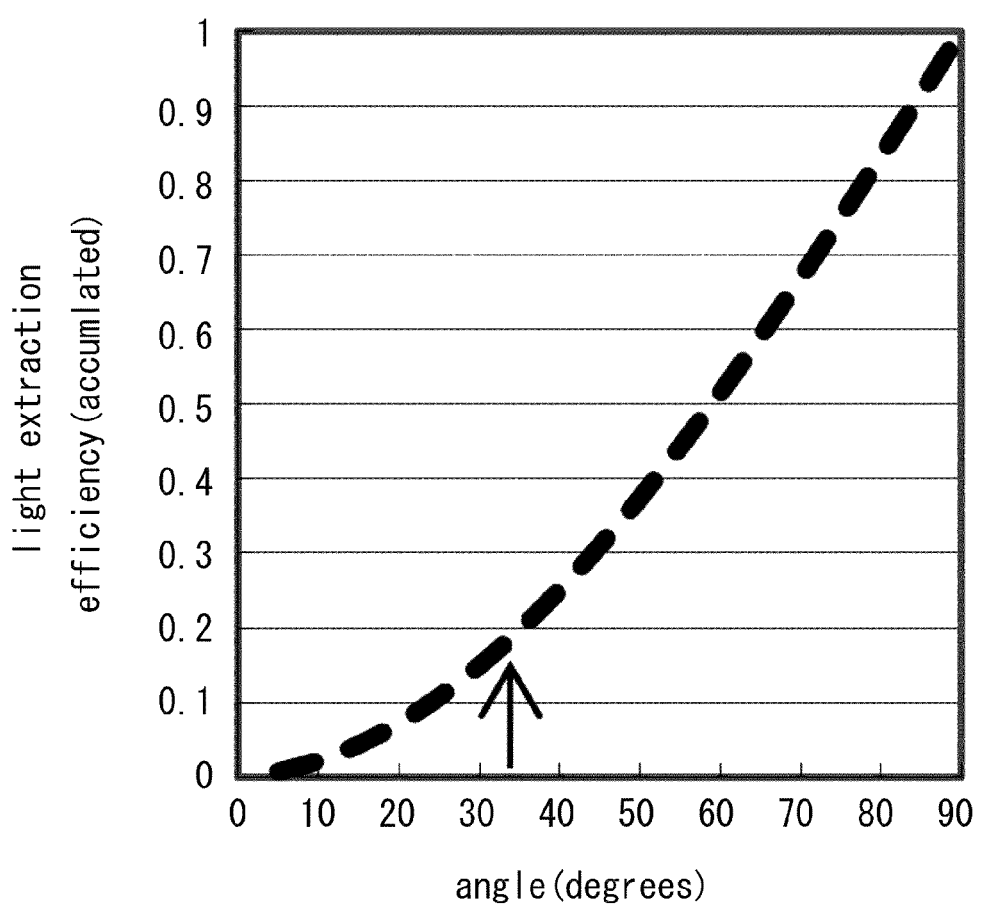
FIG. 8 is a graph illustrating a relation between the light extraction direction and the amount of light.

FIG. 8 shows an accumulated amount of light with an increase in the light extraction direction (angle θ). In considering the diagonal direction light, there are some points which should be taken into account. Generally, refractive indices of a substrate and atmosphere are lower than a refractive index of an organic layer, and therefore critical angles causing total reflection exist. Hence, rays of light at angles equal to or more than certain angles are totally reflected and therefore cannot emerge outside. For example, when a refractive index of an organic layer is 1.8, a critical angle is 34° and therefore rays of light at angles equal to or more than the critical angle of 34° cannot emerge to atmosphere. It is understood from the graph of FIG. 8 that, when rays of light at angles equal to or more than 34° cannot emerge, only about 17% of entire light can emerge (see the arrow in the corresponding figure). When considering rays of light at angles around 45°, for the purpose of making light emerge, a means for making light emerge from the organic layer to the atmosphere is necessary. In view of this, by providing the light diffusion layer 2 between the organic layer and the substrate, it is possible to allow rays of light at angles around 45° to emerge.

Under the aforementioned supposition, the optical design for increasing rays of light at the inclined angles θ relative to the frontal direction being around 45° was considered by use of the model shown in FIG. 6. In more details, the substrate 1 is made of a glass substrate (refractive index 1.5). Further, a medium filling a space between the organic layer (light emitting layer E) and the light reflective electrode 4 has the refractive index (n) of 1.84 and the extinction coefficient (k) of 0.001. Note that, the refractive index of the organic layer and the extinction coefficient are averaged values. Further, the light reflective electrode 4 is made of Ag. The light reflective electrode 4 has the refractive index (n) of 0.125, and the extinction coefficient (k) of 3.34. The light emitting layer E is made of light emission material which causes light with the weighted average emission wavelength of 550 nm. The distance D from the light emitting layer E to the surface of the light transmissive electrode 3 facing the substrate 1 is 100 nm. Note that, it is confirmed that the distance D does not cause great effects on the light-outcoupling efficiency. Under the aforementioned condition, the change in the intensity of light emerging in the 0° direction (the frontal direction) and the change in the intensity of light emerging in the 45° direction (the diagonal direction) were measured versus change in the distance d between the light emitting layer E and the light reflective electrode 4.

Figure 9:
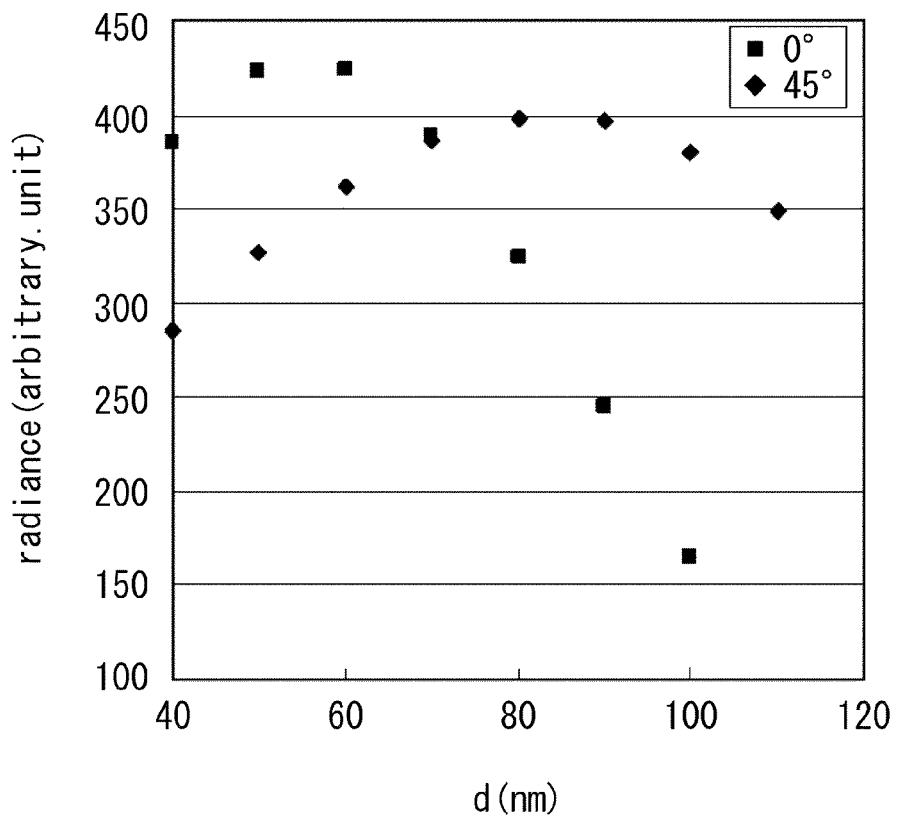
FIG. 9 is a graph illustrating a relation between the position of the light emitting layer and the light intensity of the model of the organic electroluminescence element.

FIG. 9 is a graph illustrating change in the intensity of emerging light versus change in the distance d. Generally, the optimal value of the cavity design is around d=50 nm to 60 nm which indicates a peak in the 0° direction. The cavity means a constructive interference of light. In contrast, with regard to light emission around 45°, there is a peak at about d=80 nm to 90 nm. This is because the distance between the light emission position and the reflective layer (a difference in light paths of direct light and reflected light) with regard to light in the 45° direction is increased depending on the angle thereof.

Figure 10:
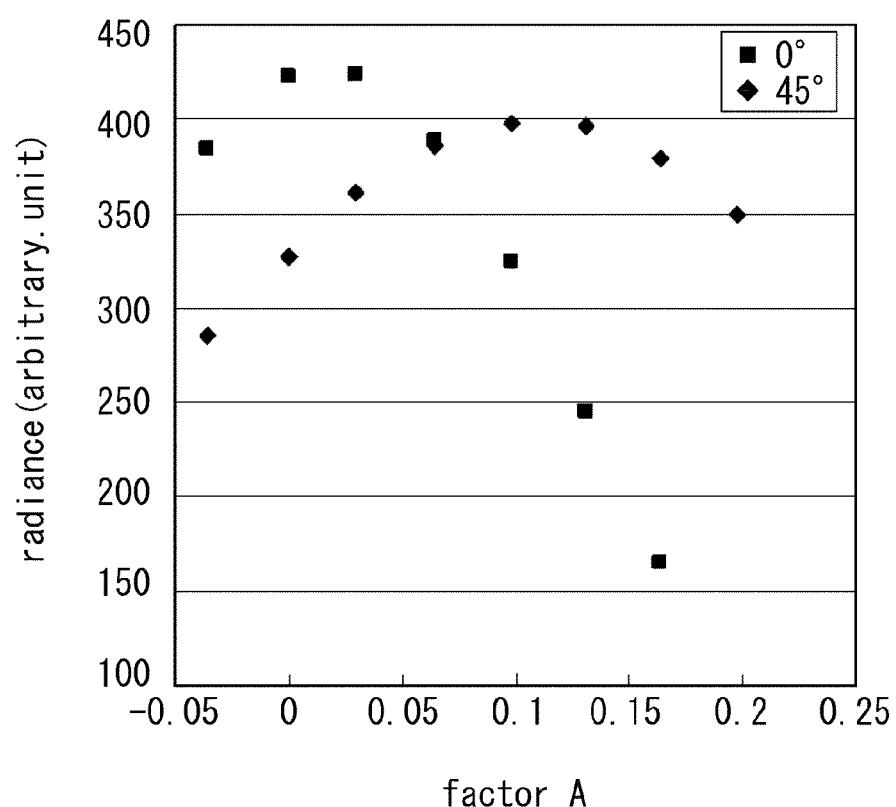
FIG. 10 is a graph illustrating a relation between the position (factor A) of the light emitting layer and the light intensity of the model of the organic electroluminescence element.

FIG. 10 is a graph showing how much numerical values of the distance d shown in FIG. 9 are deviated from their original cavity positions. In the present description, a factor A defined by the following expression (7) is used to determine a deviation from the cavity.

[FORMULA 9]

$$n(\lambda) \times d = \phi(\lambda) \times \frac{\lambda}{4\pi} + A \times \lambda \qquad (7)$$

The factor A is a numerical value representing how many times of wavelength is equal to a difference between the distance and the first-order interference distance in terms of the optical distance (n×d). The factor A is represented as a factor indicative of a deviation of the distance from the first-order interference distance. In this graph, the lateral axis indicates the factor A.

In the organic EL element as the model, A=0 at the original cavity position, which means the cavity position in the frontal direction. However, in the design based on the diagonal direction light, by making design at A=around 0.05 to 0.25 preferably A=around 0.1 to 0.2, it is predicted that the peak of light emission can be obtained. This is because light in the diagonal direction emerges together with light in the frontal direction (0°). As described above, it is understood that the light-outcoupling efficiency can be optimized by deviating the position of the light emitting layer from the original cavity position.

[Organic EL Element with Single Unit Structure]

Based on the above design, the organic EL element with the single-unit structure was prepared experimentally. This has the same layer structure as the fourth embodiment illustrated in FIG. 4. The whole emission color of this is orange. The light emitting layer E has the weighted average emission wavelength ($\lambda_1$) of 580 nm. The medium filling the space between the first light emitting layer E1 and the light reflective electrode 4 has the average refractive index (n) of 1.80, and the extinction coefficient (k) of 0.0005. These refractive index and extinction coefficient are averages with regard to the wavelength $\lambda_1$. Further, the light reflective electrode 4 is made of Ag. The light reflective electrode 4 has the refractive index (n) of 0.119 and the extinction coefficient (k) of 3.51. Note that, the refractive index and the extinction coefficient depend on an emission wavelength, and therefore they are different in values from those of the above model. The light transmissive electrode 3 is of ITO. The light transmissive electrode 3 serves as an anode, and the light reflective electrode 4 serves as a cathode. The substrate 1 is of a glass substrate (the refractive index 1.5). In this organic EL element, to utilize light in directions near a diagonal direction (especially θ=45°), the light diffusion layer 2 is provided between the substrate 1 and the light transmissive electrode 3. By adding the light diffusion layer 2, traveling directions of rays of light are changed, and therefore it is possible to increase an amount of light in the diagonal direction.

By controlling the distance $d_1$ between the light emitting layer E and the light reflective electrode 4 while the factor A is kept in a range of 0 to 0.3, sample elements with different factors A were produced experimentally and were evaluated.

In the elements, $n_s$, $k_s$, $n_r$, and $k_r$ are determined, and therefore $\phi(\lambda)$ can be calculated from the aforementioned expression (1).

In more details, first, in the organic EL element, $\phi(\lambda_1)$ is equal to 0.694π from the above expression (1) with regard to the emission wavelength $\lambda_1$.

In this regard, the distance $d_1$ at the factor A is defined as $d_1(A)$. The distance $d_1$ at the factor A=0 is represented by $d_1(0)$.

In this case, the distance $d_1(0)$ is expressed by the following expression (8).

[FORMULA 10]

$$d_1(0) = \phi(\lambda_1) \times \frac{\lambda_1}{4\pi} \times \frac{1}{n} \qquad (8)$$

When $\phi(\lambda_1)$=0.694π, $\lambda_1$=580 nm, and n=1.80, this expression provides $d_1(0)$=56 nm. In some senses, this $d_1(0)$ means a thickness which does not cause a deviation in the cavity design.

The factor A is represented by the following expression (9) by use of the distance $d_1(A)$ and $d_1(0)$.

[FORMULA 11]

$$A = \frac{n(d_1(A) - d_1(0))}{\lambda_1} \qquad (9)$$

Thus, the following expression (10) is obtained as an expression for calculating $d_1(A)$.

[FORMULA 12]

$$d_1(A) = d_1(0) + A \times \frac{\lambda_1}{n} \qquad (10)$$

For example, when A=0.15, this expression provides $d_1(0.15)$=56+0.15×580/1.80=104 nm. The distance $d_1$ reflecting the factor A is determined.

With regard to the factor A, A=0 in the first-order interference, and A=0.5 in the second-order interference, and A=1 in the third-order interference. In summary, in the α-order interference, A=0.5×(α−1) in terms of an ideal system. Therefore, a relation between the factor A and the distance d is obtained.

Figure 11:
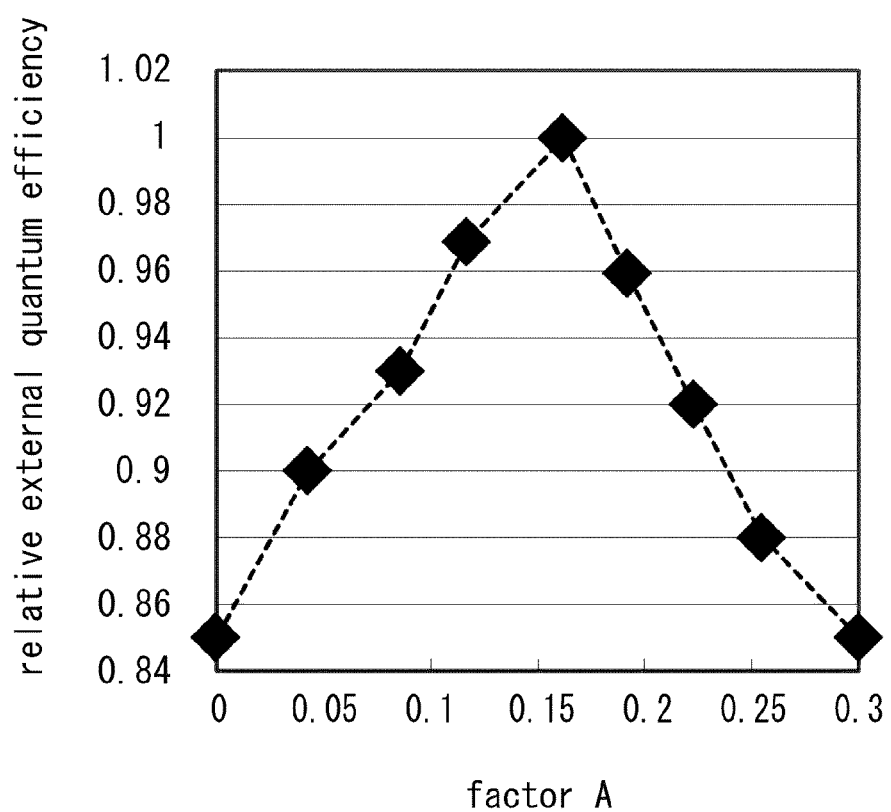
FIG. 11 is a graph illustrating a relation between the position (factor A) of the first light emitting layer and the light-outcoupling efficiency.

FIG. 11 shows a graph illustrating a relation between the factor A and the light-outcoupling efficiency. It is confirmed from FIG. 11 that a peak is present near A=0.15 and this means the same tendency as the above design model. It is confirmed that the light-outcoupling efficiency does not have a peak at the factor A=0 obtained by adjusting the cavity design based on the frontal direction but have a peak at the factor different from the factor A=0. Note that, when the peak top is defined as 100%, a range of the factor A which provides the light-outcoupling efficiency of equal to or more than 90% is from 0.05 to 0.25.

Consequently, in the organic EL element with the single unit structure, it is confirmed that the light-outcoupling efficiency can be optimized when $d_1$ satisfies the relation represented by the above expression (4).

Note that, in the single-unit structure, it is possible to use the design of adjusting the position of the light emitting layer E under a condition where l=1 in the expression (2) based on the second-order interference. However, in view of thinning, the expression (4) using the first-order interference is more advantageous.

[Organic EL Element with Multi-Unit Structure]

Based on the above design, the organic EL element with the multi-unit structure was prepared experimentally. This has the same layer structure as the fifth embodiment illustrated in FIG. 5. The whole emission color of this is white. The white emission is important for the lighting use and the like. The first light emitting layer E1 has the weighted average emission wavelength ($\lambda_1$) of 580 nm. The emission color of the first light emitting layer E1 is orange. The second light emitting layer E2 has the weighted average emission wavelength ($\lambda_2$) of 470 nm. The emission color of the second light emitting layer E2 is blue. The medium filling the space between the first light emitting layer E1 and the light reflective electrode 4 has the average refractive index (n) of 1.80, and the extinction coefficient (k) of 0.0005. These refractive index and extinction coefficient are averages with regard to the wavelength $\lambda_1$. The medium filling the space between the second light emitting layer E2 and the light reflective electrode 4 has the average refractive index (n) of 1.83, and the extinction coefficient (k) of 0.0007. These refractive index and extinction coefficient are averages with regard to the wavelength $\lambda_2$. Further, the light reflective electrode 4 is made of Ag. The light reflective electrode 4 has the refractive index (n) of 0.119 and the extinction coefficient (k) of 3.51 with regard to the wavelength $\lambda_1$. Further, the light reflective electrode 4 has the refractive index (n) of 0.135 and the extinction coefficient (k) of 2.66 with regard to the wavelength $\lambda_2$. The light transmissive electrode 3 is of ITO. The light transmissive electrode 3 serves as an anode, and the light reflective electrode 4 serves as a cathode. The substrate 1 is of a glass substrate (the refractive index 1.5). In this organic EL element, to utilize light in directions near a diagonal direction (especially $\theta$=45°), the light diffusion layer 2 is provided between the substrate 1 and the light transmissive electrode 3. By adding the light diffusion layer 2, traveling directions of rays of light are changed, and therefore it is possible to increase an amount of light in the diagonal direction.

In the two multi-unit structure including the two light emitting units, the second light emitting layer E2 which is a farther one of light emitting layers E from the light reflective electrode 4 may show the second or subsequent order interference peak in many cases. Therefore, in the multi-unit structure, it is preferable that the interference derived from the m-th light emitting layer Em be optimized. To this optimization, the above design used in the single-unit structure is applied. In this regard. in expanding the optical design, it is considered that the interference peaks are present at intervals of a half wavelength (more exactly, a half of a value obtained by dividing the wavelength by the refractive index). As a result, the relation represented by the above expression (2) is obtained.

Based on the relation represented by the above expression (2), the factor A is in a range of 0.55 to 0.75 in the case of using the second-order interference, and is in a range of 1.05 to 1.25 in the case of using the third-order interference. Further, in the case of the fourth or subsequent order interference, the factor A can be calculated in a similar manner.

Only for reference, the relation in the case of using the second-order interference of light with the wavelength $\lambda_2$ emitted from the second light emitting layer E2 is shown as the expression (11).

[FORMULA 13]

$$\phi(\lambda_2) \times \frac{\lambda_2}{4\pi} + 0.55\lambda_2 \leq n_2(\lambda_2) \times d_2 \leq \phi(\lambda_2) \times \frac{\lambda_2}{4\pi} + 0.75\lambda_2 \quad (11)$$

This is equivalent to the above expression (2) when m=2 and l=1. In summary, in the case of using the $\alpha$-order interference, l is substituted by $\alpha$-l.

Based on such design, the thicknesses of components of the organic EL elements with the multi-unit structure are determined. In determining the element design, $d_1$ is fixed to a value making the factor A equal to 0.15 ($d_1$=104 nm) but $d_2$ is changed as a parameter.

In the element, $n_s$, $k_s$, $n_r$ and are determined, and therefore $\phi(\lambda_2)$ can be calculated as $0.617\pi$ from the aforementioned expression (1).

Further, as with the above expression (8), the following expression (12) is obtained.

[FORMULA 14]

$$d_2(0) = \phi(\lambda_2) \times \frac{\lambda_2}{4\pi} \times \frac{1}{n} \quad (12)$$

When $\phi(\lambda_2)$=0.617$\pi$, $\lambda_2$=470 nm, and n=1.83, this expression provides $d_2(0)$=40 nm. In some senses, this $d_2(0)$ means a thickness which does not cause a deviation in the cavity design based on the first-order interference.

Further, as with the above expressions (9) and (10), the following expressions (13) and (14) are obtained.

[FORMULA 15]

$$A = \frac{n(d_2(A) - d_2(0))}{\lambda_2} \quad (13)$$

[FORMULA 16]

$$d_2(A) = d_2(0) + A \times \frac{\lambda_2}{n} \quad (14)$$

For example, when A=0.65, this expression provides $d_2(0.65)$=40+0.65×470/1.83=207 nm. The distance $d_2$ reflecting the factor A is determined. Note that, the position of the second light emitting layer E2 is changed based on the position of the second-order interference. This is because the position of the second light emitting layer E2 is near the first light emitting layer E1 in the first-order interference and therefore the optimization is impossible.

Figure 12:
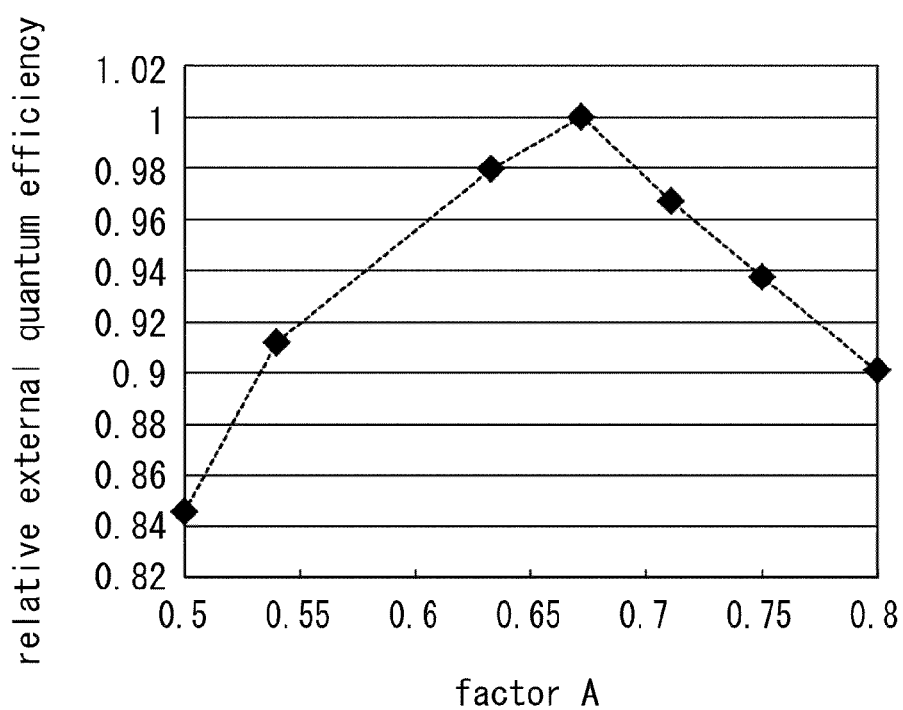
FIG. 12 is a graph illustrating a relation between the position (factor A) of the second light emitting layer and the light-outcoupling efficiency.

FIG. 12 is a graph illustrating a relation between the factor A determined by the distance $d_2$ and the light-outcoupling efficiency. As shown in this graph, it is confirmed that, in the second light emitting layer E2, the light-outcoupling efficiency has a peak when $d_2$ fulfills the condition where the factor A is around 0.65.

Consequently, it is confirmed that the light-outcoupling efficiency is optimized when the relation represented by the above expression (2) is fulfilled.

The organic EL element with the multi-unit structure includes two or more light emitting layers E, and hence the view angle property (suppression of the deviation of the color difference) is important. In view of this, the view angle property of the organic EL element with the multi-unit was confirmed by use of the color difference ($\Delta u'v'$). The $\Delta u'v'$ means a maximum of a root mean square ($\Delta u'^2 + \Delta v'^2)^{(1/2)}$ of an amount of the u'v' coordinates of chromaticity deviated from averages in a range in which the view angle relative to the front is equal to or less than 80 degrees. In this regard, "^" is a symbol representing a multiplier. According to the standard of Energy Star (Program Requirements for Solid State Lighting Luminaires, Eligibility Criteria—Version 1.1, 2008), it is preferable that Δu'v' is less than 0.007 in view of a lighting quality.

Figure 13:
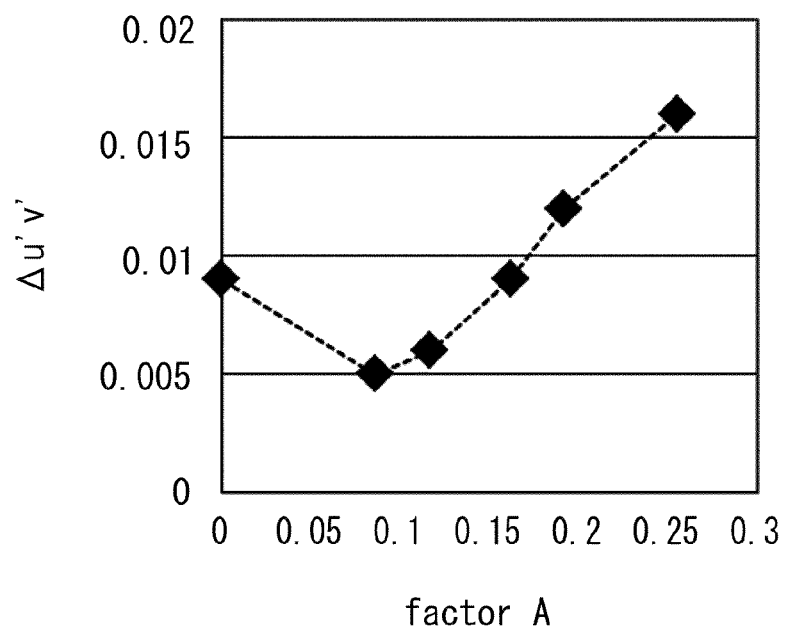
FIG. 13 is a graph illustrating a relation between the position (factor A) of the first light emitting layer and the color difference.

FIG. 13 shows a graph illustrating change in the difference between chromaticity in the frontal direction and chromaticity in the diagonal direction (80°) versus change in the distance $d_1$ as a parameter while the distance $d_2$ is fixed. The horizontal axis represents the factor A. $d_2$ is fixed so that A=0.65.

Figure 14:
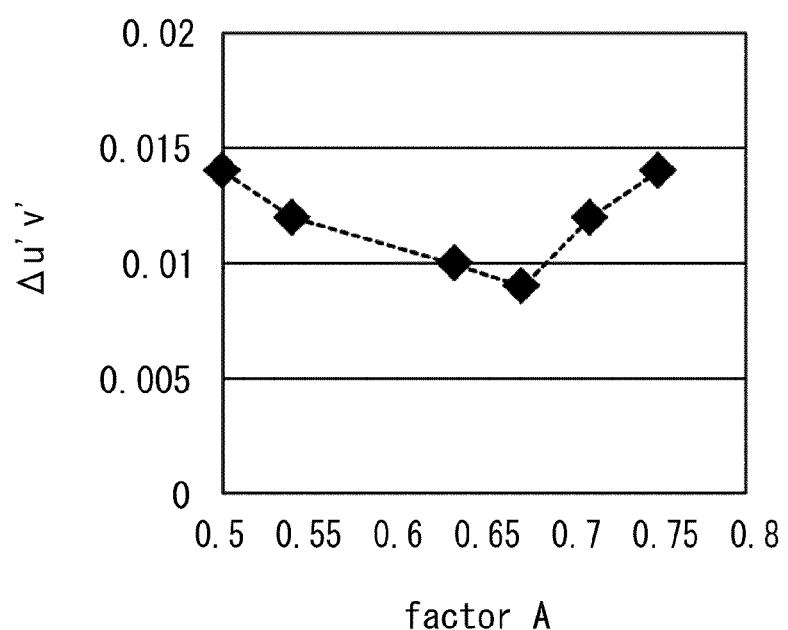
FIG. 14 is a graph illustrating a relation between the position (factor A) of the second light emitting layer and the color difference.

FIG. 14 shows a graph illustrating change in the difference between chromaticity in the frontal direction and chromaticity in the diagonal direction (80°) versus change in the distance $d_2$ as a parameter while the distance $d_1$ is fixed. The horizontal axis represents the factor A. $d_1$ is fixed so that A=0.15.

As apparent from the graphs of FIG. 13 and FIG. 14, with regard to the factors A (distance d) satisfying the above relation, Δu'v' is relatively small. This teaches that the design based on the relation represented by the above expression (2) is effective for suppression of the view angle property (color difference). Note that, the value of Δu'v' may greatly vary depending on the property of the light diffusion layer 2 and/or the property of the light-outcoupling layer 7. However, in element designing, generally, by suppressing Δu'v' in a more simplified system, the entire color difference tends to be more suppressed. Consequently, the light diffusion layer 2 and/or the light-outcoupling layer 7 can be designed more freely.

In order to more suppress deviation of the color difference, determining the distance between the light emitting layer E and the light diffusion layer 2 is effective, too. The cavity effect of the light transmissive electrode 3 side of the light emitting layer E is not so strong compared with the light reflective electrode 4 side of the light emitting layer E, and therefore does not greatly contribute to the efficiency. However, it is considered that the view angle property affects the optical design. In this regard, in determining the distance, it is taken into consideration that the color difference with regard to light which enters the light diffusion layer 2 at a small incident angle and passes through the light diffusion layer 2 by being reflected a few times. For example, a critical angle at an interface between the organic layer (n=1.8) and the glass substrate (n=1.5) is about 56°. Therefore even when the light diffusion layer 2 is present, light at an incident angle more than the critical angle of 56° cannot emerge outside without reflection, but may emerge outside after multiple angle conversions and multiple reflections in the light diffusion layer 2. In this process, such rays of light are mixed, and do not virtually contribute to the color difference. In contrast, majority of rays of light at incident angles less than the critical angle of 56° passes through the light diffusion layer 2 without reflection. Therefore, it may be difficult to suppress deviation of the color difference by the light diffusion layer 2. Hence. in order to suppress the color difference, it is effective to preliminarily configure the element such that light at incident angles less than the critical angle do not cause the color differences.

Figure 15:
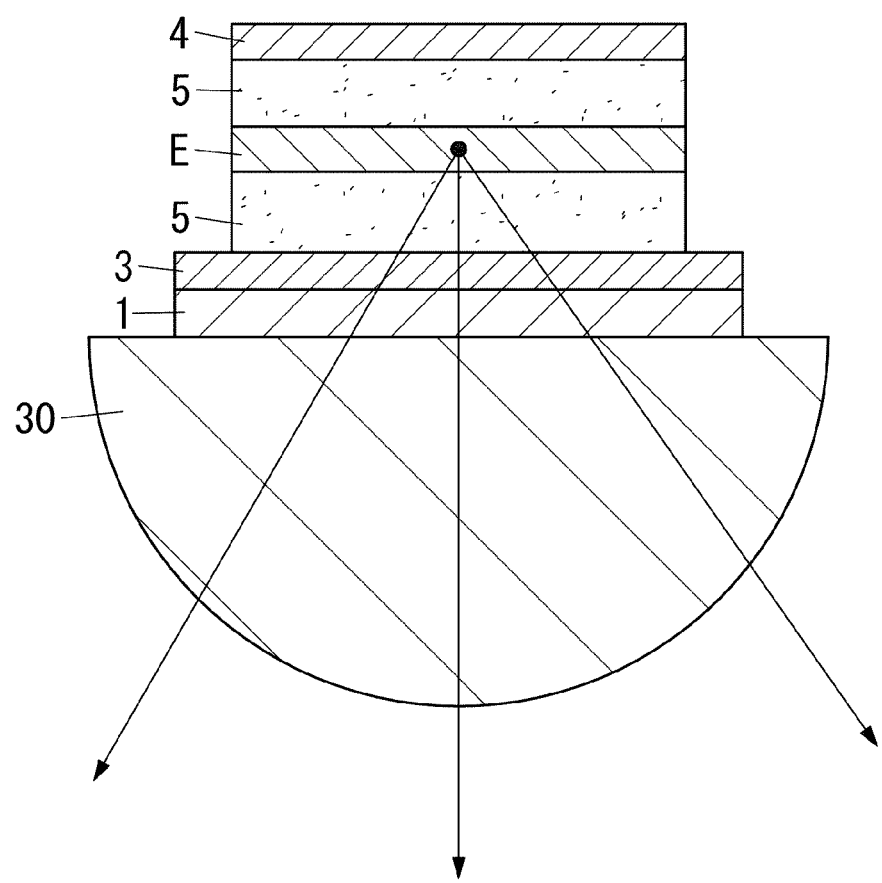
FIG. 15 is a schematic section illustrating an example of a method of measuring the color difference.

FIG. 15 shows a test light emitting element for measuring color differences of light entering the light diffusion layer 2. This test light emitting element has the same layer structure as the light emitting structure of the organic EL element. The test light emitting element includes the substrate 1 having a light transmissive property, the light transmissive electrode 3, the light emitting layer E, the light reflective electrode 4, and the charge transport layers 5. Note that, the light diffusion layer 2 is not provided. Further, the refractive index of the substrate 1 is adjusted substantially equal to the average refractive index of the organic layer (the light emitting layer E, the charge transport layers 5, and the light transmissive electrode 3) so that total reflection does not occur at the interface between the substrate 1 and the light transmissive electrode 3. Further, there is a hemispherical lens 30 on the outside surface of the substrate 1 so as to cover the entire light emitting surface. This hemispherical lens 30 has the refractive index substantially equal to the refractive index of the substrate 1. In this test light emitting element, produced light emerges outside on the first try without total reflection, and therefore distribution of light inside a thin film can be directly checked. Thus, it is possible to easily check the color differences in the frontal direction and the diagonal direction. Note that, FIG. 15 shows the single-unit structure as the light emitting structure. However, also in the case of the multi-unit structure, it is possible to check the color differences.

Based on such analysis, with regard to the organic EL element with the multi-unit structure, changes in the view angle property and the light-outcoupling efficiency versus changes in the distances $d_1$, $d_2$, $D_1$, and $D_2$ were measured. Note that, the view angle property was measured with regard to a system of the test element including the hemispherical lens 30 shown in FIG. 15 and the system of the organic EL element including the light diffusion layer 2 shown in FIG. 5. Further the measurement was conducted with regard to the view angles of 60° and 80°.

The results are shown in TABLE 1.

TABLE 1

| | $d_1$ (nm) | $D_1$ (nm) | $d_2$ (nm) | $D_2$ (nm) | Δu'v' 0-60° hemispherical lens | Δu'v' 0-80° hemispherical lens | Δu'v' 0-80° light diffusion layer | Light-outcoupling efficiency (%) |
|---|---|---|---|---|---|---|---|---|
| Design Example 1 | 56 (A = 0) | 312 | 168 (A = 0.5) | 200 | 0.116 | 0.118 | 0.016 | 30.1 |
| Design Example 2 | 104 (A = 0.15) | 264 | 168 (A = 0.5) | 200 | 0.052 | 0.098 | 0.009 | 35.2 |
| Design Example 3 | 104 (A = 0.15) | 264 | 207 (A = 0.65) | 161 | 0.083 | 0.131 | 0.012 | 39.3 |
| Design Example 4 | 104 (A = 0.15) | 314 | 207 (A = 0.65) | 211 | 0.041 | 0.087 | 0.004 | 38.8 |
| Design Example 5 | 104 (A = 0.15) | 414 | 207 (A = 0.65) | 311 | 0070 | 0.111 | 0.010 | 39.0 |

In TABLE 1, the design example 1 is an example in which the position of the light emitting layer E meets the interference condition. This means that the perfect cavity design is performed. Therefore, the relation represented by the expression (2) is not satisfied. The design example 2 is an example in which the position of the first light emitting layer E1 is deviated from the position meeting the interference condition so as to satisfy the expression (2). The design example 3 is modified from the design example 2 so that the position of the second light emitting layer E2 is deviated from the position meeting the interference condition so as to satisfy the expression (2).

In the design example 2. the light-outcoupling efficiency is improved relative to the design example 1, and the color difference (Δu'v') is also suppressed. In the design example 3, the light-outcoupling efficiency is more improved relative to the design example 2. However, in the design example 3 the color difference tends to slightly increase relative to the design example 2, but it is considered that the difference between the color differences of the design examples 2 and 3 is small and acceptable.

The design examples 4 and 5 are modified from the design example 3 so that the distance $D_2$ from the second light emitting layer E2 to the substrate 1 is changed. Change in the distance $D_2$ causes change in the distance $D_1$. Change in the light-outcoupling efficiency caused by change in the distance $D_2$ is small. However, it is confirmed that change in the distance $D_2$ causes change in the color difference. Therefore, to reduce the color difference, it is preferable to adjust the distance $D_2$.

From the results in TABLE 1, it is confirmed that the entire color difference can be suppressed by reducing the color difference when the angle relative to the frontal direction is in a range of 0° to 60° with regard to light entering the light diffusion layer 2. Further, it is confirmed that the color difference can be reduced based on the distance relation between the light transmissive electrode 3 and the light emitting layer E as described above. The value equal to or less than 0.1 is effective for the color difference Δu'v' (0-60°) checked by the hemispherical lens 30. Such design is applicable to the multi-unit structure including three or more units (three or more light emitting units). This angle of 60° can be considered as the angle ($\theta=\sin^{-1}(n_2/n_1)$) for the total reflection condition when light travels from a medium with a refractive index of $n_1$ to a medium with a refractive index of $n_2$.

In view of the above, as a result of generalization, it is necessary that the average refractive index $n_a$ of the light emitting layer E and the refractive index $n_b$ of the substrate 1 satisfy the relation of $n_a > n_b$. Under this requirement, with regard to light entering from the light emitting layer E to the light diffusion layer 2, the incident angle to the light diffusion layer 2 is represented by θ. In this regard, it is preferable that the absolute value of the color difference Δu'v' which is defined as a difference between chromaticity in u'v' coordinates of incident light satisfying the condition of the angle θ represented by the following expression (3) and chromaticity in u'v' coordinates of incident light in the frontal direction be equal to or less than 0.1. Due to such design, it is more possible to obtain light emission with the improved view angle property which does not cause color deviation depending on angles of view.

[FORMULA 17]

$$\theta = \sin^{-1}\left(\frac{n_b}{n_a}\right) \quad (3)$$

Note that, when there is a single light emitting layer E, the average refractive index of the light emitting layer E means a refractive index of the single light emitting layer E. When there is multiple light emitting layers E, the average refractive index of the light emitting layer E means an average of refractive indices of the multiple light emitting layers E. A refractive index may be an average weighted with the thickness of the layer.

In TABLE 1, the column of "Δu'v' 0-60° hemispherical lens" indicates the color differences at the angle θ satisfying the relation represented by the expression (3). When the values of this column are equal to or less than 0.1, it is confirmed that the color difference is also small in the element including the light diffusion layer 2. A smaller color difference is more preferable. For example, it is more preferable that an absolute value of a color difference be equal to or less than 0.09. Further, with regard to "Δu'v' 0-80° hemispherical lens", smaller values are more preferable, and it is more preferable that these values be equal to or less than 0.14. Smaller color differences are more preferable, and therefore the lower limit thereof is 0.

[Materials of Organic EL Element]

The following explanations are made to materials for making the organic EL element. The organic EL element can be made of appropriate materials normally used for producing the organic EL element.

The substrate 1 may be made of a substrate of glass. Such glass may be soda glass. Non-alkali glass may be used. However, soda glass is generally more inexpensive than non-alkali glass, and offers cost advantage. Further, when the soda glass is used, the light diffusion layer 2 serves as a foundation layer for the organic layer. Hence, it is possible to suppress effects of alkali diffusion on the light transmissive electrode 3 made of ITO or the like.

The light diffusion layer 2 may be a thin film prepared by applying a matrix containing scattering particles, for example. In this case, it is preferable that the refractive index of the matrix of the light diffusion layer 2 be higher as possible, and be equal to or more than the refractive indices of the light emitting layer E and the charge transport layer 5. To improve the light-outcoupling property, it is preferable that the material does not absorb light as possible. The matrix may be resin. Further, to increase the refractive index, inorganic material with a relatively high refractive index such as $TiO_2$ may be mixed with the matrix. Note that, when the matrix has protrusions due to aggregation of particles, short circuiting is likely to occur. Hence, it is preferable that treatment for preventing deterioration of quality such as coating treatment be done. Additionally, the scattering particles are not limited if they can scatter light together with the matrix. However, it is preferable that the scattering particles do not absorb light. The light diffusion layer 2 can be formed by applying material of the light diffusion layer 2 onto the surface of the substrate 1. As the method of application of material, a coating method such as spin coating, slit coating, bar coating, spray coating, and inkjetting can be used in accordance with the purpose of use and the size of the substrate. Preferable examples of the light diffusion layer 2 are described later.

An organic light emitting stack having a light emitting structure is formed on the light diffusion layer 2. The organic light emitting stack includes an anode, a cathode, and an organic EL layer between the anode and the cathode. In the present description, the organic EL layer is defined as a layer between the anode and the cathode. The organic EL layer may be constituted by a hole transport layer, a light emitting layer, an electron transport layer, and an electron injection layer, which are arranged in this order from the anode, for example. In the organic EL element, the light transmissive electrode 3 may serve as the anode, and the light reflective electrode 4 may serve as the cathode.

The stack structure of the organic EL layer is not limited to the aforementioned example. For example, the organic EL layer may have a single layer structure of a light emitting layer, a stack structure of a hole transport layer, a light emitting layer, and an electron transport layer, a stack structure of a hole transport layer and a light emitting layer, and a stack structure of a light emitting layer and an electron transport layer. Further, a hole injection layer may be provided between the anode and the hole transport layer. Further, the light emitting layer may have a single layer structure or a multilayer structure. For example, when desired emission color is white, the light emitting layer may be doped with three types of dopant pigments of red, green, and blue. Alternatively, the light emitting layer may have a stack structure of a blue hole transport light emitting layer, a green electron transport light emitting layer, and a red electron transport light emitting layer, or a stack structure of a blue electron transport light emitting layer, a green electron transport light emitting layer, and a red electron transport light emitting layer. Further, a multi-unit structure may be used. In the multi-unit structure, multiple light emitting units are stacked with light transmissive and conductive interlayers in-between, and each light emitting unit is defined as an organic EL layer having a function of emitting light in response to application of voltage between an anode and a cathode. The multi-unit structure means a structure in which multiple light emitting units which are stacked in the thickness direction and electrically connected in series with each other are positioned between one anode and one cathode.

The anode is an electrode for injecting holes. The anode may be preferably made of an electrode material with a large work function, such as metal, alloys, electrically conductive compounds, and mixtures thereof. Further, to avoid a situation where a difference between a work function of the material of the anode and the HOMO (Highest Occupied Molecular Orbital) level becomes excessively large, the work function of the material of the anode preferably is equal to or more than 4 eV and equal to or less than 6 eV. The electrode material of the anode may be selected from metal oxide (e.g., ITO, tin oxide. zinc oxide, and IZO), a metal compound (e.g., copper iodide), conductive polymer (e.g., PEDOT and polyaniline). conductive polymer doped with arbitrary acceptors, and conductive light transmissive material (e.g., carbon nanotube). In this regard, the anode may be a thin film formed on the surface of the light diffusion layer 2 provided on the substrate 1, by sputtering, vacuum deposition, or coating. Note that, a sheet resistance of the anode is preferably equal to or less than several hundred $\Omega/\square$, and more preferably is equal to or less than $100\Omega/\square$. Further, a thickness of the anode may be equal to or less than 500 nm, and may be preferably in a range of 10 nm to 200 nm. Light transmissivity tends to increase with a decrease in the thickness of the anode, but the sheet resistance tends to increase with a decrease in the thickness. When the size of the organic EL element is increased, a high voltage may be required, and luminance uniformity may become poor (caused by non-uniformity of a current density distribution resulting from a drop in voltage). To avoid this trade-off, generally it is effective to form, on the light transmissive anode, an auxiliary electrode (grid) which is made of metal. Preferably, the material is excellent in electric conductivity, and may be selected from metals such as Ag, Cu, Au, Al, Rh, Ru, Ni, Mo, Cr, and Pd, and an alloy of these metals such as MoAlMo, AlMo, and AgPdCu. In this case, to prevent such a metal grid from acting as light blocking member, the surface of the grid part may be more preferably subjected to insulating treatment so as to block a current flow from the grid part to the cathode. Further, to minimize the effects of absorption of diffused light by the grid, it is preferable that metal used for the grid be high reflectivity as possible.

When the anode is formed by use of ITO, a film of ITO may be preferably formed at a temperature equal to or more than 150° C. which causes crystallization of ITO. Alternatively, a film of ITO may preferably be formed at a low temperature and then subjected to annealing (equal to or more than 150° C.). Crystallization causes an increase in conductivity, and therefore the aforementioned trade-off condition may be eased. The structure becomes dense, and therefore effects of suppressing outgas (e.g., water vapor) which occurs when the light diffusion layer 2 is made of resin, from reaching the organic EL layer can be expected.

Examples of a material for making the hole injection layer include: a hole injection organic material and metal oxide; and an organic material and inorganic material used as material for acceptor; and a p-doped layer. The hole injection organic material is a material that has hole transport properties, a work function of 5.0 eV to 6.0 eV, and strong adherence to the anode, and is CuPc, starburst amine, or the like, for example. A hole injection metal oxide is, for example, a metal oxide that includes any of molybdenum, rhenium, tungsten, vanadium, zinc, indium, tin, gallium, titanium, and aluminum. Not only an oxide of a single metal, it may be a composite metal oxide that include any one of sets including a set of indium and tin, a set of indium and zinc, a set of aluminum and gallium, a set of gallium and zinc, and a set of titanium and niobium. The hole injection layers made of these materials may be formed by a dry process such as vapor deposition, a transfer method, or may be formed by a wet process such as spin coating, spray coating, dye coating, or gravure printing.

A material for making the hole transport layer can be selected from a group of compounds with hole transportability. Examples of the compounds with hole transportability include arylamine compounds (e.g., 4,4'-bis[N-(naphthyl)-N-phenyl-amino]biphenyl (α-NPD), N,N'-bis(3-methylphenyl)-(1,1'-biphenyl)-4,4'-diamine (TPD), 2-TNATA, 4,4',4"-tris(N-(3-methylphenyl)N-phenylamino)triphenylamine (MTDATA), 4,4'-N,N'-dicarbazolebiphenyl (CBP), spiro-NPD, spiro-TPD, spiro-TAD, and TNB), an amine compound that contains a carbazole group, and an amine compound that contains a fluorene derivative. However, an arbitrary hole transport material that is generally known is available.

The light emitting layer E may be made of appropriate material known as materials for the organic EL element. Examples of materials of the light emitting layer E include anthracene, naphthalene, pyrene, tetracene, coronene, perylene, phthaloperylene, naphthaloperylene, diphenylbutadiene, tetraphenylbutadiene, coumalin, oxadiazole, bisbenzoxazoline, bisstyryl, cyclopentadiene, quinoline-metal complex, tris(8-hydroxyquinolinate)aluminum complex, tris(4-methyl-8-quinolinate)aluminum complex, tris(5-phenyl-8-quinolinate)aluminum complex, aminoquinoline-metal complex, benzoquinoline-metal complex, tri-(p-terphenyl-4-yl)amine, 1-aryl-2,5-di(2-thienyl)pyrrole derivative, pyrane, quinacridone, rubrene, distyrylbenzene derivative, distyrylarylene derivative, distyrylamine derivative, various fluorescent pigments, the other materials containing one or more of the above materials, and the derivatives thereof, but are not limited to the aforementioned examples. Further, it is also preferable that light emitting materials selected from the above compounds be mixed. In addition to compounds causing fluorescence represented by the aforementioned compounds, materials providing light emission due to spin multiplet, such as phosphorescent material causing phosphorescence and compounds containing parts thereof in molecules may be used. Note that, the light emitting layer E of the above materials may be formed by a dry process such as a vapor deposition method and a transfer method, or by a wet process such as a spin coating method, a spray coating method, a dye coating method, and a gravure printing method.

The interlayer 6 may be made of material capable of providing charges to the corresponding light emitting unit. To allow light to emerge, the interlayer 6 is preferably light transmissive. For example, the interlayer 6 may be a metal thin film. The material of the interlayer 6 may be exemplified by silver and aluminum. Alternatively, the interlayer 6 may be made of organic material.

A material for the electron transport layer can be selected from a group of compounds with electron transportability. Examples of the compounds with an electron transportability include a metal complex that is known as an electron transportable material (e.g., $Alq_3$), and a heterocyclic compound (e.g., a phenanthroline derivative, a pyridine derivative, a tetrazine derivative, and an oxadiazole derivative). However, an arbitrary electron transport material that is generally known can be used.

A material for the electron injection layer is arbitrarily selected from the following examples. Examples of the material for the electron injection layer include: metal halides such as a metal fluoride (e.g., lithium fluoride and magnesium fluoride) and metal chloride (e.g., sodium chloride and magnesium chloride); and metal oxide; and metal nitride; and metal carbide; and metal oxynitride; and a carbon compound; and a silicon compound (e.g., $SiO_2$ and SiO). Examples of metal for the metal oxide, the metal nitride, the metal carbide, and the metal oxynitride include aluminum, cobalt, zirconium, titanium, vanadium, niobium, chromium. tantalum, tungsten, manganese, molybdenum, ruthenium, iron, nickel, copper, gallium, zinc, and silicon. More specific examples of the metal oxide, the metal nitride, the metal carbide, and the metal oxynitride include a compound to serve as insulators such as aluminum oxide, magnesium oxide, iron oxide, aluminum nitride, silicon nitride, silicon carbide, silicon oxynitride, and boron nitride. These materials can be formed into a thin film by vacuum vapor deposition, sputtering, or the like.

The cathode is an electrode for injecting electrons into the light emitting layer. The cathode may be preferably made of an electrode material with a small work function, such as metal, alloys, electrically conductive compounds, and mixtures thereof. Further, to avoid a situation where a difference between a work function of the material of the cathode and the LUMO (Lowest Unoccupied Molecular Orbital) level becomes excessively large, the work function of the material of the cathode preferably is equal to or more than 1.9 eV and equal to or less than 5 eV. The electrode material of the cathode may be selected from aluminum, silver, magnesium, and an alloy of one or more of these metals and other metal (e.g., an amalgam of magnesium and silver, an amalgam of magnesium and indium, and an alloy of aluminum and lithium). Alternatively, the electrode material of the cathode may be selected from conductive material of metal, metal oxide, and a mixture of one or more of these and other metal. For example, the cathode may be a stack film of an ultra-thin film of aluminum oxide (a thin film of a thickness equal to or less than 1 nm which allows flow of electrons due to tunnel injection) and a thin film of aluminum.

In the organic EL element, the light emitting stack is preferably hermetically enclosed by enclosing material. The organic EL layer is weak in water. Therefore, to avoid contact of the organic EL layer and air, the organic EL layer side of the substrate 1 is enclosed by use of a glass cap inside a dew-point controlled glove box (e.g., a dew point is kept equal to or less than −70° C.). In this regard, when desiccant or the like material is included inside the enclosure, preservation lifetime can be more prolonged.

The light-outcoupling layer 7 may be provided to the opposite side of the substrate 1 from the light diffusion layer 2. By doing so, it is possible to suppress total reflection loss at an interface between the substrate and the atmosphere. The light-outcoupling layer 7 may be a diffusion film, a prism sheet, a micro lens sheet, or the like which is to be attached with adhesive. Alternatively, the light-outcoupling layer 7 may be an optical diffusion structure (e.g., fine recesses and protrusions) obtained by direct processing such as blasting and etching on the substrate 1.

[Light Diffusion Layer]

In the organic EL element, the light diffusion layer 2 is provided to suppress total reflection at an interface between the organic layer and the substrate, and thereby an amount of light emerging outside can be increased. Therefore, by optimizing the light diffusion layer 2, the light-outcoupling efficiency can be more improved. The light diffusion layer 2 is made of transparent material.

Hereinafter, preferable examples of the light diffusion layer 2 are described.

The light diffusion layer 2 preferably includes a first transparent material layer 21 and a second transparent material layer 22 which are arranged in this order from the substrate 1. In this case, it is possible to easily form an uneven structure 20 at an interface between these two layers. Preferably, the second transparent material layer 22 is higher in a refractive index than the substrate 1. In this case, a difference in a refractive index is reduced, and therefore the light-outcoupling efficiency can be improved more. It is preferable that the uneven structure 20 be formed at the interface between the first transparent material layer 21 and the second transparent material layer 22. When the light diffusion layer 2 with multiple layers having the uneven structure 20 at its interface is used, light is diffused by the uneven structure 20, and therefore the light-outcoupling efficiency can be more improved.

Further, when the light diffusion layer 2 is constituted by the two transparent material layers 21 and 22, the second transparent material layer 22 functions as a covering layer, and therefore provides a flat surface above the uneven structure 20. Hence, it is possible to form the light emitting stack stably. Consequently, disconnection and short circuiting caused by recesses and protrusions can be suppressed. Further, in a case where the covering layer is provided, even when the uneven structure which is relatively tall (deep) is provided, it is possible to form the light emitting stack finely. As described above, the second transparent material layer 22 can serve as a flattening layer, and therefore it is preferable to provide the second transparent material layer 22. Further, the transparent material layers 21 and 22 are transparent and thus light transmissive, and as a result light can emerge effectively.

With regard to the second transparent material layer 22, a refractive index $n_H$ for a visible wavelength range is preferably equal to or more than 1.75. In this case, a difference in a refractive index is more reduced, and therefore total reflection loss can be suppressed in a wide range of angles. Thus, an amount of emerging light can be increased. For example, the refractive index $n_b$ of the substrate 1 is in a range of 1.3 to 1.55. It is also preferable that the refractive index $n_H$ of the second transparent material layer 22 be equal to or more than the refractive index (the average refractive index) of the organic EL layer. For example, the average refractive index of the organic EL layer is in a range of 1.6 to 1.9. This average refractive index may be for the visible wavelength range. There is no upper limit for the refractive index $n_H$, but the upper limit may be 2.2, and in particular 2.0, for example. Further, it is preferable to decrease a difference in a refractive index between the second transparent material layer 22 and the light transmissive electrode 3 which is an adjacent layer to the second transparent material layer 22. For example, such a difference in a refractive index may be equal to or less than 1.0.

Figure 16:
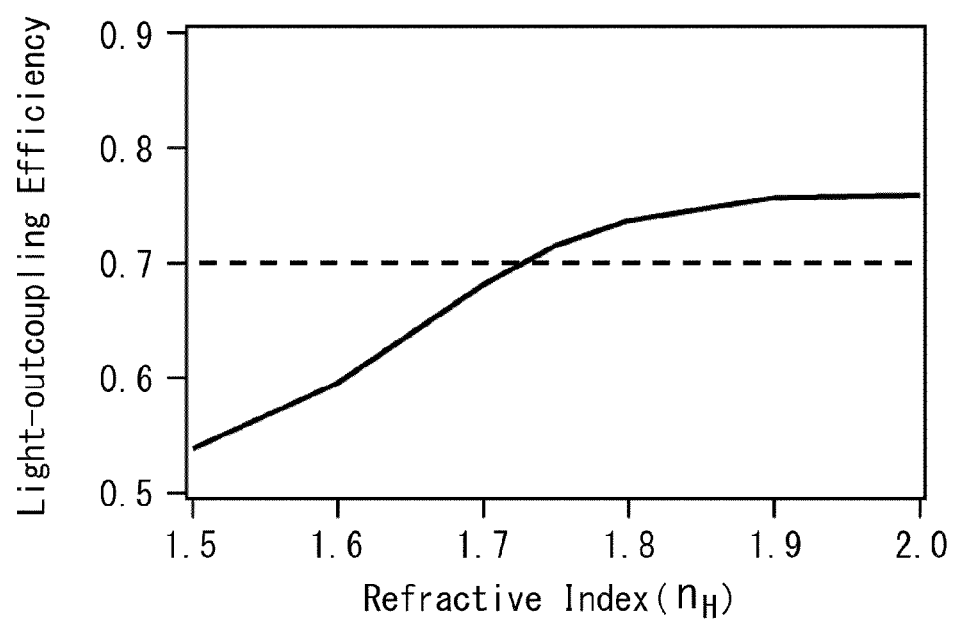
FIG. 16 is a graph illustrating a relation between the refractive index and the light-outcoupling efficiency of the second transparent material layer.

FIG. 16 shows a graph illustrating change in the light-outcoupling efficiency versus change in the refractive index $n_H$ of the second transparent material layer 22 while the refractive index of the first transparent material layer 21 is fixed to 1.45. The organic EL element has the layer structure of the fifth embodiment. It is understood from this graph that the refractive index $n_H$ is preferably equal to or more than 1.75.

With regard to the first transparent material layer 21, a refractive index $n_L$ for a visible wavelength range is preferably in a range of 1.3 to 1.5. In this case, an amount of emerging light can be increased. A difference between the refractive indices of the first transparent material layer 21 and the substrate 1 is preferably smaller. For example, this difference between the refractive indices may be equal to or less than 1.0. Further, it is also preferable that the refractive index $n_L$ of the first transparent material layer 21 be lower than the refractive index of the substrate 1. In this case, it is possible to suppress total reflection at an interface between the first transparent material layer 21 and the substrate 1. Note that, when the light diffusion layer 2 is provided, light is allowed to emerge due to diffusion of light. Therefore, the first transparent material layer 21 may be higher in a refractive index than the substrate 1.

Figure 17:
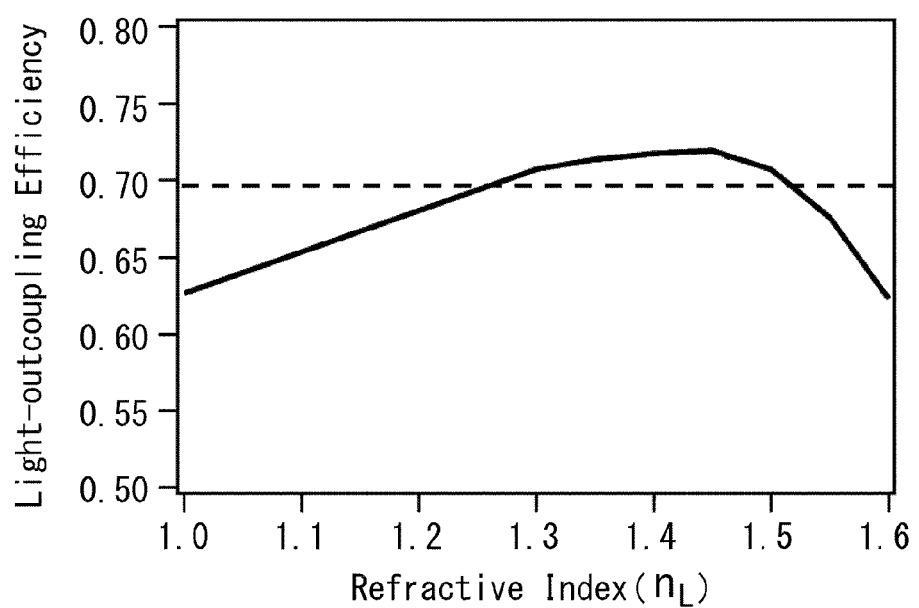
FIG. 17 is a graph illustrating a relation between the refractive index and the light-outcoupling efficiency of the first transparent material layer.

FIG. 17 shows a graph illustrating change in the light-outcoupling efficiency versus change in the refractive index $n_L$ of the first transparent material layer 21 while the refractive index $n_H$ of the second transparent material layer 22 is fixed to 1.75. It is understood from this graph that the refractive index $n_L$ of the first transparent material layer 21 is preferably in a range of 1.3 to 1.5.

The substrate 1 and the first transparent material layer 21 preferably have a lower refractive index (its lower limit is 1 which is equal to the atmosphere). As the refractive index becomes close to 1, total reflection at an interface between the substrate 1 and the atmosphere is more unlikely to occur. Therefore, even when the light-outcoupling layer 7 is not provided, light is allowed to emerge. Hence, the structure can be more simplified. The first transparent material layer 21 preferably has higher light transmissivity. For example, the transmissivity of the first transparent material layer 21 may allow transmission of 80% of visible light, and preferably may allow transmission of 90% of visible light.

In the light diffusion layer 2, for example, the first transparent material layer 21 may serve as a layer with a relatively low refractive index, and the second transparent material layer 22 may serve as a layer with a relatively high refractive index. It is more preferably that the refractive index $n_L$ for the visible wavelength range of the first transparent material layer 21 be in a range of 1.3 to 1.5 and the refractive index $n_H$ for the visible wavelength range of the second transparent material layer 22 is preferably equal to or more than 1.75.

The light diffusion layers 2 (the first transparent material layer 21 and the second transparent material layer 22) are preferably made of resin. In this case, the refractive index can be adjusted easily, and it is possible to facilitate formation of protrusions and recesses and flattening of protrusions and recesses. When a layer is made of resin material, the layer can have a relatively high refractive index. Further, such a layer can be formed by application of resin, and part of the resin is allowed to intrude into recesses, and thus it is possible to easily form a layer with a flat surface.

The first transparent material layer 21 may be made of organic resin such as acrylic resin and epoxy resin. Additionally, additive for curing the resin (e.g., curing agent, curing accelerator, and curing initiator) may be added to the resin. Further, an extinction coefficient k of the material of the first transparent material layer 21 is preferably small as possible, and is more preferably equal to zero (or a value which is too small to measure) ideally. Therefore, preferably, the extinction coefficient k of the first transparent material layer 21 is equal to zero with regard to the entire visible wavelength range. However, the allowable range of the extinction coefficient may be set in accordance with a thickness of a layer made of this material. Note that, the material other than the resin may include inorganic material. For example, the first transparent material layer 21 may be made of spin-on glass.

The second transparent material layer 22 may be made of resin into which high refractive nanoparticles such as $TiO_2$ are dispersed. The resin may be organic resin such as acrylic resin and epoxy resin. Additionally, additive for curing the resin (e.g., curing agent, curing accelerator, and curing initiator) may be added to the resin. Further, an extinction coefficient k of the material of the second transparent material layer 22 is preferably small as possible, and is more preferably equal to zero (or a value which is too small to measure) ideally. Note that, the material other than the resin may include an inorganic film made of SiN and a film of inorganic oxide (e.g., $SiO_2$).

The surface provided by the second transparent material layer 22 (surface of the second transparent material layer 22 facing the light transmissive electrode 3) is preferably flat. In this case, short circuit and failure in stacking caused by recesses and protrusions can be suppressed, and it is possible to provide the light emitting stack successfully.

Note that, if the light emitting property or the like is sufficient even when the second transparent material layer 22 is not provided, the second transparent material layer 22 may be omitted. When the second transparent material layer 22 is not provided, it is possible to reduce the number of layers, and therefore it is possible to more easily produce the element. For example, if the first transparent material layer 21 has level differences between protrusions and recesses thereof to an extent that the level differences do not affect films to be formed above the first transparent material layer 21, the second transparent material layer 22 may be omitted. Even when the second transparent material layer 22 is not provided, the light-outcoupling efficiency can be improved by the light diffusion layer 2 constituted by the uneven structure 20. However, to suppress short circuiting and disconnection, it is preferable to form the second transparent material layer 22 as described above.

The first transparent material layer 21 and the second transparent material layer 22 can be provided to on the surface of the substrate 1 by applying materials therefor. The applying method of this material may be appropriate coating such as spin coating, slit coating, bar coating, spray coating, and inkjetting, which may be selected in accordance with usage or a substrate size.

The uneven structure 20 between the first transparent material layer 21 and the second transparent material layer 22 can be formed in an appropriate manner. For example, particles such as beads are mixed in the transparent material, and thereby protrusions and recesses can be given by shapes of the particles. Further, it is preferable that protrusions and recesses of the uneven structure 20 be formed by imprint lithography. By using the imprint lithography, it is possible to form fine protrusions and recesses efficiently and precisely. Further, in the case of forming protrusions and recesses by allocating the protruded part or the recessed part to each uneven section as described later, it is possible to form fine protrusions and recesses highly precisely by use of the imprint lithography. In a case of forming protrusions and recesses by the imprint lithography, one uneven section may be formed by one dot of printing. It is preferable to use the imprinting lithography allowing formation of fine structures, and for example, so-called nanoimprint lithography is preferable.

The imprint lithography is divided into major categories which are UV imprint lithography and thermal imprint lithography, and either the UV imprint lithography or the thermal imprint lithography is available. In the implemented embodiment, for example, the UV imprint lithography is used. By the UV imprint lithography, it is possible to easily print (transfer) recesses and protrusions to form the uneven structure. In the UV imprint lithography, for example, a film mold which is formed by impressing of a Ni master mold patterned to have a rectangular (pillar) structure of 2 μm in period and 1 μm in height is used. UV curable imprint transparent resin is applied onto a substrate, and the mold is pressed against a surface of a resin layer on this substrate. Thereafter, to cure the resin, the resin is irradiated with UV light (e.g., i-line with wavelength $\lambda=365$ nm) which passes through the substrate or the film mold. After the resin is cured, the mold is removed. In this process, it is preferable that the mold be preliminarily subjected to treatment for facilitating removal (e.g., fluorine coating treatment). Thus, it is possible to easily remove the mold from the substrate. Therefore, the recesses and protrusions structure on the mold can be transferred to the substrate. Note that, this mold includes recesses and protrusions corresponding to the shape of the uneven structure 20. When the recesses and protrusions structure of the mold is transferred, the desired recesses and protrusions structure is provided to the surface of the transparent material layer. For example, when the mold in which the recessed parts are randomly allocated to desired sections is used, it is possible to obtain the uneven structure 20 in which the protruded parts are randomly allocated.

Figure 18A:
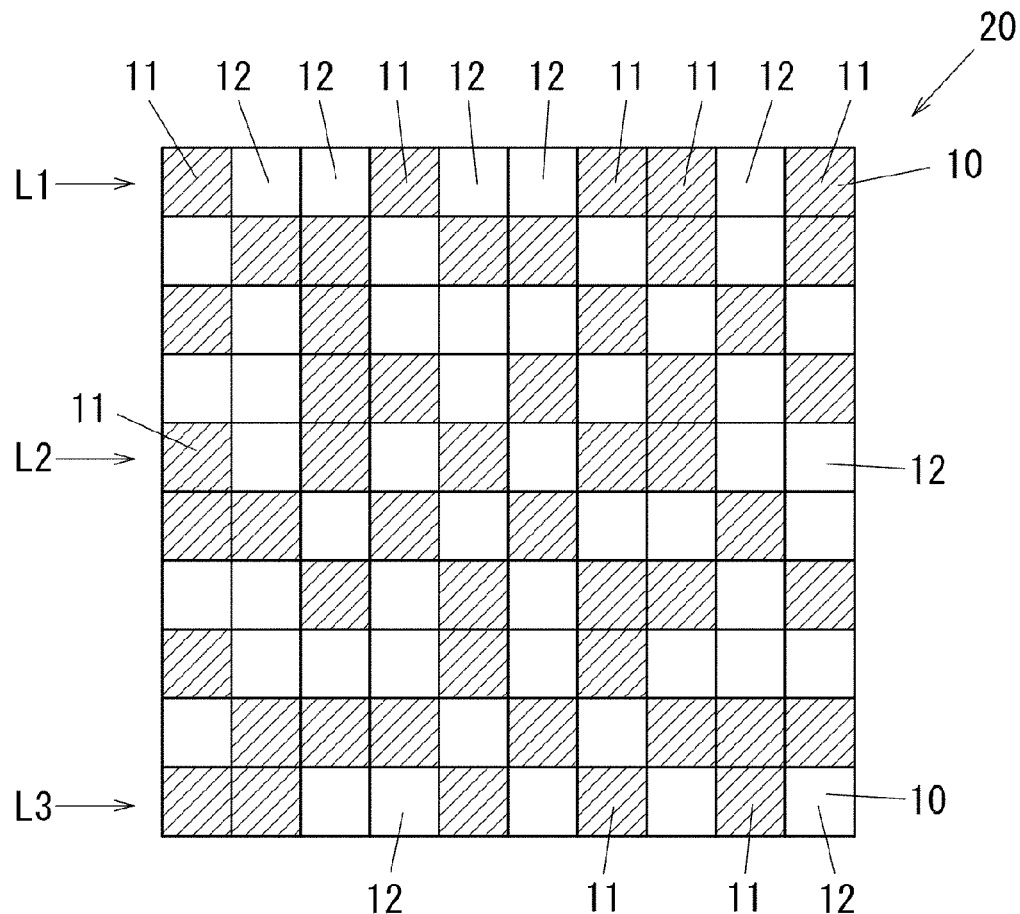
FIG. 18A is an explanatory view illustrating an example of the uneven structure and a plan thereof.
Figure 18B:
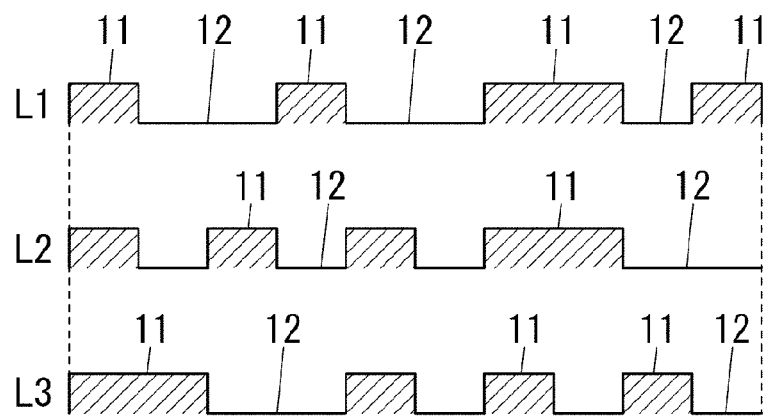
FIG. 18B is an explanatory view illustrating the example of the uneven structure and a section thereof.

FIG. 18A and FIG. 18B show an example of the uneven structure 20 of the light diffusion layer 2. The uneven structure 20 in the light diffusion layer 2 is preferably defined by an aggregate of protruded parts 11 or recessed parts 12 arranged in plane. In this case, the light diffusion effects can be improved without causing angle dependency, and therefore it is possible to increase an amount of emerging light. The plane where the protruded parts 11 or the recessed parts 12 are arranged may be parallel with the surface of the substrate 1. FIG. 18A and FIG. 18B show that the protruded parts 11 are arranged in plane. In a different viewpoint, FIG. 18A and FIG. 18B show that the recessed parts 12 are arranged in plane. The uneven structure 20 may be defined by an aggregate of protruded parts 11 and recessed parts 12 arranged in plane.

With regard to the uneven structure 20 in the light diffusion layer 2, as shown in FIG. 18A and FIG. 18B, it is preferable that the aggregate of the protruded parts 11 or the recessed parts 12 has a plane divided into an array of sections 10, and the protruded parts 11 or the recessed parts 12 are arranged by being individually allocated to sections 10 randomly selected from the array. In this case, the light diffusion effects can be improved without causing angle dependency, and therefore it is possible to increase an amount of emerging light. In one example of the sections 10 of the array, each section has a quadrangular shape. The quadrangular shape is preferably a square shape. In this case, the array is a matrix array (square array) in which multiple quadrangles are arranged in rows and columns with no space in-between. In another example of the sections 10 of the array, each section has a hexagonal shape. The hexagonal shape is preferably a regular hexagonal shape. In this case, the array is a honeycomb array (hexagonal grid) in which multiple hexagons are arranged with no space in-between. Alternatively, the array may be a triangular array in which multiple triangles are arranged with no space in-between. However. the square array and the hexagonal array allow easy control of the protrusions and the recesses.

The uneven structure 20 shown in FIG. 18A and FIG. 18B includes a plane divided into a matrix of sections (the array of sections 10) to be protruded or recessed, and multiple protruded parts 11 have almost same heights which are individually allocated to desired sections of the matrix so that the multiple protruded parts 11 are arranged in the plane. Additionally, in the uneven structure 20, with regard to an arbitrary region of the plane, a ratio of a total area of one or some of the multiple protruded parts 11 in the arbitrary region to an area of the arbitrary region is almost constant. By providing such an uneven structure 20, the light-outcoupling efficiency can be improved efficiently.

FIG. 18A and FIG. 18B show an example of the uneven structure 20. FIG. 18A shows a view in a direction perpendicular to the surface of the substrate 1, and FIG. 18B shows a view in a direction parallel to the surface of the substrate 1. In FIG. 18A, the sections where the protruded parts 11 are provided are illustrated with hatching. Structures indicated by lines L1, L2, and L3 in FIG. 18A correspond to structures indicated by lines L1, L2, and L3 in FIG. 18B, respectively.

As shown in FIG. 18A, the uneven structure 20 is constituted by arrangement of the protruded parts 11 allocated to desired uneven sections of a matrix of uneven sections which are multiple squares (rows and columns) arranged in length and width directions. The uneven sections have the same area. Either one protruded part 11 or one recessed part 12 is allocated to one section (one uneven section) to be recessed or protruded. The protruded parts 11 may be allocated regularly or randomly. In the implemented embodiment of FIG. 18A and FIG. 18B, the protruded parts 11 are allocated randomly. As shown in FIG. 18B, in the section to which the protruded part 11 is allocated, the protruded part 11 is formed by making part of the uneven structure 20 protrude toward the light transmissive electrode 3. Further, the multiple protruded parts 11 have almost the same heights. In this regard, for example, the phrase "the protruded parts 11 have almost same heights" means that differences between the heights of the multiple protruded parts 11 and an average of the heights of the multiple protruded parts 11 are within a range of ±10% of the average, and preferably are within a range of ±5% of the average.

In FIG. 18B, a section of the protruded part 11 has a rectangular shape, but may have an appropriate shape such as a corrugated shape, an inverted-triangle shape, a trapezoidal shape, a semicircular shape, semi-ellipse shape, and a sinusoidal shape. When two protruded parts 11 are adjacent to each other, these protruded parts 11 are connected integrally to form a larger protruded part. When two recessed parts 12 are adjacent to each other, these recessed parts 12 are connected integrally to form a larger recessed part. The connection number of protruded parts 11 and the connection number of recessed parts 12 are not limited particularly. However, as the connection numbers increase, the uneven structure 11 tends to not have fine structures. For example, the connection numbers may be appropriately set to be equal to or less than 100, 20, or 10. Note that, it is possible to introduce a design rule defining that when two or three or more regions corresponding to one of the recessed part 12 and the protruded part 11 are continuous, a region next to such continuous regions is set to correspond to the other of the recessed part 12 and the protruded part 11 (when the specific region is recessed, the next region is protruded, and when the specific region is protruded, the next region is recessed). When this rule is used, the light diffusion effect is improved, and therefore it is expected that the efficiency and the color difference can be improved.

The uneven structure 20 is formed so that with regard to an arbitrary region of the plane, a ratio of a total area of one or some of the multiple protruded parts 11 in the arbitrary region to an area of the arbitrary region is almost constant. For example, FIG. 18A shows a total number of one hundred of uneven sections arranged in a 10 by 10 matrix manner. A region constituted by these one hundred sections is used as a unit region. In the plane of the uneven structure 20, the area ratios of protruded parts 11 are same with regard to unit regions. For example, as shown in FIG. 18A, when the fifty protruded parts 11 are provided to a unit region, other about fifty (e.g., forty-five to fifty-five or forty-eight to fifty-two) protruded parts 11 may be provided to another region which is same in the number of sections to be recessed and protruded and the area as the unit region. The unit region is not limited to a region corresponding to one hundred sections, but may be a region having a size corresponding to an appropriate number of sections. For example, the number of sections may be 1000, 10000, 1000000, or more. The area ratio of protruded parts 11 slightly varies depending on how to define the region. However, in this example, the area ratios are set to be almost same. For example, a difference between each of upper and lower limits of the area ratio and an average of the area ratio is preferably equal to or less than 10% of the average, and more preferably equal to or less than 5% of the average, and more preferably equal to or less than 3% of the average, and more preferably equal to or less than 1% of the average. As the area ratio becomes more equal to each other, the light-outcoupling efficiency can be more uniformed in the plane and more improved. The area ratio of protruded parts 11 in the unit region is not limited particularly, but may be in a range of 20% to 80%, and preferably in a range of 30% to 70%, and more preferably in a range of 40% to 60%.

In a preferable embodiment, the protruded parts 11 and the recessed parts 12 are arranged in a random allocation manner in each unit region. In this embodiment, it is possible to allow a large amount of light to emerge without causing angle dependency. Therefore, it is possible to realize the structure suitable for the white organic EL element.

The uneven structure 20 preferably includes fine recesses and protrusions. Thus, the light-outcoupling efficiency can be more improved. For example, when each section to be recessed or protruded is formed as a square with a side in a range of 0.1 μm to 100 μm, it is possible to form a fine uneven structure. A side of a square defining one section to be recessed or protruded may be in a range of 0.4 μm to 10 μm. For example, when the side of the square is 1 μm, it is possible to form the fine uneven structure 20 precisely. Further, the unit region may be a region in a shape of 1 mm square or 10 mm square. Note that, in the uneven structure 20 material forming the uneven structure 20 may not be present in the recessed part 12. In this case. the lower layer (the first transparent material layer 21) of the uneven structure 20 may be a layer in which multiple fine protruded parts 11 are distributed on a whole surface in an island manner. For example, the second transparent material layer 22 may be directly in contact with the substrate 1 at the recessed part(s) 12.

The heights of the protruded parts 11 are not limited particularly, but may be in a range of 0.1 μm to 100 μm, for example. Thus, it is possible to produce the uneven structure 20 with the high light-outcoupling efficiency. For example, when the heights of the protruded parts 11 are set to be in a range of 1 μm to 10 μm, it is possible to form fine recesses and protrusions precisely.

The multiple protruded parts 11 constituting the uneven structure 20 may have the same shape. In FIG. 18A, the protruded part 11 is provided to cover the entire uneven section, and thus the protruded part 11 has a quadrangle (rectangular or square) shape in a plan view. The planar shape of the protruded part 11 is not limited to this example, but may be another shape such as a circular shape and a polygonal shape (e.g., a triangular shape, a pentagonal shape, a hexagonal shape, and an octagon shape). In these cases, a three-dimensional shape of the protruded part 11 may be an appropriate shape such as a cylindrical shape, a prism shape, (e.g., a triangular prism shape and a rectangular prism shape), a pyramid shape (e.g., a triangle-based pyramid, and a rectangle-based pyramid), a hemispherical shape, a semi-ellipsoidal shape, a protrusion with a sinusoidal section.

In a preferable embodiment, the uneven structure 20 is formed as a diffraction optical structure. In this regard, it is preferable that the protruded parts 11 be provided to show some degree of regularity to give a diffraction optical structure. In the diffraction optical structure, it is preferable that the protruded parts 11 be formed periodically. When the light diffusion layer 2 has the diffraction optical structure, the light-outcoupling efficiency can be improved. Further, in the implemented embodiment, when the light diffusion layer 2 has a diffraction structure, the light-outcoupling layer 7 (e.g., an optical film) formed on the opposite surface of the substrate 1 from the light diffusion layer 2 can scatter light, and therefore effects of the view angle dependency can be reduced. In the diffraction optical structure, it is preferable that an interval P of two-dimensional uneven structure 20 (average interval of the uneven structure 20 in a case where the uneven structure 20 is not a periodic structure) be appropriately set to be in a range of ¼λ to 100λ wherein λ is a wavelength in a medium (which is obtained by dividing a wavelength in vacuum by a refractive index of a medium). This range may be used in a case where a wavelength of light emitted from the light emitting layer E is in a range of 300 nm to 800 nm. In this case, a geometrical optics effect (enlargement of an area of the surface which light strikes at an angle less than the total reflection angle) causes an increase in the light-outcoupling efficiency. Or, light striking the surface at an angle not less than the total reflection angle can be emitted outside as diffraction light. Consequently, the light-outcoupling efficiency is improved. When the interval P is especially small (e.g., the range of λ/4 to λ), an effective refractive index at a portion around the uneven structure is gradually decreased with an increase in distance between the portion and the substrate. This is equivalent to interposing, between the substrate and a layer of covering protrusions and recesses or the anode, a thin layer having a refractive index between the refractive index of the medium of the uneven structure and the refractive index of the covering layer or the anode. Consequently, it is possible to suppress the Fresnel reflection. In brief, with selecting the interval P from the range of λ/4 to 100λ, it is possible to suppress the reflection (total reflection and/or Fresnel reflection), and therefore improve the light-outcoupling efficiency. In the above range, when the interval P is smaller than λ, only the effects of suppressing Fresnel loss can be expected, and therefore the light-outcoupling efficiency is likely to decrease. In contrast, when the interval P exceeds 20λ, it is required to increase heights of recesses and protrusions accordingly (to ensure a phase difference), and therefore flattening by the covering layer (the second transparent material layer 22 is likely to becomes difficult. It is considered to use the covering layer having a very large thickness (e.g., 10 μm or more). However, in this case, there are bad effects such as a decrease in transmissivity, an increase in material cost, and an increase in outgas in a case of resin material. Therefore. to thicken the covering layer may be disadvantageous. In view of this, it is preferable to set the interval P to be in a range of λ to 20λ, for example.

The uneven structure 20 may be a boundary diffraction structure. The boundary diffraction structure may be formed by arranging the protrusion parts 11 randomly. Alternatively, the boundary diffraction structure may be a structure in which diffraction structures formed within very small regions of a plane are arranged in the plane. This structure may be interpreted as a structure in which multiple independent diffraction structures are arranged in plane. In the boundary diffraction structure, diffraction caused by the fine diffraction structures allows light to emerge, and however the diffraction effect of the whole surface is prevented from being excessive, and therefore the angle dependency of light can be lowered. Therefore, the angle dependency can be suppressed and nevertheless the light-outcoupling efficiency can be improved. Further, the uneven structure 20 may have a lens array structure.

In case where the protruded parts 11 and the recessed parts 12 are provided randomly as shown in FIG. 18A and FIG. 18B, if the number of continuous protruded parts 11 or recessed parts 12 excessively increases, the light-outcoupling efficiency is unlikely to be improved sufficiently. In view of this, a more preferable example of the uneven structure 20 is described hereinafter.

[Random Control on Uneven Structure]

Preferably, randomness in presence of protrusions and recesses of the uneven structure 20 is controlled. In this regard, the shape of the uneven structure 20 is defined as follows. A structure in which protrusions and recesses are arranged perfectly randomly is defined as a perfect random structure. A structure in which protrusions and recesses are arranged randomly under a predetermined rule is defined as a controlled random structure. A structure in which protrusions and recesses are arranged not randomly but regularly to show predetermined periodicity is defined as a periodic structure. Further, one of the sections 10 of the array is considered to be a block, and a size of one block is defined as w. When the block is a quadrangle, the size of the block means a side of the quadrangle. When the block is a hexagon, the size of the block means a diameter of a circle inscribed in the hexagon. With regard to large protruded parts each defined by continuous protruded parts 11, when there are a first large protruded part and a second large protruded part which is next to but is spaced from the first large protruded part, a distance between the same sides of the first and second large protruded parts is defined as an average interval. In summary, the average interval is equal to an average pitch.

In control for the controlled random structure, it is preferable to set a rule defining that the number of same blocks (corresponding to one of the protruded part 11 and the recessed part 12) arranged continuously must not be greater than a predetermined number. In other words, it is preferable that the protruded parts 11 are arranged so that the number of protruded parts 11 arranged by being individually allocated to continuous sections 10 of the array in a same direction is not greater than a predetermined number, and the recessed parts 12 are arranged so that the number of recessed parts 12 arranged by being individually allocated to continuous sections 10 of the array in a same direction is equal to or less than a predetermined number. Consequently, the light-outcoupling efficiency can be more improved. Further, the angle dependency of emission color can be reduced. The predetermined number defining the maximum number of the protruded parts 11 or the recessed parts 12 which are arranged continuously is preferably equal to or less than 10, and is more preferably equal to or less than 8, and is more preferably equal to or less than 5, and is more preferably equal to or less than 4.

Figure 19A:
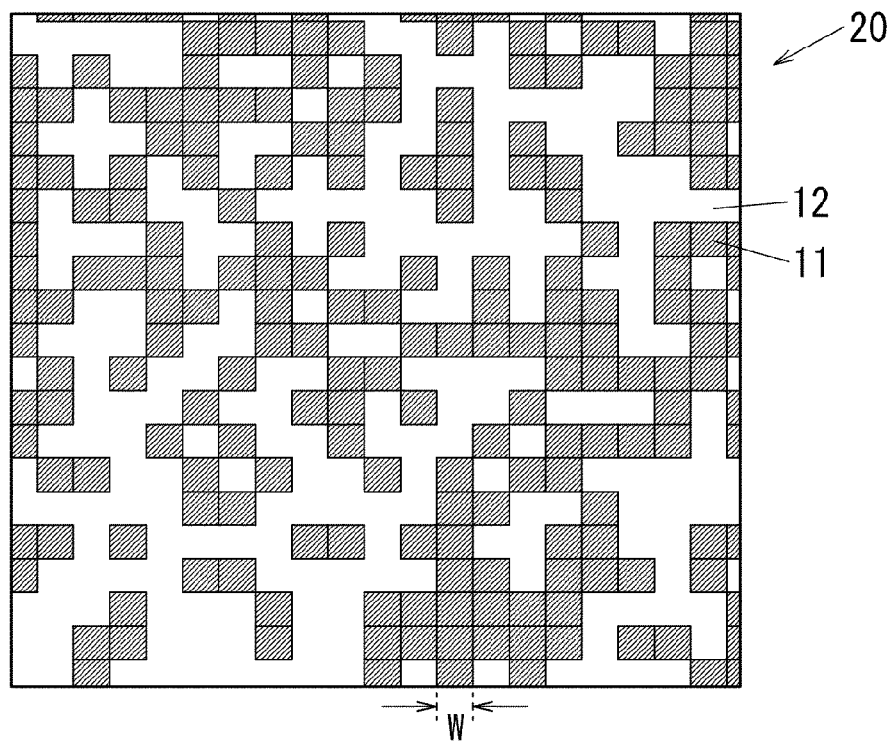
FIG. 19A is an explanatory view illustrating another example of the uneven structure and a plan thereof.
Figure 19B:
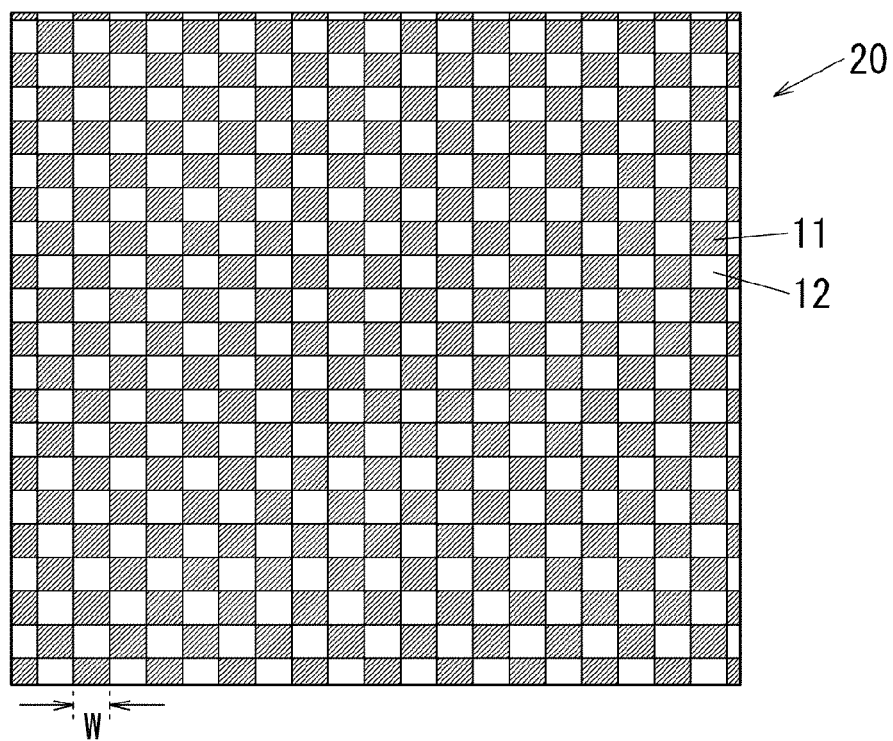
FIG. 19B is an explanatory view illustrating another example of the uneven structure and a plan thereof.

The principle of the uneven structure 20 is described with reference to FIG. 19A and FIG. 19B. FIG. 19A shows the uneven structure 20 corresponding to the perfect random structure, and FIG. 19B shows the uneven structure 20 corresponding to the periodic structure. Hatched parts denote the protruded parts 11, and white parts denote the recessed parts 12. This is also applied to the following explanatory views of the uneven structure 20.

When the blocks with a certain size w are arranged periodically with regularity as shown in FIG. 19B, the average interval is 2w. In summary, the protruded parts 11 and the recessed parts 12 are arranged alternately, and therefore the protruded parts 11 are arranged at the average interval corresponding to the sizes of two blocks. Note that, in the example of FIG. 19B, the uneven structure 20 has a checker pattern.

When the blocks with a certain size w are arranged perfectly randomly as shown in FIG. 19A, the average interval is 4w.

Figure 20A:
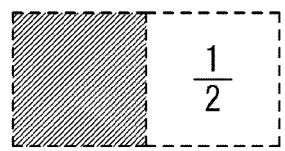
FIG. 20A is an explanatory view illustrating arrangement of blocks (sections) of the uneven structure.
Figure 20B:
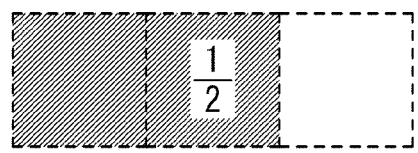
FIG. 20B is an explanatory view illustrating other arrangement of blocks (sections) of the uneven structure.
Figure 20C:
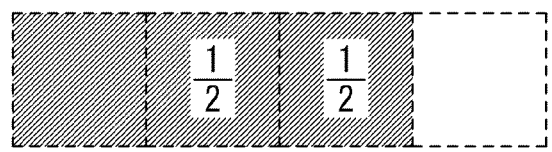
FIG. 20C is an explanatory view illustrating other arrangement of blocks (sections) of the uneven structure.

How to calculate the average interval in the perfect random structure is described with reference to FIG. 20A, FIG. 20B and FIG. 20C. In random arrangement, a probability that the same blocks are arranged continuously is taken into account. As shown in FIG. 20A, first, a probability that the block (the protruded part 11) with a width w exists is 1/2. As shown in FIG. 20B, a probability that the two same blocks are arranged consecutively is (1/2)^2. As shown in FIG. 20C, a probability that the three same blocks are arranged consecutively is (1/2)^3. The "^n" denotes the n-th power. In view of a probability that the four or more same blocks are arranged consecutively, the relation defined by the following expression (15) is derived.

[FORMULA 18]

$$w_{exp} = w \cdot \left(\frac{1}{2}\right)^1 + 2w \cdot \left(\frac{1}{2}\right)^2 + 3w \cdot \left(\frac{1}{2}\right)^3 + \ldots = \sum_{n}^{\infty} nw \cdot \left(\frac{1}{2}\right)^{n-1} = 2w \quad (15)$$

In the above expression, $w_{exp}$ denotes an expected value of the width of the region in which the same blocks are arranged consecutively.

In the above method, there are two types of blocks which are the protruded part 11 and the recessed part 12. Therefore, the average interval is determined by the following expression (16).

[FORMULA 19]

$$p_{exp} = 2w_{exp} = 4w \quad (16)$$

In the above expression, $p_{exp}$ denotes an expected value of the average interval.

Therefore, when the blocks are arranged completely randomly, the average interval is equal to 4w.

Also in the case of the hexagonal grid, as with the above, it is possible to calculate that the average interval P is equal to 4w, based on probabilistic approach.

Similarly, in the structure with controlled randomness (controlled random structure), the average interval can be calculated.

Figure 21A:
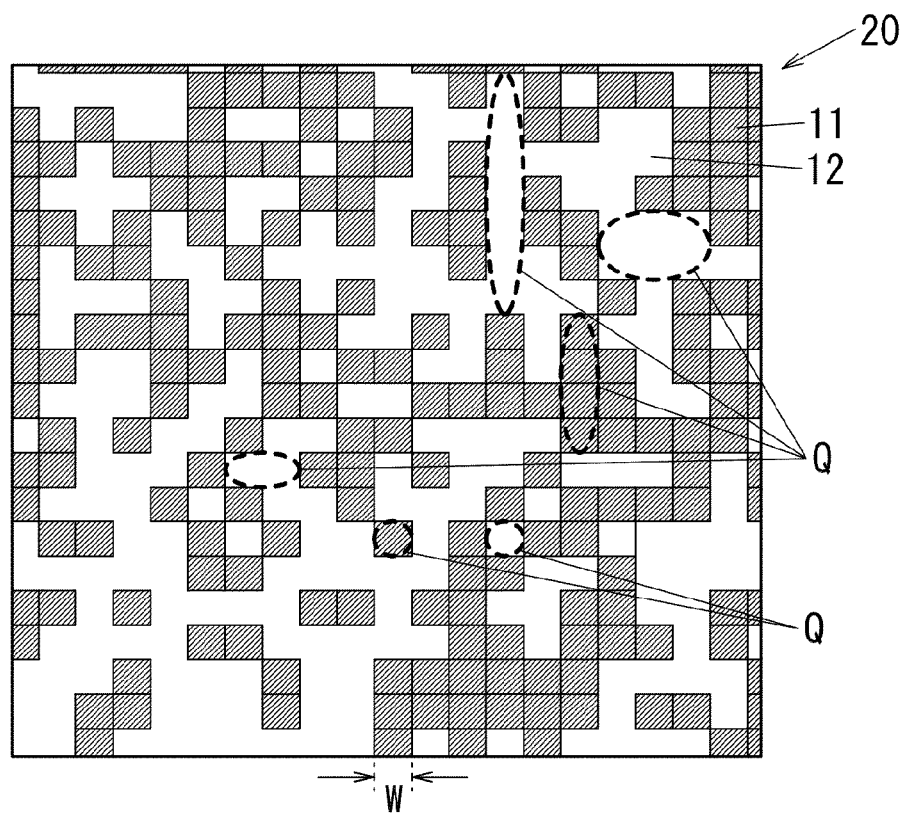
FIG. 21A is a plan illustrating one example of the uneven structure.
Figure 21B:
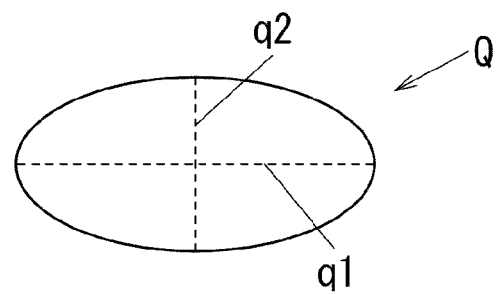
FIG. 21B is an explanatory view illustrating an ellipse used for calculating an average pitch of the uneven structure.

Another method of calculating the average interval of the complete random structure is described with reference to FIG. 21A and FIG. 21B. The width of the grid is denoted by "w". In FIG. 21A and FIG. 21B, the average interval can be calculated based on the structural pattern.

As shown in FIG. 21A, an ellipse Q can be drawn so as to be inscribed in a shape defined by a boundary of a region in which the same blocks (the protruded parts 11 or the recessed parts 12) are continuous. When the ellipse Q to be drawn is a circle, an inscribed circle is drawn. As shown in FIG. 21B, the average interval is calculated from a length q1 of a major axis and a length q2 of a minor axis of the ellipse Q. In the case of the inscribed circle, a diameter is used. In the example of FIG. 21A, the minimum value of the length q2 of the minor axis of the inscribed ellipse is equal to w, that is, the boundary width. Further, the maximum value of the length q1 of the major axis of the inscribed ellipse can be considered to be 10w. Note that, when the probability that the same blocks are arranged consecutively is 1/2, the same blocks may be consecutively arranged endlessly. For example, the probability that "n" protruded parts 11 are arranged consecutively is represented by $(1/2)^n$. The probability that ten protruded parts 11 are arranged consecutively is $(1/2)^{10}=1/1028=0.00097$. The probability of presence of the arrangement in which ten protruded parts 11 are arranged consecutively is equal to or less than 0.1%. This probability is extremely low and can be ignored. Therefore, as with the above, the maximum value of the length q1 of the major axis of the inscribed ellipse Q may be considered to 10w. Based on structural calculation, the average of the lengths of the axes of the inscribed ellipse is determined to 2w. This 2w means the average boundary width. Therefore the average pitch is 4w.

Figure 22:
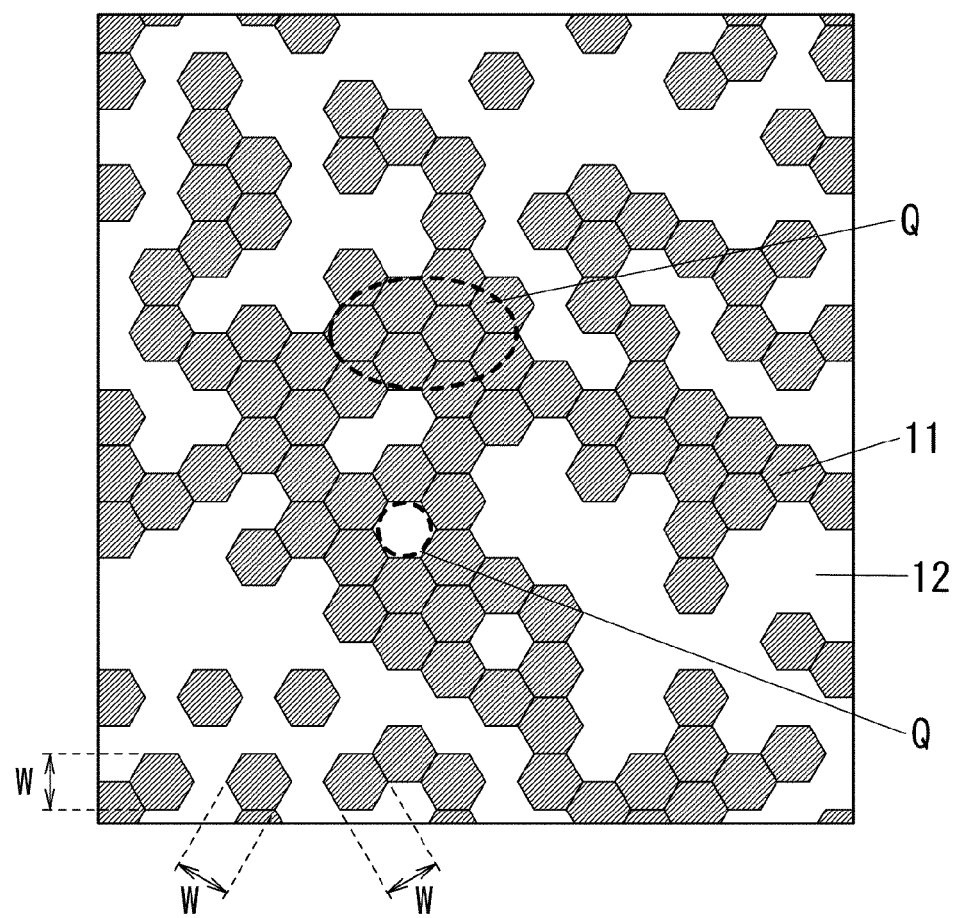
FIG. 22 is a plan illustrating another example of the uneven structure.

FIG. 22 shows an example of the uneven structure 20 with a complete random structure (boundary diffraction structure) of a hexagonal grid. The width of the grid is denoted by "w". The average interval can be calculated based on lengths of axes of an inscribed ellipse Q as with the quadrangular grid. Thus, the minimum value of the length q2 of the minor axis of the inscribed ellipse is w, and is equal to the boundary width. Further, the maximum value of the length q1 of the major axis of the inscribed ellipse may be considered to 10w. The average of the lengths of the axes of the inscribed ellipse Q is determined to 2w. This 2w means the average boundary width. Therefore the average pitch is 4w.

Figure 23A:
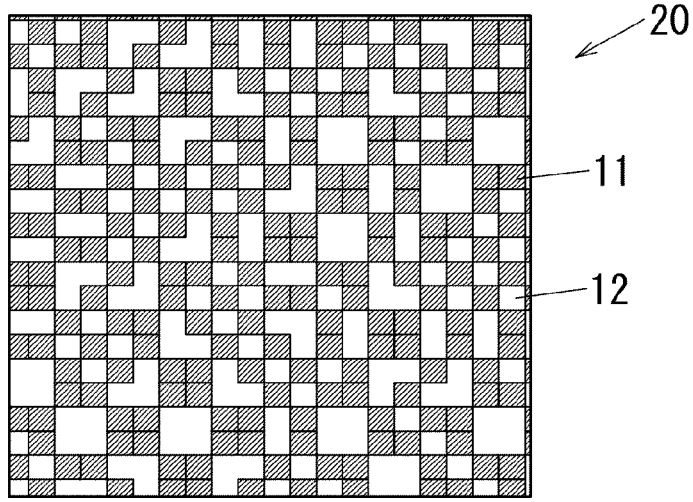
FIG. 23A is a plan illustrating another example of the uneven structure.
Figure 23B:
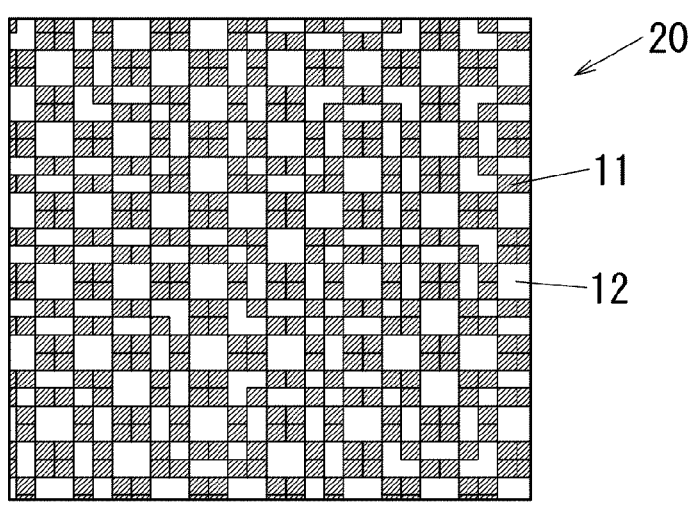
FIG. 23B is a plan illustrating another example of the uneven structure.
Figure 23C:
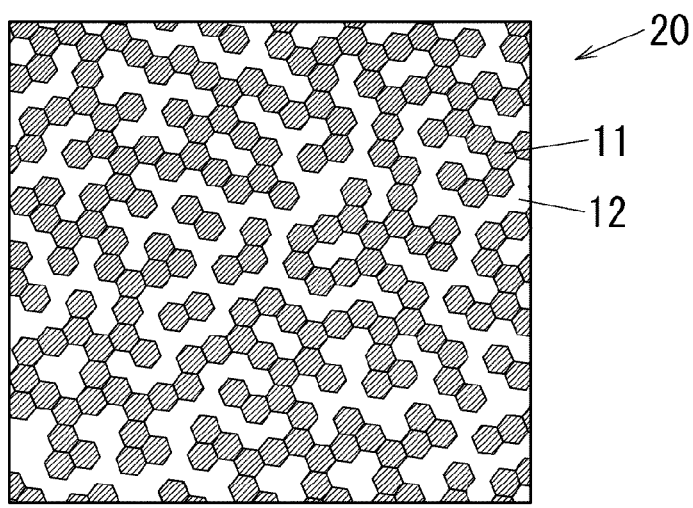
FIG. 23C is a plan illustrating another example of the uneven structure.

FIG. 23A, FIG. 23B and FIG. 23C show examples of the uneven structure 20 with the controlled random structure. FIG. 23A shows the quadrangular grid structure with the average pitch of 3w. FIG. 23B shows the quadrangular grid structure with the average pitch of 3.3w. FIG. 23C shows the hexagonal grid structure with the average pitch of 3.4w.

Figure 24A:
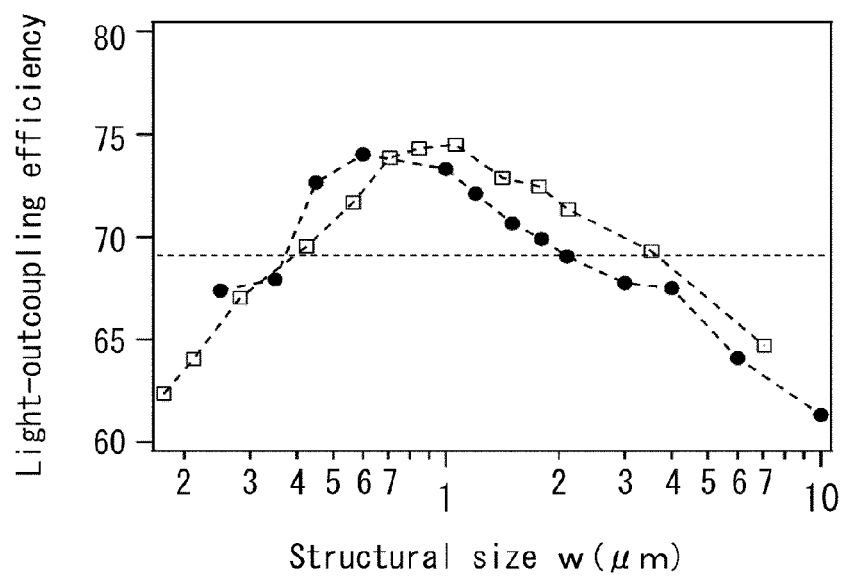
FIG. 24A is a graph illustrating a relation between the structural size and the light-outcoupling efficiency of the uneven structure.
Figure 24B:
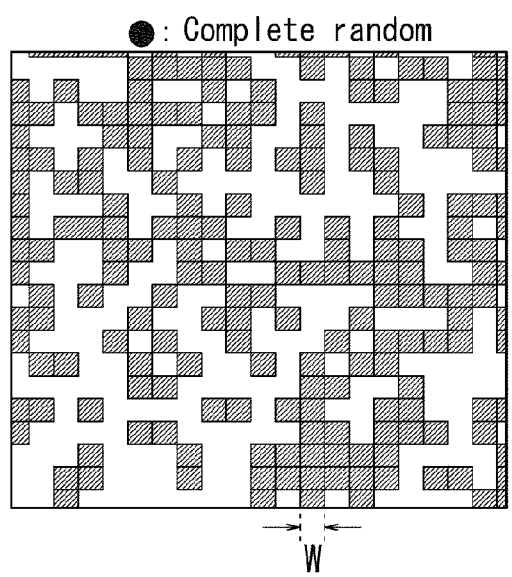
FIG. 24B is a plan illustrating another example of the uneven structure.
Figure 24C:
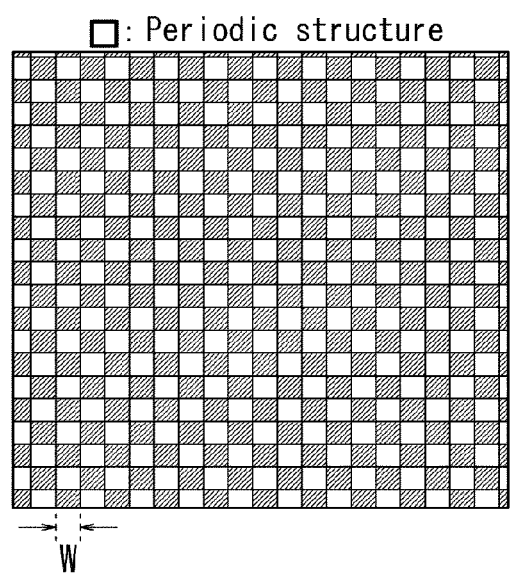
FIG. 24C is a plan illustrating another example of the uneven structure.

FIG. 24A is a graph illustrating a variation of the light-outcoupling efficiency with change in the structural size w (the length of one section) of the uneven structure 20. This graph shows that the light-outcoupling efficiency depends on the structural size w of the uneven structure 20. In this example, level differences between protrusions and recesses are 1.0 μm. The refractive index of the substrate 1 is 1.5. The refractive index of the first transparent material layer 21 is 1.35. The refractive index of the second transparent material layer 22 is 2.0. The wavelength (the weighted average emission wavelength λ) of light is 550 nm. The graph shows the result (●) of the uneven shape of the complete random structure in FIG. 24B. and the result (□) of the uneven shape of the periodic structure shown in FIG. 24C. It is understood from this graph that the structural size w is preferably in a range of 0.4 μm to 2 μm in the case of the complete random structure. Further, it is understood that the structural size w is preferably in a range of 0.4 μm to 4 μm in the case of the periodic structure.

Light is not diffracted by a structure with a size sufficiently smaller than the wavelength of the light. Hence, in each of the random structure and the periodic structure, it is difficult to obtain the desired effect when the structural units of sizes of not more than 400 nm (not more than 0.4 μm) are arranged. In view of this, when the weighted average wavelength of the light emitting layer E is represented by λ, it is understood that the size w of the block is preferably equal to or more than 0.73 (=400/550) λ.

With regard to a region in which the structural unit is sufficiently greater than the wavelength, favorable results are obtained when "w" is equal to or less than 2 μm in the case of the random structure, or when "w" is equal to or less than 4 μm in the case of the periodic structure. Based on this fact and that the average interval of the complete random structure is 4w and the average interval of the periodic structure is 2w, it is preferable that the average pitch P be equal to or less than 8 μm. Further, based on the principle of diffraction of light, the diffraction pattern of light is determined by the ratio of the structural size (interval) to the wavelength, which means P/λ. Therefore, it is understood that the average pitch P is preferably equal to or less than 14.5 (=8/0.55) λ. Note that, this result shows that the approximate light-outcoupling efficiency is mainly determined by the average pitch irrespective of the structural pattern.

From the above fact, it is understood that, with regard to any part of the aggregate of protruded parts 11 or recessed parts 12, an axial length of an inscribed ellipse Q or a diameter of an inscribed circle when viewed in a direction perpendicular to a surface of the substrate 1 be preferably in a range of 0.4 μm to 4 μm. Note that, part of the aggregate of protruded parts 11 or recessed parts 12 corresponding to the upper limit of the range may be constituted by protruded parts or the recessed parts provided to consecutive multiple sections. As described above, the ellipse Q is drawn imaginarily. When in drawing the ellipse Q, the major axis is equal to the minor axis, the ellipse Q is a circle, that is, a true circle. Hence, in the above range, the ellipse Q is used when the ellipse Q can be drawn, and a circle is used when a circle is obtained as a result of drawing the ellipse Q. The upper limit of the axial length means an upper limit of the major axis, and the lower limit of the axial length means a lower limit of the minor axis.

The difference in the light-outcoupling efficiency between the case where the protruded parts or the recessed parts are arranged randomly and the case where the protruded parts or the recessed parts are arranged periodically is not so great. However, the periodic structure has a diffraction grating property, and therefore may cause an increase in the wavelength dependency and an increase in the color unevenness in view angles. Hence, the uneven shape is preferably a shape in which structures are arranged randomly. Further, it is understood that a length of one section of the array of sections 10 is preferably in a range of 0.4 μm to 4 μm.

Figure 25A:
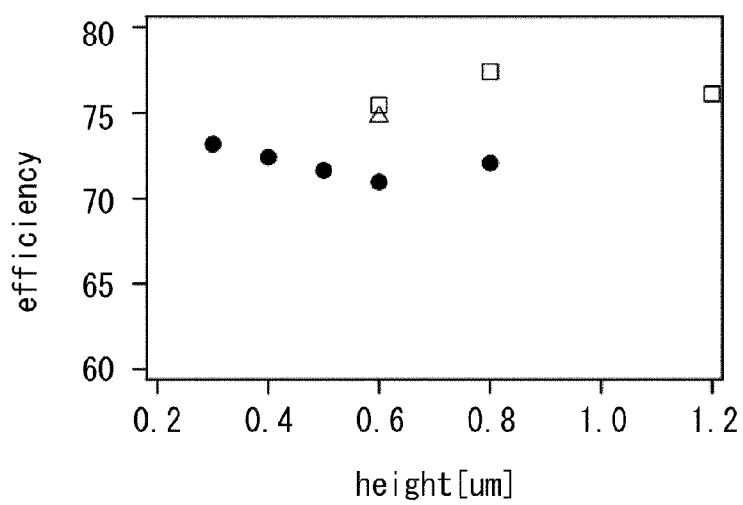
FIG. 25A is a graph illustrating a relation between the level difference between protrusions and recesses and the light-outcoupling efficiency of the uneven structure.
Figure 25B:
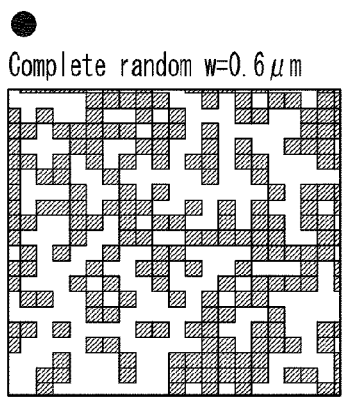
FIG. 25B is a plan illustrating another example of the uneven structure.
Figure 25C:
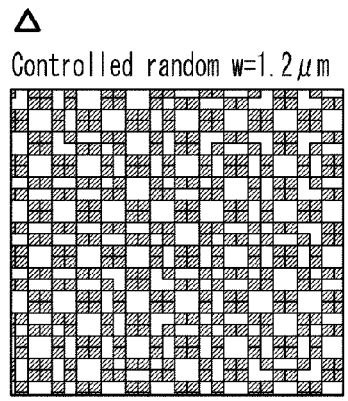
FIG. 25C is a plan illustrating another example of the uneven structure.

FIG. 25A shows a graph illustrating change in the light-outcoupling efficiency versus change in the level difference between protrusions and recesses of the uneven structure 20. This graph shows a dependency of the light-outcoupling efficiency on the level difference between protrusions and recesses of the uneven structure 20. In this example, the substrate 1 has the refractive index of 1.51. The first transparent material layer 21 has the refractive index of 1.45. The second transparent material layer 22 has the refractive index of 1.76. The wavelength (the weighted average emission wavelength λ) of light is 550 nm. The evaluation were made based on the uneven structures 20 shown in FIG. 25B, FIG. 25C and FIG. 25D. The structural size w of FIG. 25B is 0.6 μm. The structural size w of FIG. 25C is 1.2 μm. The structural size w of FIG. 25D is 1.2 μm.

Figure 25D:
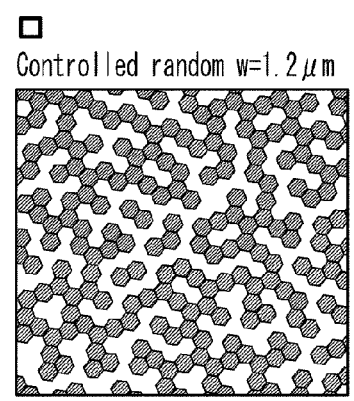
FIG. 25D is a plan illustrating another example of the uneven structure.

The graph of FIG. 25A shows the result (●) of the complete random structure shown in FIG. 25B, the result (Δ) of the controlled random structure shown in FIG. 25C, and the result (□) of the controlled random structure shown in FIG. 25D. In the controlled random structure of FIG. 25C, three or more same blocks are not arranged in the same direction. In FIG. 25C, the average pitch is 3w. In the controlled random structure of FIG. 25D, four or more same blocks are not arranged in the same direction. In FIG. 25D, the average pitch is 3.4w. It is understood from this graph that the light-outcoupling efficiency is hardly affected by the level difference between protrusions and recesses in any of the structures. Consequently, it is considered that the dependency on the level difference between protrusions and recesses is weak.

In contrast, the graph shows that, in consideration of randomness of protrusions and recesses, the light-outcoupling efficiency tends to improve in the ascending order of (●), (Δ), and (□). With regard to this result, as understood from comparison of (●) and (Δ), it is preferable the randomness is controlled and blocks are not arranged consecutively. It is considered that this is because when blocks are arranged consecutively, regions with large structural sizes are substantially present, and the light-outcoupling efficiency is decreased in such regions. Actually, the complete random structure of FIG. 25B shows a region in which six or more blocks are arranged in the same direction. For example, when the structural size is 0.6 μm, a structure with a size of 3.6 μm (=0.6 μm×6) may be present locally. In FIG. 24A, the result of the periodic structure shows that the light-outcoupling efficiency is not so high when the size of the uneven section is 3.6 μm. Therefore, it is considered that local presence of regions with large sizes may lead to a decrease in the light-outcoupling efficiency. Consequently, it is preferable that the protruded parts 11 be arranged so that the number of protruded parts arranged by being individually allocated to consecutive sections of the array in a same direction is not greater than a predetermined number. Similarly, it is preferable that the recessed parts 12 be arranged so that the number of recessed parts arranged by being individually allocated to consecutive sections of the array in a same direction is not greater than a predetermined number.

Further, it is preferable that the blocks (the array of sections 10) have hexagonal shapes rather than quadrangular shapes. It is considered that this is because the regular hexagonal shape is smaller in dependency on orientation directions than the square shape. This is because, in the quadrangular shape, the length of the diagonal is equal to the length of the side multiplied by √2 (square root of 2=about 1.414), and, in the hexagonal shape, the length of the diagonal is equal to the length of the side multiplied by √3/2 (half of the square root of 3=about 0.8660). This means that, when the squares are arranged, the light-outcoupling efficiency may be decreased in either the direction of sides or the direction of diagonals, and, in contrast, when the regular hexagons are arranged, the higher light-outcoupling efficiency can be obtained irrespective of orientations. It is considered that this may be because the honeycomb structure is a close-packed structure.

Figure 26:
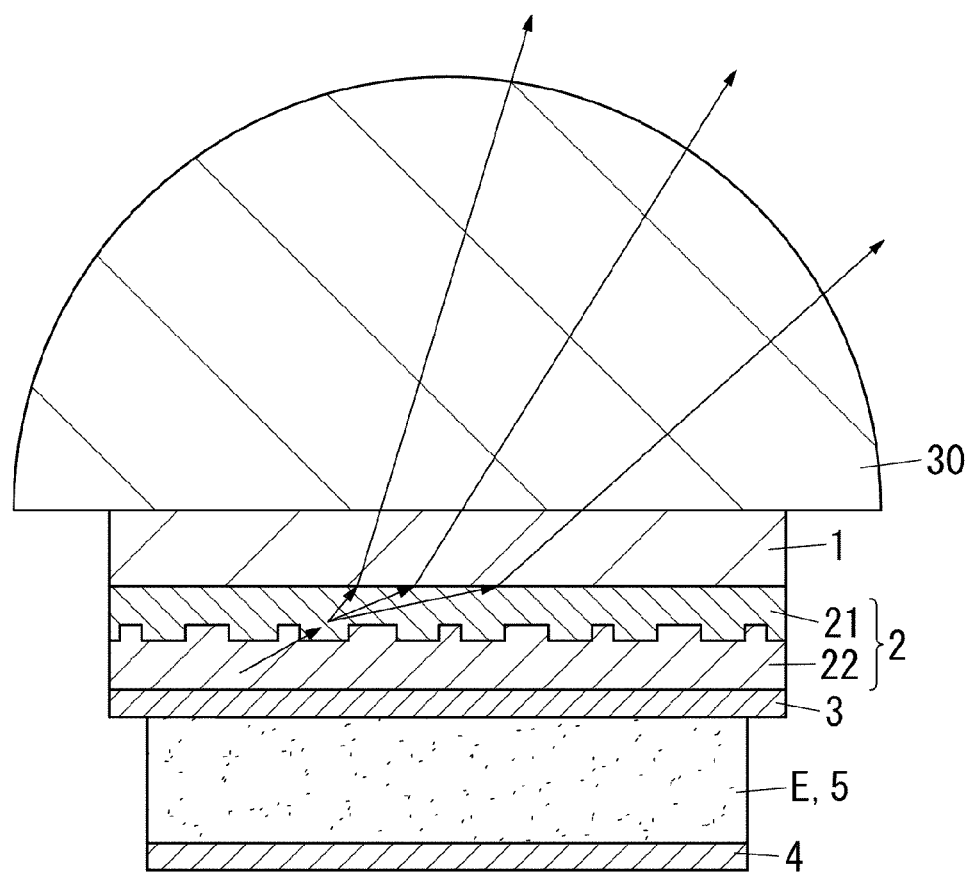
FIG. 26 is a section illustrating an example of a method of measuring light intensity of the organic EL element.

To examine in detail the effects of pattern in which the randomness is controlled, the distribution of intensity of light inside the substrate 1 was measured with regard to each of the complete random structure and the controlled random structure (the level difference between protrusions and recesses is 0.6 μm) described in FIG. 25B and FIG. 25C. FIG. 26 shows a measuring device. This measuring device has a hemispherical lens 30 to measure the intensity of light. The components same as those of the aforementioned structure are designated by the same reference signs, in order to omit the redundant explanations.

Figure 27A:
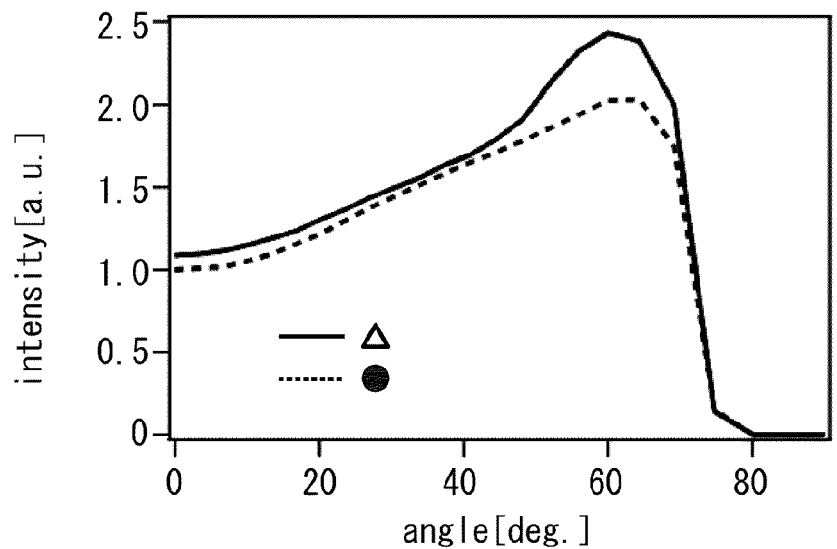
FIG. 27A is a graph illustrating change in the light intensity versus change in the uneven structure.
Figure 27B:
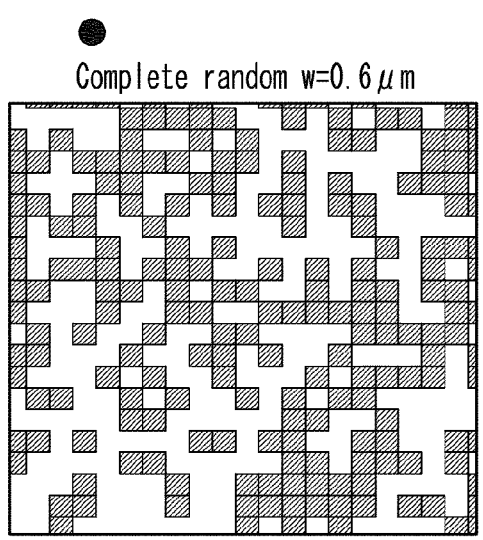
FIG. 27B is a plan illustrating another example of the uneven structure.
Figure 27C:
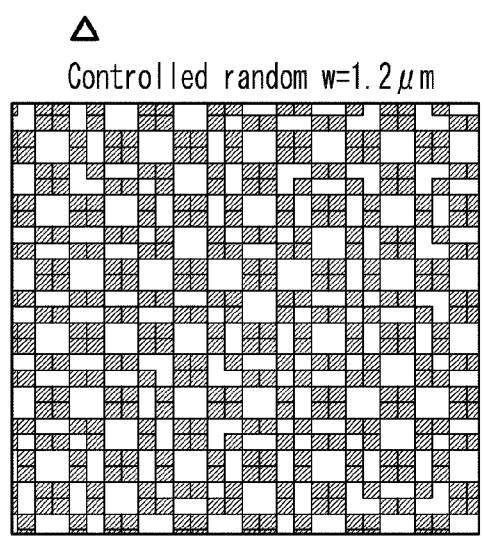
FIG. 27C is a plan illustrating another example of the uneven structure.

FIG. 27A is a graph illustrating relations between the angle and the light intensity with regard to different randomness. This graph shows a result (indicated by a broken line) of the complete random structure shown in FIG. 27B and a result (indicated by a solid line) of the controlled random structure shown in FIG. 27C. This graph shows that intensity of light at a high angle region (angles from about 50 degrees to 70 degrees) is increased in the structure in which randomness is controlled (i.e., the controlled random structure) than in the complete random case.

The method of controlling randomness by suppressing occurrence of the large region constituted by consecutive arranged blocks and the effect thereof are described as above. The effects by suppressing occurrence of such a large region can also be confirmed by use of Fourier transform of random pattern.

Figure 28A:
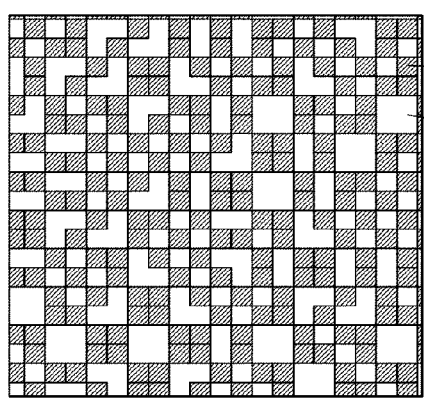
FIG. 28A is a plan illustrating another example of the uneven structure.
Figure 28B:
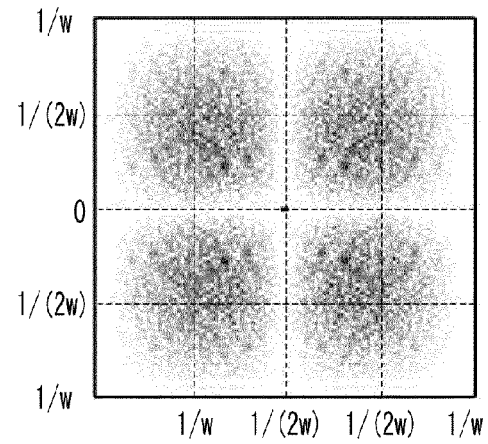
FIG. 28B is a result of Fourier transform based on the uneven structure.
Figure 28C:
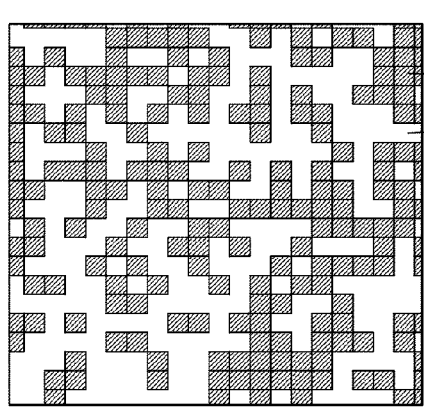
FIG. 28C is a plan illustrating another example of the uneven structure.
Figure 28D:
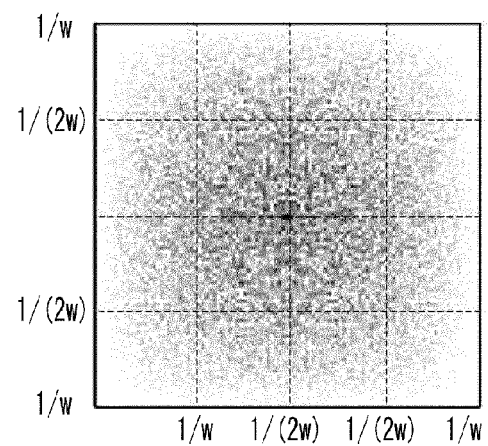
FIG. 28D is a result of Fourier transform based on the uneven structure.

FIG. 28A to FIG. 28D includes views illustrating amplitudes of spatial frequency components obtained by Fourier transform of random pattern. FIG. 28A shows the random pattern of the controlled random structure, and FIG. 28B shows the result of the Fourier transform of the random pattern shown in FIG. 28A. FIG. 28C shows the random pattern of the complete random structure, and FIG. 28D shows the result of the Fourier transform of the random pattern shown in FIG. 28C.

In each of FIG. 28B and FIG. 28D, the center of the view indicates a component (DC component) corresponding to the spatial frequency of 0, and the spatial frequency becomes greater towards the periphery of the view than at the center of the view. As understood from the views, it is confirmed that the low frequency components are suppressed in the spatial frequency of the controlled random pattern. Especially, it is understood that components, which are lower than 1/(2w), of the spatial frequency components are suppressed. When the randomness is controlled as described above, the low frequency components are removed. In view of this, the controlled random structure may be referred to as low frequency removing structure.

Even when the randomness is controlled, the average pitch can be calculated. Note that, the boundary width (structural size) w is preferably equal to or more than 0.73λ. The value of 0.73 is obtained by dividing 400 by 550. The upper limit of the average pitch is preferably 8 μm.

Further, it is preferable that the structural size w (a length of each section of the array) be in a range of 0.4 μm to 4 μm. Moreover, the structural size w is preferably in a range of 0.4 μm to 2 μm.

Note that, in the aforementioned uneven structure 20, the level differences between protrusions and recesses are same. However, the level differences between protrusions and recesses may be random. The uneven structure 20 is constituted by stacked layers of two transparent materials, and therefore phase differences may occur when light propagates these parts. Even when the level differences are random, the average phase differences of rays of transmitted light may be determined by average level differences. Hence, also in this case, sufficient average phase differences are given to rays of transmitted light, and the rays are made to emerge, and therefore the level differences may be random.

Further, in the uneven structure 20, each corner of each section may be rounded. For example, in processing micro-order structures by cutting and stacking, corners may be processed to be rounded, or stepped parts may be processed to have inclined surfaces. When the light diffusion layer 2 is provided by use of optical sheets or the like, these structures may be formed in processing. Even when corners of protrusions and recessed are rounded or have inclined surfaces, the light-outcoupling efficiency and the view angle dependence property can be improved, provided that the property of the random pattern is not lost.

Figure 29A:
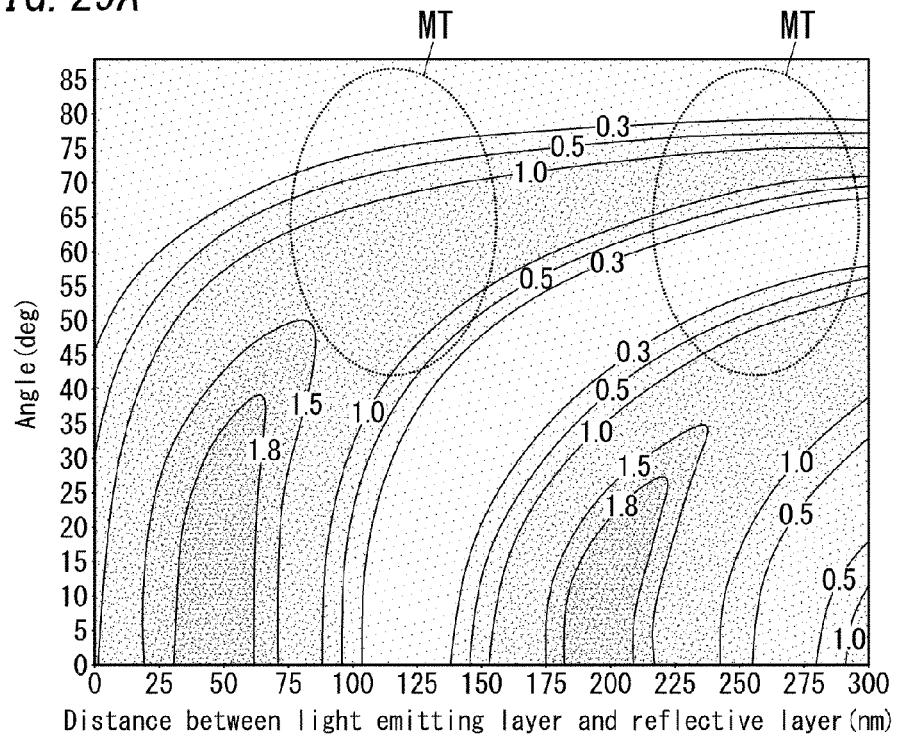
FIG. 29A is a graph illustrating a relation between the distance between the light emitting layer and the reflective layer and the intensity of light at the emerging angle.
Figure 29B:
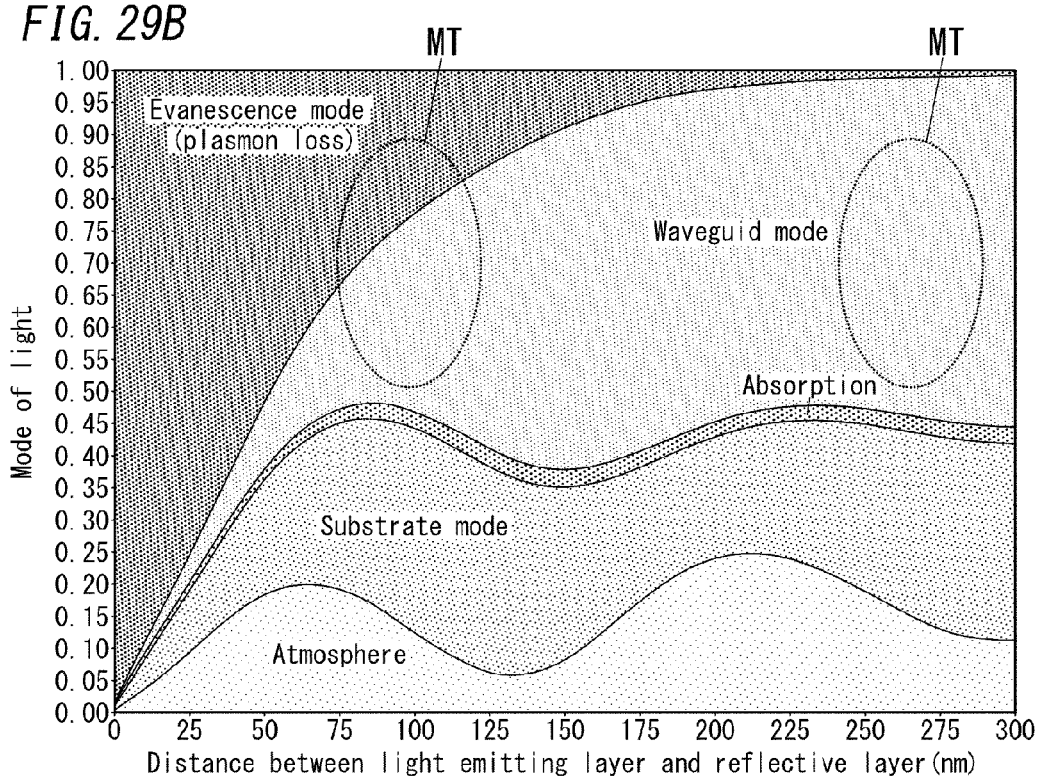
FIG. 29B is a graph illustrating a relation between the distance between the light emitting layer and the reflective layer and the mode of light propagation.

FIG. 29A and FIG. 29B each are a graph illustrating distribution of light in the organic EL element. FIG. 29A shows a relation between the distance between the light emitting layer and the reflective layer (horizontal axis) and the intensity of light at the emerging angle (vertical axis). In FIG. 29A, the intensities of light are represented by contour lines. FIG. 29B shows a relation between the distance between the light emitting layer and the reflective layer (horizontal axis) and the mode of light propagation (vertical axis). In FIG. 29B, the mode of light is classified into an evanescent mode (plasmon loss), a waveguide mode, absorption, a substrate mode, and atmosphere.

It is more advantageous that the organic EL element has a structure for extracting a high angle component of light emitted from the light emitting layer. Extracting a larger amount of the high angle component may cause improvement of the light emitting efficiency. Further, extracting a larger amount of the high angle component may cause decrease in the view angle dependence. The high angle is defined as a large angle relative to a direction normal to the surface of the substrate. The high angle may be an angle equal to or more than a total reflection angle. The high angle may be considered as a wide angle.

When the organic EL element is designed in the above manner, as shown in FIG. 29A and FIG. 29B, one light emitting layer may be spaced from the reflective layer by a distance in a range of about 75 nm to 150 nm and another light emitting layer may be spaced from the reflective layer a distance in a range of about 225 nm to 300 nm (see regions MT in FIG. 29A and FIG. 29B). Especially, in the multi-unit structure for white emission, the above distances may be set. This is because of suppressing plasmon loss and using the cavity for the second or subsequent order interference. In this case, light emitted from the light emitting layer includes a large amount of a relatively high angle component. Therefore, it is advantageous in extracting the high angle component efficiently. Hereinafter, more preferable embodiments of the uneven structure included in the light diffusion layer are described.

Figure 30:
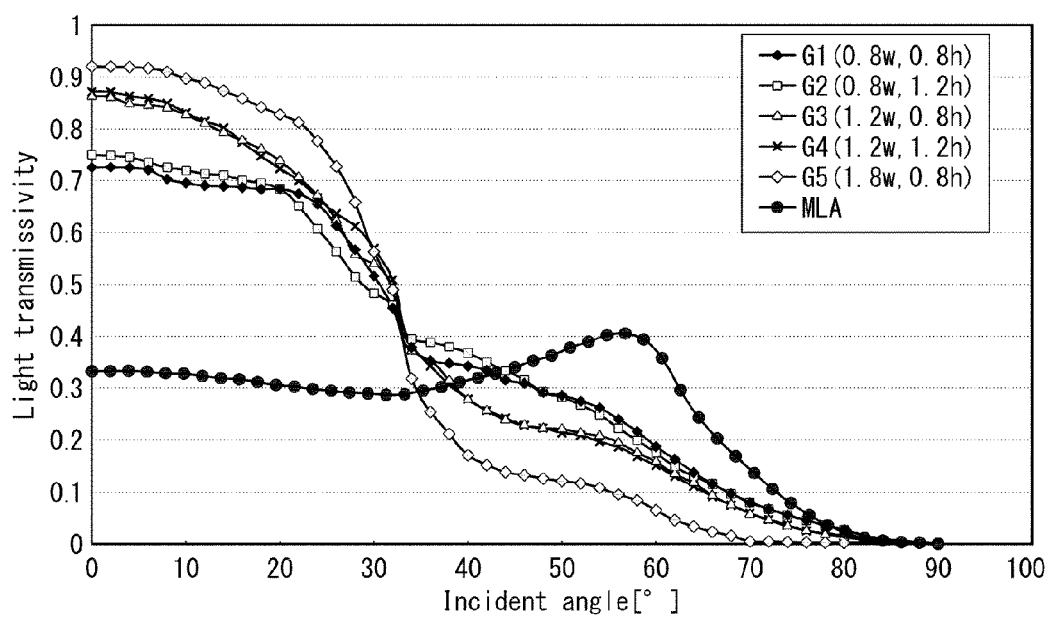
FIG. 30 is a graph illustrating relations between the incident angle and the light transmissivity of different uneven structures.

FIG. 30 is a graph illustrating a relation between the incident angle (horizontal axis) and the light transmissivity (vertical axis) with regard to various types of the uneven structures. In this graph, a higher angle component is shown in more right side. The weighted average emission wavelength $\lambda_{all}$ of the entire light from the light emitting layer is 550 nm. FIG. 30 relates to a case where light is emitted from the organic layer with the refractive index of 1.8 to the atmosphere with the refractive index of 1.0.

In FIG. 30, G1 to G5 each relate to a controlled random structure (low frequency removing structure). The controlled random structure has a hexagonal grid. The width w of bars of the hexagonal grid is selected from 0.8 μm, 1.2 μm and 1.8 μm. The width w of bars is the same as the width w shown in FIG. 22. In the graph of FIG. 30, 0.8w means that the width w of bars is 0.8 μm, and 1.2w means that the width w of bars is 1.2 μm, and 1.8w means that the width w of bars is 1.8 μm.

Further, the height h of the uneven structure is selected from 0.8 μm and 1.2 μm. In the graph of FIG. 30, 0.8 h means that the height h is 0.8 μm, and 1.2 h means that the height h is 1.2 μm. Accordingly, G1 relates to a case where the grid width w is 800 nm and the height h is 800 nm. G2 relates to a case where the grid width w is 800 nm and the height h is 1200 nm. G3 relates to a case where the grid width w is 1200 nm and the height h is 800 nm. G4 relates to a case where the grid width w is 1200 nm and the height h is 1200 nm. G5 relates to a case where the grid width w is 1800 nm and the height h is 800 nm. As shown in G1 to G5 of the graph of FIG. 30, the high angle component of light increases with decrease in the grid width w of the uneven structure. Note that, the MLA (which is the abbreviation of the micro lens array) in FIG. 30 is described later.

It is understood from the graph of FIG. 30 that when a weighted average emission wavelength of entire light from the one or multiple light emitting layers is represented by λan, a minimum value of the axial length of the inscribed ellipse or the diameter of the inscribed circle which is inscribed in the aggregate of protruded or recessed parts constituting the uneven structure is preferably equal to or less than twice as large as $\lambda_{all}$. "The minimum values of the axial length of the ellipse and the diameter of the circle which are inscribed in the aggregate of protruded or recessed parts constituting the uneven structure" correspond to the grid width w of the uneven structure (see FIG. 22). In G5 in which the grid width w is 1800 nm, the light-outcoupling efficiency for the high angle component is low. Further, although G3 and G4 in which the grid width w is 1200 nm are larger in an amount of the high angle component of light than G5, the light-outcoupling efficiency for the high angle component is not so high. In contrast, G1 and G2 in which the grid width w is 800 nm show a large amount of the high angle component of light. As apparent from the graph of FIGS. 30, G1 and G2 are advantageous for extracting the high angle component of light when light has the weighted average emission wavelength $\lambda_{all}$ of 550 nm and the grid width w is equal to or less than twice (1100 nm) as large as this wavelength $\lambda_{all}$. Although FIG. 30 shows the case of the wavelength of 550 nm, it is expected that the similar or same results may be obtained for other wavelengths. Hence, it is preferable that the minimum value of the axial length of the inscribed ellipse or the diameter of the inscribed circle be equal to or less than twice as large as the wavelength $\lambda_{all}$. FIG. 30 shows that, to extract a larger amount of the high angle component of light, the minimum value of the axial length of the inscribed ellipse or the diameter of the inscribed circle is preferably equal to or less than 1.8 times as large as the wavelength $\lambda_{all}$.

Figure 31:
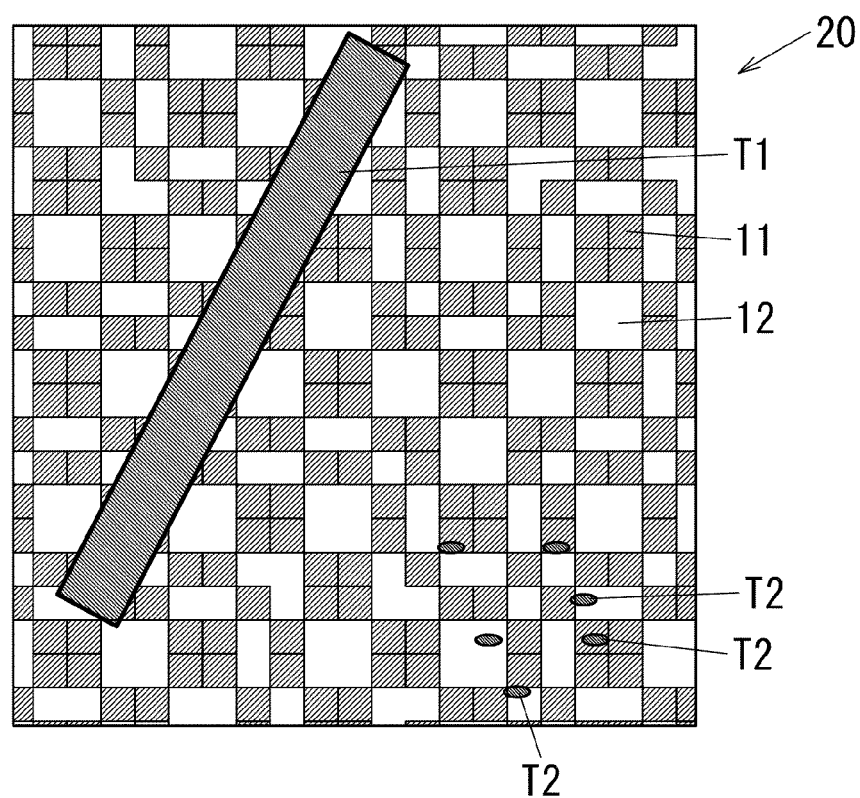
FIG. 31 is a plan illustrating an example of the uneven structure.

In some cases, the uneven structure unfortunately contains noises occurring unexpectedly in producing the organic EL element, such as small structures (e.g., structures caused by dusts or the like) with sizes of equal to or less than 0.73λ and large structures (e.g., scratches) with sizes of equal to or more than 4 μm. Also in these cases, the desired effects can be obtained sufficiently provided that the total areas of such noises are equal to or less than 10% of the whole area. FIG. 31 shows a large noise structure T1 and small noise structures T2. Even when these noises are intentionally formed to occupy 10% of the whole area, the desired organic EL element can be formed provided that the desired effects are obtained. In view of this, even when the aforementioned uneven structure 20 may be partially broken at the percentage equal to or less than 10%, this uneven structure 20 is available.

[Light Diffusion Layer with Lens Array Structure]

Figure 32:
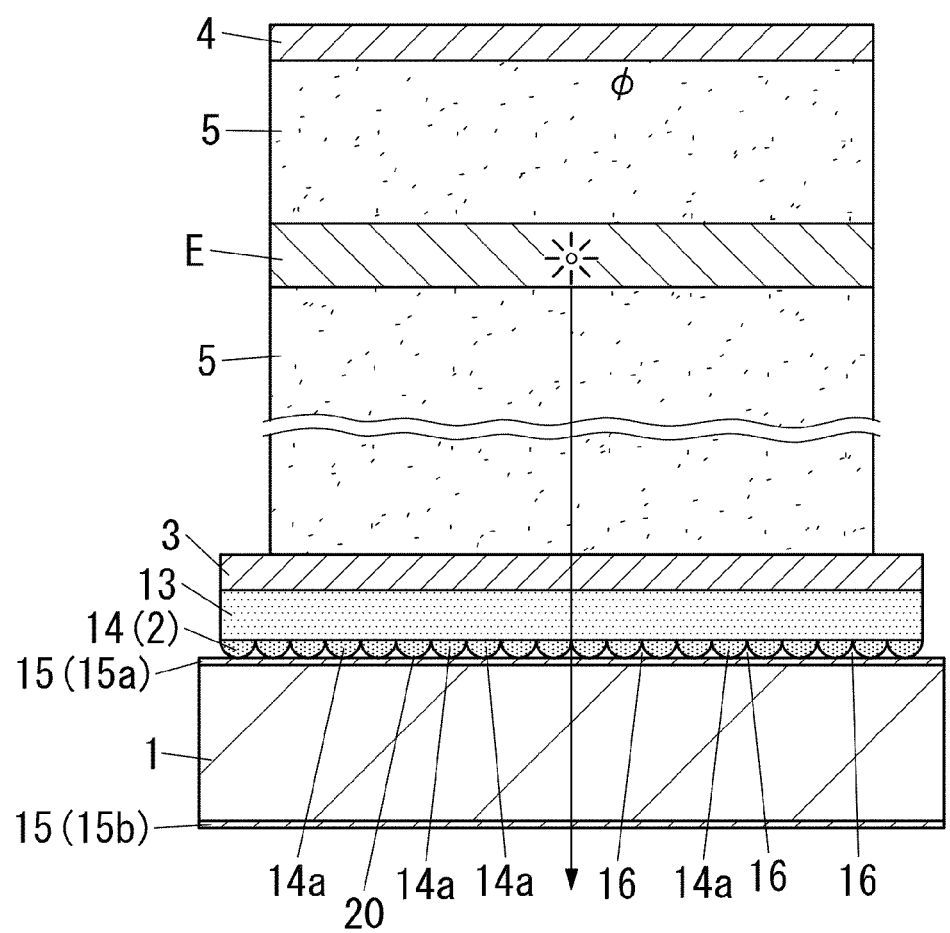
FIG. 32 is a schematic section illustrating another example of the embodiment of the organic electroluminescence element.

FIG. 32 shows an example of another light diffusion layer 2, and illustrates the organic EL element of the sixth embodiment. A middle part of a layer configuration is omitted, and the sixth embodiment may have the multi-unit structure or the single-unit structure. One or multiple light emitting layers E are arranged in the same manner as any one of the aforementioned embodiments.

In the sixth embodiment, the light diffusion layer 2 has a lens array structure 14. The lens array structure 14 is a structure in which multiple fine lenses 14a are arranged in plane. The fine lens 14a may have an almost hemispherical shape, a semi-ellipsoidal shape, a protruded shape with a sinusoidal section, a tapered cylindrical shape, a tapered prismatic shape (e.g., a triangle-based prism and a quadrangle-based prism), and a pyramid shape (e.g., a triangle-based pyramid and a quadrangle-based pyramid). FIG. 32 shows almost hemispherical lenses. A section of the fine lens 14a may be semicircular, semi-ellipsoid, sinusoidal, corrugated, inverted-triangle, or trapezoidal. The lens array structure 14 may be a so-called micro lens array.

In FIG. 32, the multiple fine lenses 14a are provided to a surface of the resin layer 13. The fine lenses 14a protrude toward the substrate 1. There are spaces 16 between adjacent fine lenses 14a. The surface of the lens array structure 14 defines the uneven structure 20. There are antireflection layers 15 provided to opposite surfaces of the substrate 1. The antireflection layers 15 are an inside antireflection layer 15a and an outside antireflection layer 15b. The light transmissive electrode 3 is formed on the surface of the light diffusion layer 2. In a strict sense, the light transmissive electrode 3 is formed on the surface of the resin layer 13.

The diameter of the fine lens 14a may be in a range of 1 μm to 500 μm. The lens array structure 14 on a micro-scale can cause improvement of the light-outcoupling efficiency.

The resin layer 13 may be of a resin film. It is preferable that the resin layer 13 be a layer with a high refractive index. For example, the resin layer 13 may have a refractive index same as or similar to the refractive index of the second transparent material layer 22 described above. For example, the resin film may be resin films of polyethylene naphthalate (PEN, the refractive index of 1.77), polyethylene terephthalate (PET, the refractive index of 1.65), polyether sulfone (PES, the refractive index of 1.65), or the like. These resin films have refractive indices higher than a refractive index of glass.

The light diffusion layer 2 constituted by the lens array structure 14 may be formed on an opposite surface of the resin film (the resin layer 13) from the light transmissive electrode 3. For example, the lens array structure 14 can be formed by processing the surface of the resin layer 13 or applying diffusive resin.

In the lens array structure 14, spaces 16 are present between the substrate 1 having the light transmissive property and the uneven structure 20. Therefore. when light passes through the light diffusion layer 2, such light emerges into a gas space once. It is possible to suppress occurrence of total reflection at the opposite ends of the substrate 1. In this example, the total reflection is suppressed, the light-outcoupling layer 7 may not be provided on the external side of the substrate 1. However, to suppress Fresnel loss, providing one or more antireflection layers 15 is preferable. Or, to improve the view angle dependence, a light scattering structure may be formed on the external surface of the substrate 1. Note that, the spaces 16 may be filled with resin.

When the resin layer 13 is exposed outside, moisture is likely to intrude into the inside by way of the resin layer 13. In view of this, it is preferable to enclose the resin layer 13 so as to be kept inside the enclosure. By doing so, it is possible to suppress potential deterioration of the element caused by moisture. Further, multiple resin layers 13 and multiple organic EL layers may be arranged in plane or line on the surface of the substrate 1. In this case, it is preferable that the multiple resin layers 13 arranged in plane or line be enclosed collectively. Note that, to realize external electrodes, electrodes (the light transmissive electrode 3 and the light reflective electrode 4) formed above the resin layer 13 are connected to electrodes formed on the substrate 1. Such connection may be done by use of electric conductive paste, for example.

Also in the organic EL element in which the light diffusion layer 2 has the lens array structure 14, it is more advantageous to provide a structure for extracting a high angle component of light emitted from the light emitting layer. As described in FIG. 29A and FIG. 29B, this is because the light emitting layer may be provided on the region MT shown in FIG. 29A and FIG. 29B. Extracting a larger amount of the high angle component may cause improvement of the light emitting efficiency. Further, extracting a larger amount of the high angle component may cause decrease in the view angle dependence. Hereinafter, a more preferable embodiment of the uneven structure having the lens array structure is described.

In the graph of FIG. 30, MLA relates to the lens array structure. In the lens array structure, the uneven structure is constituted by multiple lenses having almost hemispherical shapes. As apparent from FIG. 30, the lens array structure allows extraction of a larger amount of the high angle component of light. Therefore, the light-outcoupling efficiency can be improved. MLA in the graph of FIG. 30 relates the case of an aspect ratio of 1. Optimization of the lens array structure can be conducted by determining the aspect ratio.

Figure 33:
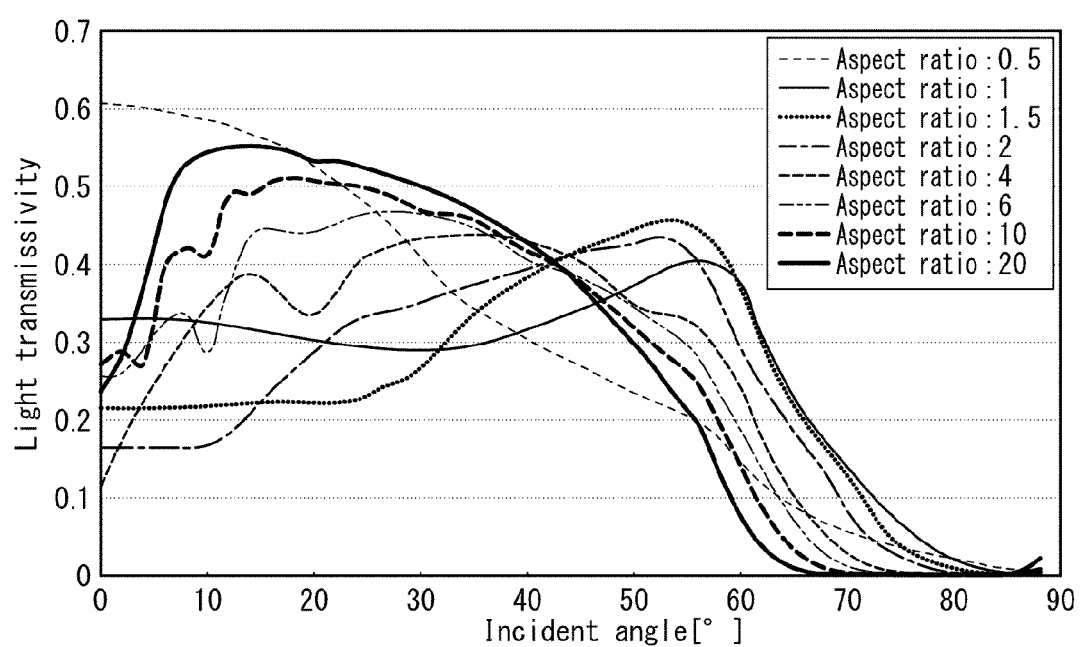
FIG. 33 is a graph illustrating relations between the incident angle and the light transmissivity of different lens array structures.

FIG. 33 shows a graph illustrating relations between the incident angle (horizontal axis) and the light transmissivity (vertical axis) of different lens array structures. The different lens array structures have different lens shapes. In this graph, a higher angle component is shown in a more right side. The weighted average emission wavelength of entire light from the light emitting layer is 550 nm. FIG. 33 relates to a case where light is emitted from the organic layer with the refractive index of 1.8 to the atmosphere of the refractive index of 1.0.

Figure 34A:
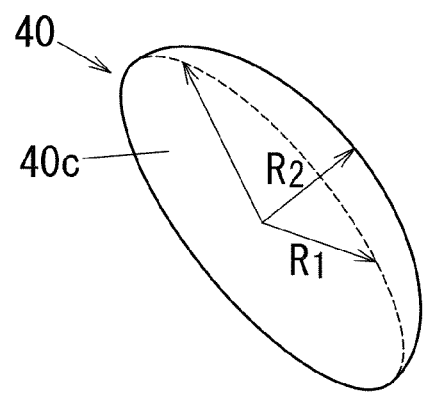
FIG. 34A and FIG. 34B each are a schematic view illustrating one of the lenses constituting the lens array structure.
Figure 34B:
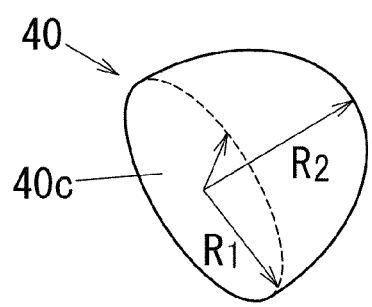

FIG. 34A and FIG. 34B each show a schematic view of a lens 40 constituting the lens array structure. When the aspect ratio is changed, the shape of the lens constituting the lens array structure may be changed from the hemispherical shape. When the shape is changed from the hemispherical shape, the lens 40 may have a semi-ellipsoidal shape. It is said that the lens array structure includes lenses 40 each being a semi-ellipsoid which is protruded from an imaginary circle 40C which has a radius $R_1$ and is parallel to the surface of the substrate 1, in a direction perpendicular to the imaginary circle 40C, so as to have a height $R_2$. The aspect ratio of the lens 40 can be represented by a ratio of the height $R_2$ to the radius $R_1$. Thus, the aspect ratio is defined as $R_2/R_1$. FIG. 34A shows a semi-ellipsoid in which the protruding height $R_2$ is smaller than the radius $R_1$, and therefore the aspect ratio is less than 1. FIG. 34B shows a semi-ellipsoid in which the protruding height $R_2$ is larger than the radius $R_1$, and therefore the aspect ratio is more than 1.

It is understood from the graph of FIG. 33 that light-outcoupling efficiency for the high angle component is relatively low when the aspect ratio is 0.5. In contrast, when the aspect ratio is 1, it is possible to extract the high angle component of light. It is understood from this fact that the aspect ratio is preferably equal to or more than 0.8. In other words, it is preferable that the height $R_2$ be equal to or more than 0.8 times larger than the radius $R_1$.

Additionally, it is understood from the graph of FIG. 33 that light-outcoupling efficiency for the high angle component is relatively low when the aspect ratio is equal to or more than 6. Therefore, to extract the high angle component of light, it is more preferable that the aspect ratio be equal to or less than 4. In other words, it is more preferable that the height $R_2$ be equal to or less than 4 times larger than the radius $R_1$.

[Lighting Device]

Figure 35:
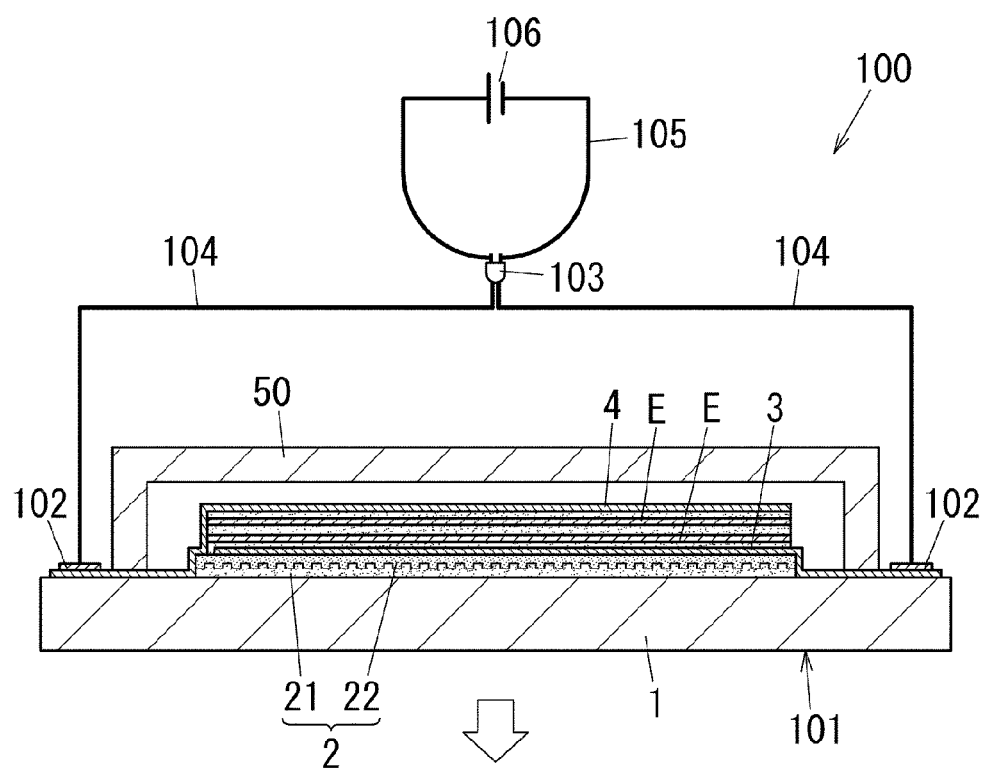
FIG. 35 is a schematic section illustrating an example of the lighting device.

FIG. 35 shows an example of a lighting device 100 including the organic electroluminescence element (the organic EL element 101). The organic EL element 101 includes the substrate 1, the light diffusion layer 2, the light transmissive electrode 3, the multiple light emitting layers E, the light reflective electrode 4, and an enclosing member 50. The light diffusion layer 2 includes the first transparent material layer 21 and the second transparent material layer 22. The organic light emitter including the light emitting layers E is enclosed by the enclosing member 50. The emitting direction of light is denoted by an outlined arrow. The lighting device 100 includes the organic EL element 101 and electrode pads 102 formed outside the enclosure of the organic EL element 101. The electrode pads 102 and the electrodes of the organic EL element 101 are electrically interconnected via appropriate wiring structures. The electrode pads 102 are connected to wires 104. The lighting device includes a plug 103 collecting the wires 104. The plug 103 is connectable to an external power source 106 via an external cable 105. When connection with the external power source 106 is made, a current flows between the electrodes, and thereby light is produced by the light emitting layers E. As a result, light can be emitted from the lighting device 100.

REFERENCE SIGNS LIST

E Light emitting layer
E1 First light emitting layer
E2 Second light emitting layer
Em m-th light emitting layer
1 Substrate
2 Light diffusion layer
3 Light transmissive electrode
4 Light reflective electrode
5 Charge transport layer
6 Interlayer
7 Light-outcoupling layer
10 Section of the array
11 Protruded part
12 Recessed part
13 Resin layer
14 Lens array structure
20 Uneven structure

The invention claimed is:

1. An organic electroluminescence element, comprising:
a substrate having a light transmissive property;
a light diffusion layer on a surface of the substrate;
a light transmissive electrode on a surface of the light diffusion layer;
a light reflective electrode paired with the light transmissive electrode; and
one or multiple light emitting layers between the light transmissive electrode and the light reflective electrode, the one or multiple light emitting layers including an m-th light emitting layer which is an m-th closest light emitting layer to the light reflective electrode, where m is an integer equal to or more than 1;

$\lambda_m$ representing a weighted average emission wavelength of the m-th light emitting layer;
$\emptyset_m$ representing a phase shift of light produced by the m-th light emitting layer caused by the light reflective electrode defined by a following expression (1):

[FORMULA 1]

$$\phi(\lambda_m) = \tan^{-1}\left\{\frac{2(n_s k_r - n_r k_s)}{n_s^2 - n_r^2 + k_s^2 - k_r^2}\right\} \quad (1)$$

wherein $n_s$ and $k_s$ represent a refractive index and an extinction coefficient of a layer in contact with the light reflective electrode, respectively, and $n_r$ and $k_r$ represent a refractive index and an extinction coefficient of the light reflective electrode, and $n_s$, $n_r$, $k_s$, and $k_r$ are functions of $\lambda_m$;
an average refractive index of a medium filling a space between the light reflective electrode and the m-th light emitting layer being represented by $n_m(\lambda_m)$;
a distance from the light reflective electrode to the m-th light emitting layer being represented by $d_m$; and
at least a first multiple light emitting layer defined as the m-th light emitting layer when m=1 satisfying relations defined by a following expression (2):

[FORMULA 2]

$$\phi(\lambda_m) \times \frac{\lambda_m}{4\pi} + \frac{l + 0.1}{2}\lambda_m \leq n_m(\lambda_m) \times d_m \leq \phi(\lambda_m) \times \frac{\lambda_m}{4\pi} + \frac{l + 0.5}{2}\lambda_m \quad (2)$$

where l is an integer equal to or more than 0, and
wherein:
$n_a$ representing an average refractive index of the one or more light emitting layers and $n_b$ representing a refractive index of the substrate satisfy a relation of $n_a > n_b$;
an incident angle of light reaching the light diffusion layer from the one or more light emitting layers relative to the light diffusion layer is represented by an angle $\theta$; and
an absolute value of a color difference $\Delta u'v'$ at the light diffusion layer which is defined as a difference between chromaticity expressed in u'v' coordinates of incident light reaching the light diffusion layer at the angle $\theta$ satisfying a condition represented by a following expression (3) and chromaticity expressed in u'v' coordinates of incident light reaching the light diffusion layer in a frontal direction is equal to or less than 0.1,

[FORMULA 3]

$$\theta = \sin^{-1}\left(\frac{n_b}{n_a}\right). \quad (3)$$

2. The organic electroluminescence element according to claim 1, wherein:
the multiple light emitting layers are spaced from each other; and
the multiple light emitting layers each satisfy the relation defined by the above expression (2).

3. The organic electroluminescence element according to claim 1, wherein:
the light diffusion layer includes a first transparent material layer and a second transparent material layer arranged in this order from the substrate;

the second transparent material layer has a refractive index higher than a refractive index of the substrate; and an uneven structure is provided to an interface between the first transparent material layer and the second transparent material layer.

4. The organic electroluminescence element according to claim 3, wherein the first transparent material layer has a refractive index in a range of 1.3 to 1.5 for a visible wavelength range.

5. The organic electroluminescence element according to claim 3, wherein the second transparent material layer has a refractive index of equal to or more than 1.75 for a visible wavelength range.

6. The organic electroluminescence element according to claim 3, wherein the uneven structure is defined by an aggregate of protruded parts or recessed parts arranged in plane.

7. The organic electroluminescence element according to claim 6, wherein with regard to any part of the aggregate of protruded parts or recessed parts, an axial length of an inscribed ellipse or a diameter of an inscribed circle when viewed in a direction perpendicular to a surface of the substrate is in a range of 0.4 µm to 4 µm.

8. The organic electroluminescence element according to claim 7, wherein when a weighted average emission wavelength of entire light from the one or multiple light emitting layers is represented by $\lambda_{all}$, a minimum value of the axial length of the inscribed ellipse or the diameter of the inscribed circle is equal to or less than twice as large as $\lambda_{all}$.

9. The organic electroluminescence element according to claim 6, wherein the aggregate of protruded parts or recessed parts has a plane divided into an array of sections, and the protruded parts or recessed parts are arranged by being individually allocated to sections randomly selected from the array.

10. The organic electroluminescence element according to claim 9, wherein:

the protruded parts are arranged so that the number of protruded parts arranged by being individually allocated to consecutive sections of the array in a same direction is not greater than a predetermined number; and the recessed parts are arranged so that the number of recessed parts arranged by being individually allocated to consecutive sections of the array in a same direction is not greater than a predetermined number.

11. The organic electroluminescence element according to claim 1, wherein:

the light diffusion layer has a lens array structure;

the lens array structure includes lenses each being a semi-ellipsoid which is protruded from an imaginary circle which has a radius $R_1$ and is parallel to a surface of the substrate, in a direction perpendicular to the imaginary circle, so as to have a height $R_2$; and the height $R_2$ is equal to or more than 0.8 times larger than the radius $R_1$ and is equal to or less than 4 times larger than the radius $R_1$.

12. The organic electroluminescence element according to claim 1, further comprising a light-outcoupling layer on an opposite surface of the substrate from the light diffusion layer.

13. A lighting device comprising the organic electroluminescence element according to claim 1.

* * * * *